United States Patent
Ihara et al.

(10) Patent No.: US 8,564,121 B2
(45) Date of Patent: Oct. 22, 2013

(54) SEMICONDUCTOR DEVICE AND MANUFACTURING METHOD OF SEMICONDUCTOR DEVICE

(75) Inventors: Takumi Ihara, Yokohama (JP); Seiji Ueno, Yokohama (JP); Joji Fujimori, Yokohama (JP); Yasunori Fujimoto, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 97 days.

(21) Appl. No.: 13/241,769

(22) Filed: Sep. 23, 2011

(65) Prior Publication Data

US 2012/0153448 A1   Jun. 21, 2012

(30) Foreign Application Priority Data

Dec. 15, 2010   (JP) .................. 2010-279284

(51) Int. Cl.
*H01L 23/34*   (2006.01)
*H01L 23/10*   (2006.01)

(52) U.S. Cl.
USPC ............... 257/707; 257/E23.101; 257/675; 257/706; 257/723; 438/122; 438/125

(58) Field of Classification Search
USPC ........ 257/E23.101, E27.018, E21.705, 675, 257/676, 666, 678, 680, 700, 704, 706, 707, 257/710, 712, 713, 723, 730, 731; 438/107, 438/109, 110, 122, 125
See application file for complete search history.

(56) References Cited

U.S. PATENT DOCUMENTS

| | | | | |
|---|---|---|---|---|
| 5,396,403 A | * | 3/1995 | Patel | 361/705 |
| 5,471,027 A | * | 11/1995 | Call et al. | 219/85.13 |
| 5,831,333 A | * | 11/1998 | Malladi et al. | 257/712 |
| 5,956,576 A | * | 9/1999 | Toy et al. | 438/125 |
| 6,239,486 B1 | * | 5/2001 | Shimizu et al. | 257/704 |
| 6,413,353 B2 | | 7/2002 | Pompeo et al. | |
| 6,437,240 B2 | | 8/2002 | Smith | |
| 6,608,380 B2 | * | 8/2003 | Ro et al. | 257/712 |
| 6,720,649 B2 | | 4/2004 | Huang | |
| 6,757,967 B2 | | 7/2004 | Jimarez et al. | |
| 6,818,974 B2 | * | 11/2004 | Yokoyama et al. | 257/676 |
| 6,849,942 B2 | * | 2/2005 | Lin et al. | 257/712 |
| 6,906,259 B2 | * | 6/2005 | Hayashi | 174/520 |
| 6,965,171 B1 | * | 11/2005 | Lee et al. | 257/783 |
| 7,050,304 B2 | * | 5/2006 | Hsu et al. | 361/719 |
| 7,166,914 B2 | | 1/2007 | DiStefano et al. | |
| 7,327,025 B2 | | 2/2008 | Shim et al. | |

(Continued)

FOREIGN PATENT DOCUMENTS

| | | |
|---|---|---|
| JP | 2000-138340 | 5/2000 |
| JP | 2001-210778 | 8/2001 |
| JP | 2007-324246 | 12/2007 |

OTHER PUBLICATIONS

USPTO, [Chu] "U.S. Appl. No. 13/862,381 (child)," Notice of Allowance and Fees Due issued on Aug 6, 2013 (allowed).

*Primary Examiner* — Chris Chu
(74) *Attorney, Agent, or Firm* — Fujitsu Patent Center

(57) ABSTRACT

A semiconductor device includes: a substrate; a semiconductor element installed on the substrate so that a surface formed with an electrode is directed to the substrate; a chip capacitor installed on the substrate; and a conductive material covering a rear surface opposite to the surface of the semiconductor element and joining to one terminal electrode of the chip capacitor.

16 Claims, 48 Drawing Sheets

(56) References Cited

U.S. PATENT DOCUMENTS

| | | | |
|---|---|---|---|
| 7,388,284 B1 * | 6/2008 | Zhang | 257/704 |
| 7,468,886 B2 * | 12/2008 | Coico et al. | 361/711 |
| 7,511,299 B1 * | 3/2009 | Alexander et al. | 257/48 |
| 7,566,591 B2 * | 7/2009 | Zhao et al. | 438/122 |
| 7,701,728 B2 | 4/2010 | Hatanaka et al. | |
| 7,813,133 B2 * | 10/2010 | Iijima et al. | 361/710 |
| 7,834,443 B2 | 11/2010 | So et al. | |
| 8,089,146 B2 * | 1/2012 | Fukuzono | 257/707 |
| 8,179,678 B2 * | 5/2012 | Yamashita et al. | 361/715 |
| 2001/0050428 A1 * | 12/2001 | Ando et al. | 257/700 |
| 2005/0047094 A1 * | 3/2005 | Hsu et al. | 361/704 |

* cited by examiner

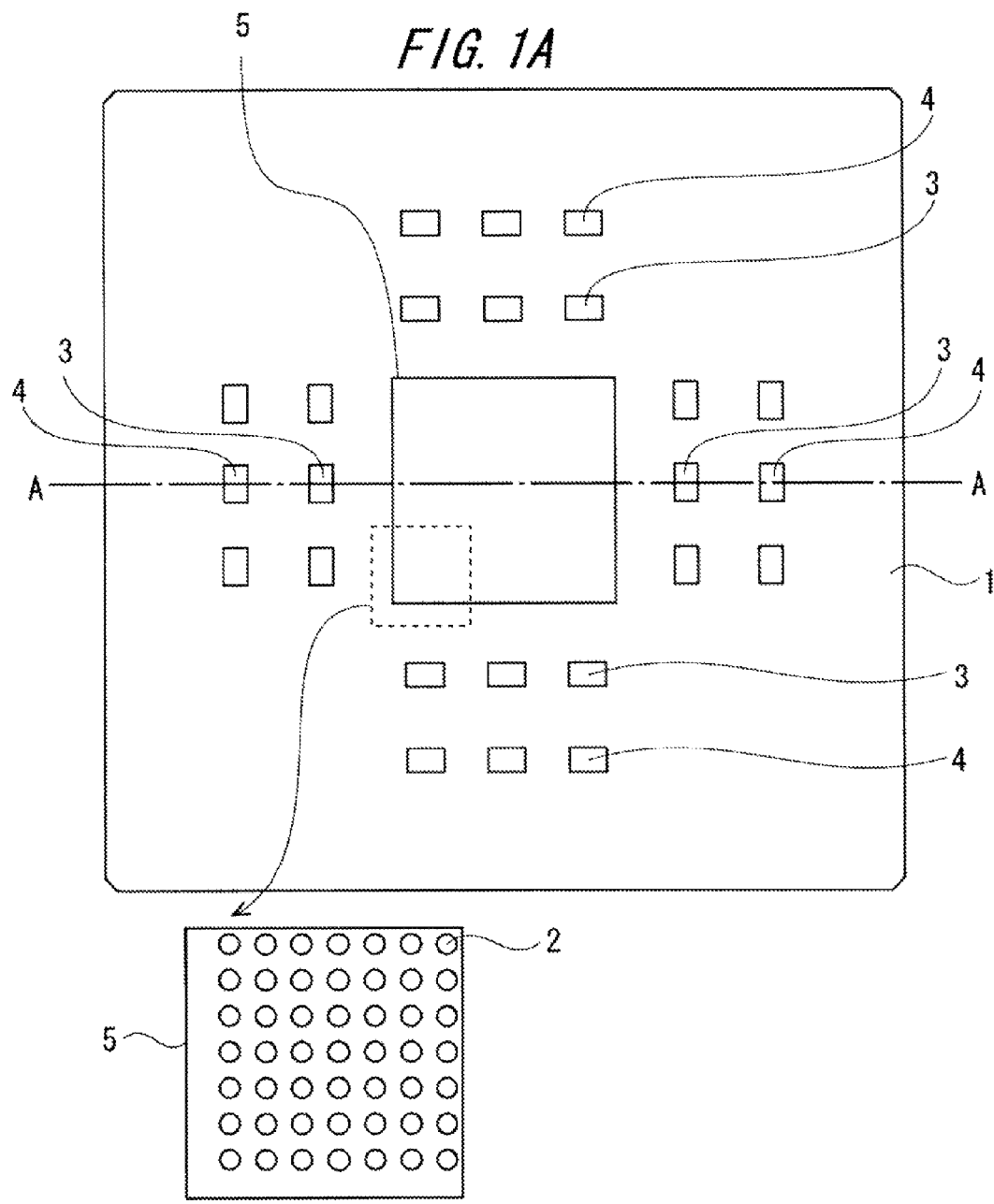

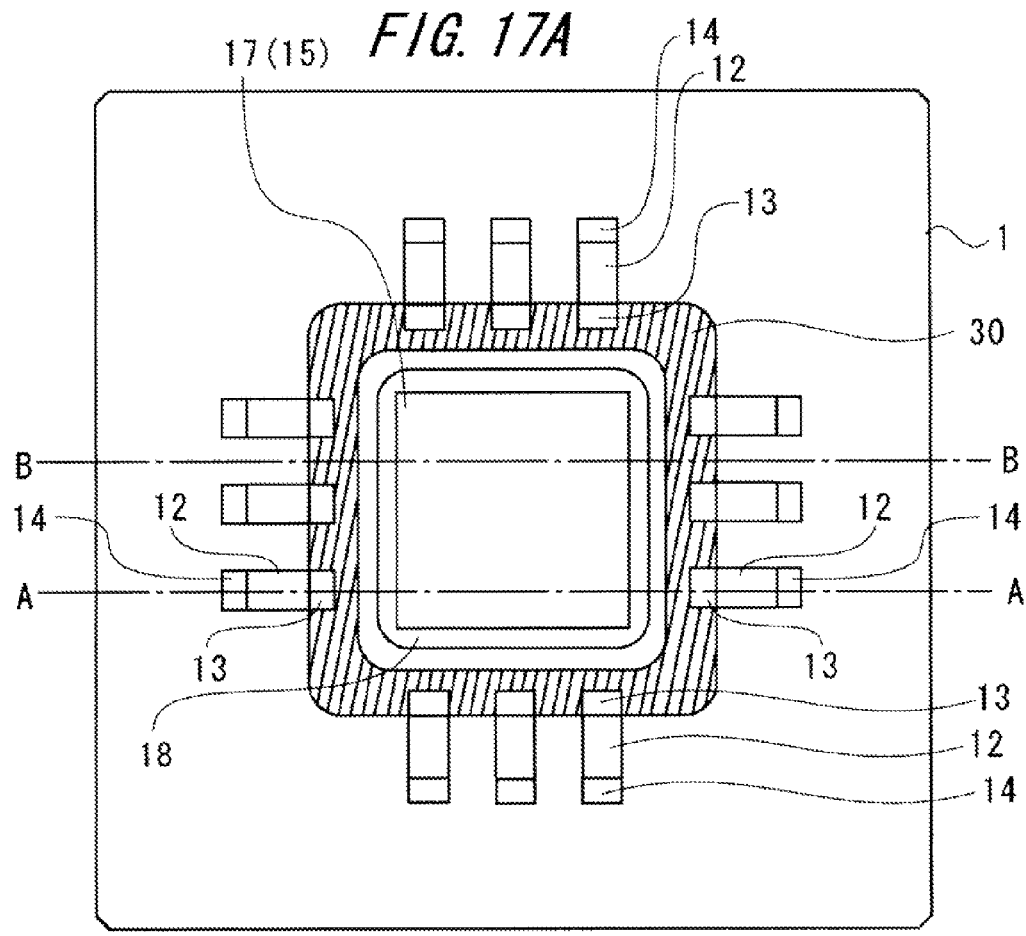
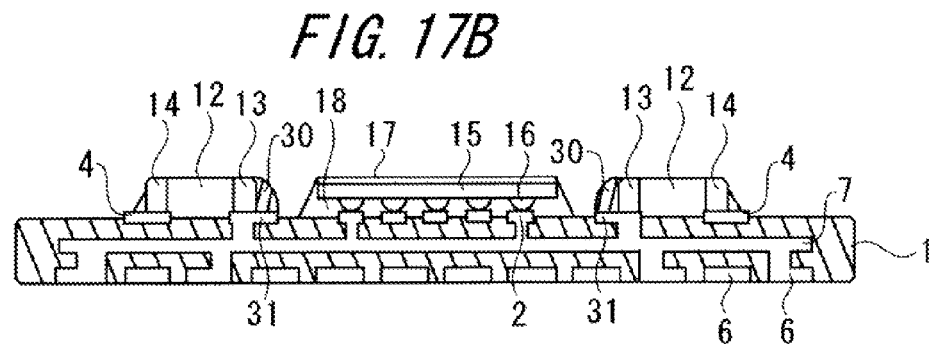
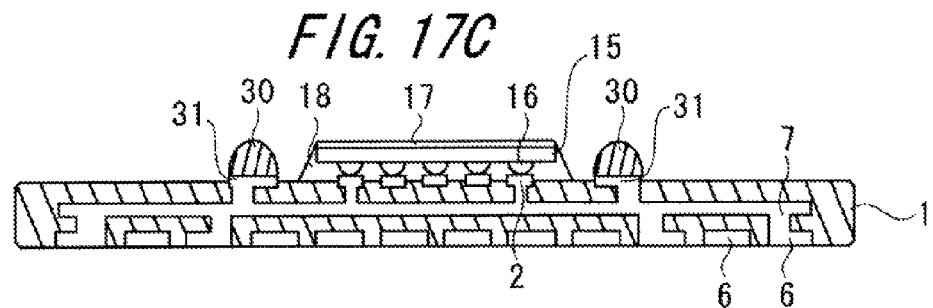

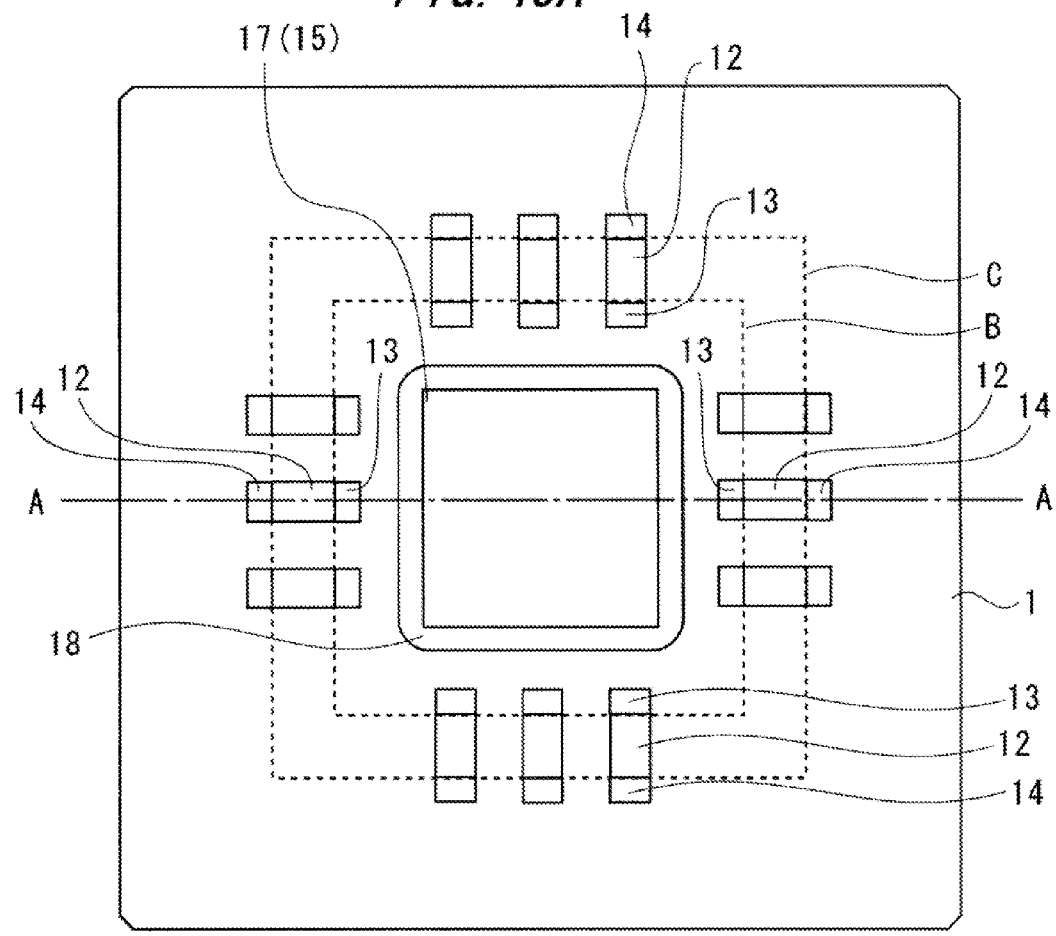
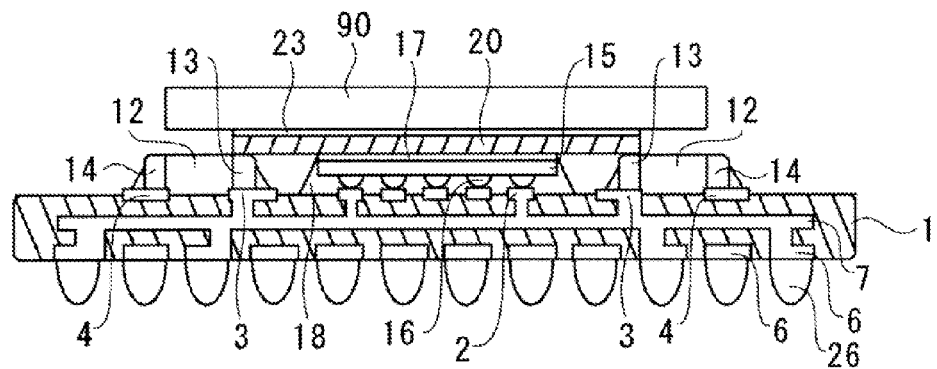

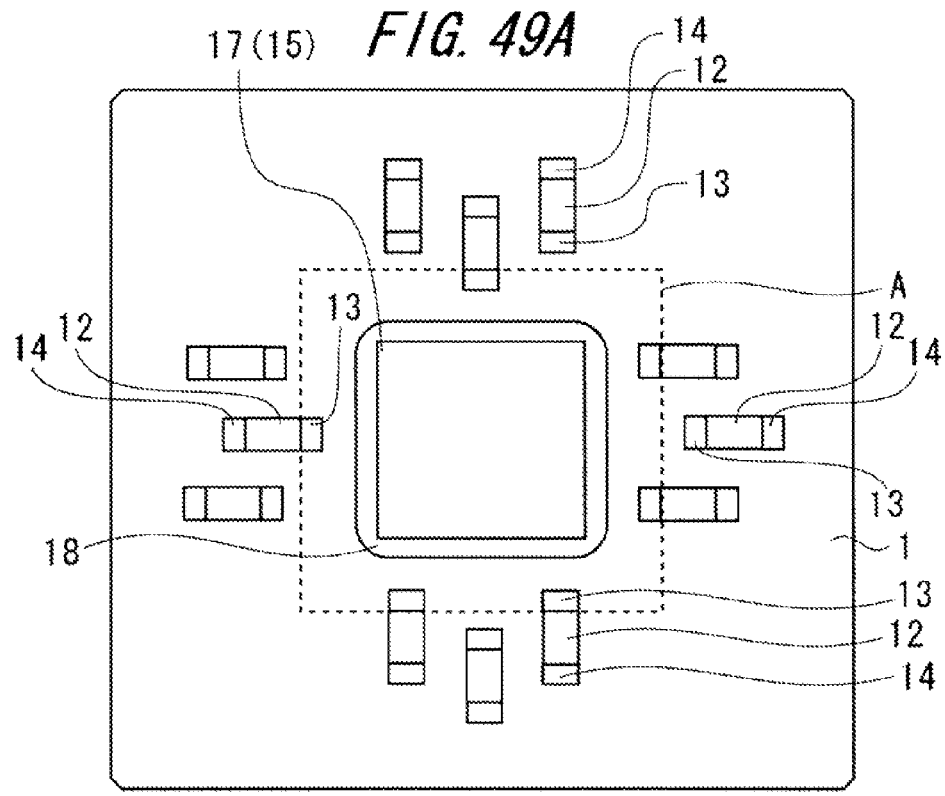
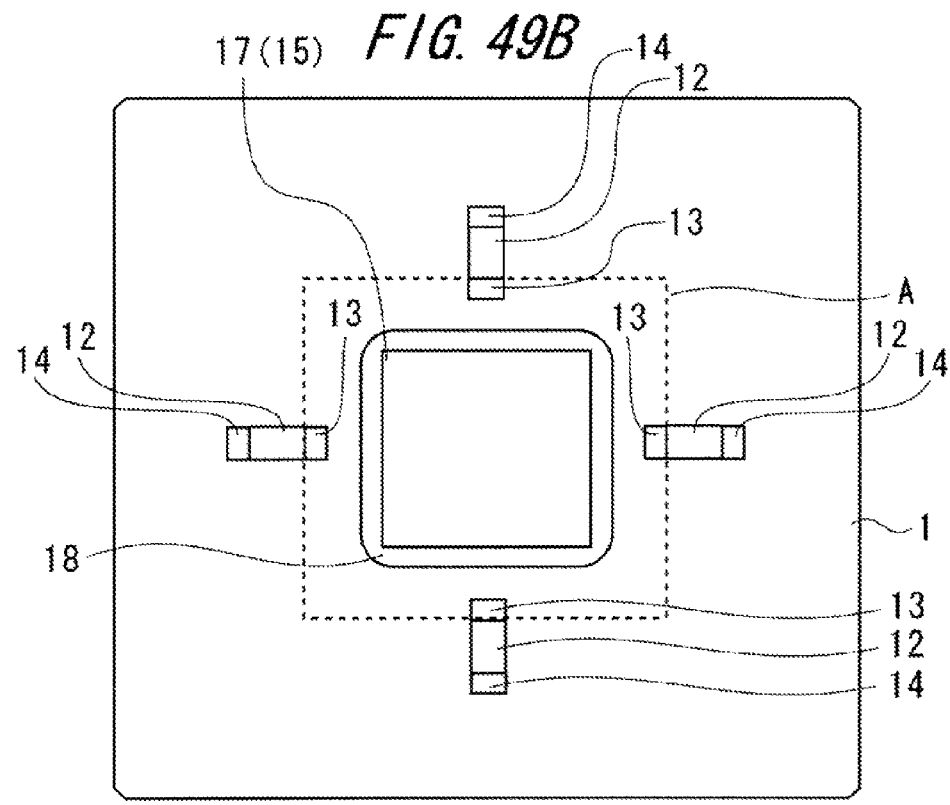

SEMICONDUCTOR DEVICE AND MANUFACTURING METHOD OF SEMICONDUCTOR DEVICE

CROSS-REFERENCE TO RELATED APPLICATION

This application is based upon and claims the benefit of priority of the prior Japanese Patent Application No. 2010-279284, filed on Dec. 15, 2010, the entire contents of which are incorporated herein by reference.

FIELD

The embodiment relates to a semiconductor device and a manufacturing method of the semiconductor device.

BACKGROUND

Over the recent years, as a device has been speeded up and has attained a higher frequency, an improvement of a heat radiation property and a stable supply of a power voltage have been requested of a semiconductor package. A conventional package takes a structure of sealing the package by a heat radiation plate exhibiting a high thermal conductivity and connecting a semiconductor element by use of a thermal conductive material, thereby enhancing the heat radiation property. Further, the conventional package takes a structure of disposing a multiplicity of chip capacitors on the substrate in order to realize the stable supply of the power voltage.

The improvements of these properties require disposing multiple passive components and multiple members on the substrate and require, in another aspect, downsizing and thinning the package. Moreover, a reduction in radiation of electromagnetic noises and prevention of a malfunction due to the electromagnetic noises coming from outside are required corresponding to a much higher frequency.

It is generally known that the periphery of the semiconductor element is shielded by electrically connecting the heat radiation plate to the substrate. In a limited area on the substrate, however, it is difficult to provide afresh an area for establishing the connections via the conductive materials etc on the substrate and perform wiring within the substrate, and an extra cost for materials such as conductive materials and connection materials is taken.

SUMMARY

According to an aspect of the embodiment, a semiconductor device includes: a substrate; a semiconductor element installed on the substrate so that a surface formed with an electrode is directed to the substrate; a chip capacitor installed on the substrate; and a conductive material covering a rear surface opposite to the surface of the semiconductor element and joining to one terminal electrode of the chip capacitor.

According to an aspect of the embodiment, a manufacturing method of a semiconductor device, includes: installing a chip capacitor on a substrate; installing a semiconductor element on the substrate so that a surface of the semiconductor element formed with an electrode is directed to the substrate; disposing a conductive material covering a rear surface opposite to the surface of the semiconductor element and brought into contact with one terminal electrode of the chip capacitor; disposing a heat radiation plate on the conductive material; and joining the rear surface of the semiconductor element to the conductive material, joining the conductive material to the heat radiation plate and joining one terminal electrode of the chip capacitor to the conductive material in a heating treatment.

The object and advantages of the embodiment will be realized and attained by means of the elements and combinations particularly pointed out in the claims. It is to be understood that both the foregoing general description and the following detailed description are exemplary and explanatory and are not restrictive of the embodiment, as claimed.

BRIEF DESCRIPTION OF THE DRAWINGS

FIG. 1A is a top view of a wiring substrate 1.

FIG. 1B is a sectional view of the wiring substrate 1, which is taken along the alternate long and short dash line A-A in FIG. 1A.

FIG. 17A is a top view of the semiconductor device in the case where the underfill resin 18 is filled in between the wiring substrate 1 and the semiconductor element 15.

FIG. 17B is a sectional view of the semiconductor device, which is taken along the alternate long and short dash line A-A in FIG. 17A.

FIG. 17C is a sectional view of the wiring substrate 1, which is taken along the alternate long and short dash line B-B in FIG. 17A.

FIG. 40A is a top view of the semiconductor device in the case of disposing, upwardly of the wiring substrate 1, a heat radiation plate 90 into which the heat radiation plate 21 is downsized.

FIG. 40B is a sectional view of the semiconductor device, which is taken along the alternate long and short dash line A-A in FIG. 40A.

FIG. 49A is a top view of the semiconductor device in the case of varying the layout of the chip capacitors 12.

FIG. 49B is a top view of the semiconductor device in such a case that the single chip capacitor 12 is disposed for each side of the outer peripheral portion of the conductive material 20 taking the quadrangle shape, and the terminal electrode 13 of the chip capacitor 12 abuts on the conductive material 20.

DESCRIPTION OF EMBODIMENT

Figure 2A:
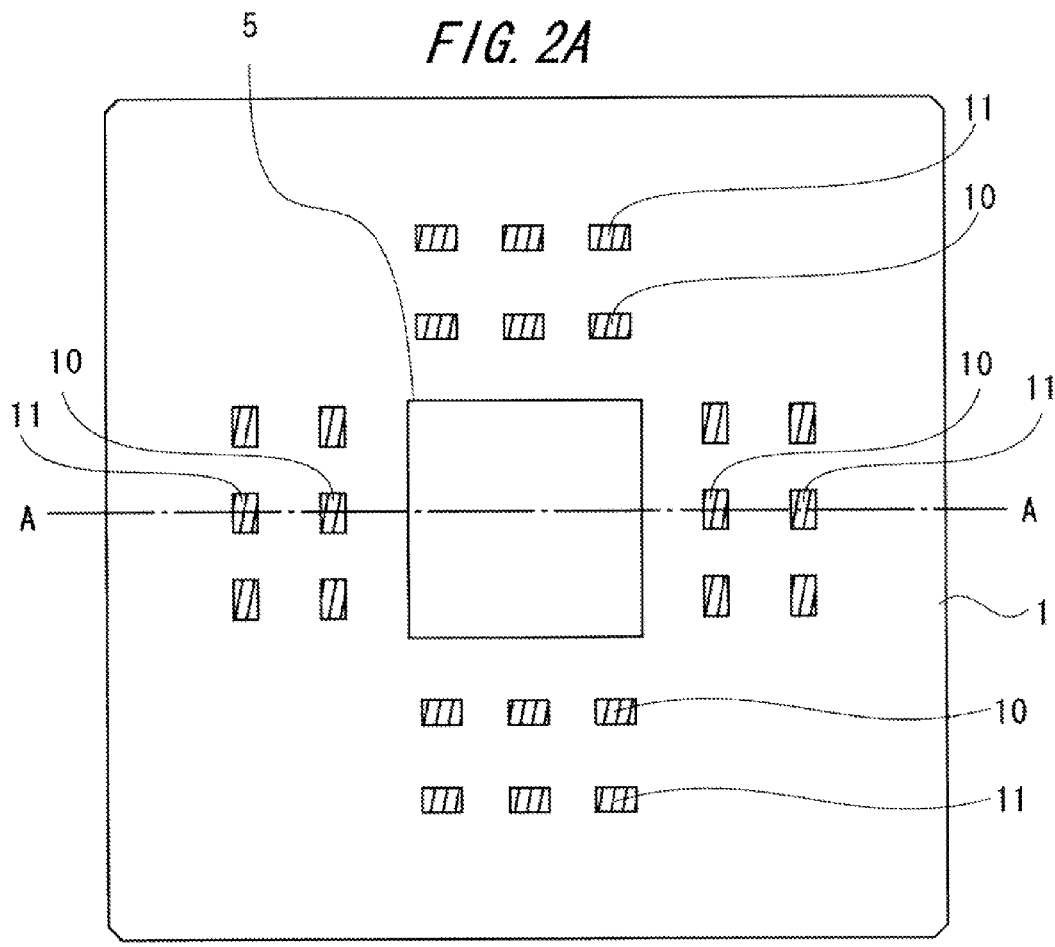
FIG. 2A is a top view of the wiring substrate 1 in the case of forming a solder 10 on an electrode pad 3 and a solder 11 on an electrode pad 4.

A semiconductor device and a manufacturing method thereof according to an embodiment will hereinafter be described in a way that exemplifies working examples with reference to the drawings. Configurations in the following working examples are exemplifications, and the embodiment is not limited to the configurations in the working examples.

First Working Example

The semiconductor device and the manufacturing method thereof according to a first working example will hereinafter be described. To start with, as illustrated in FIGS. 1A and 1B, a wiring substrate 1 is prepared. The wiring substrate 1 is a ceramic substrate such as an aluminum substrate or an organic substrate such as a build-up substrate. FIG. 1A is a top view of the wiring substrate 1. FIG. 1B is a sectional view of the wiring substrate 1, which is taken along the alternate long and short dash line A-A in FIG. 1A. A packaging surface of the wiring substrate 1 is formed with electrode pads 2 for joining to electrodes of a semiconductor element, and electrode pads 3 and 4 for joining to electrodes of a capacitor. A plurality of electrode pads 2 is formed in an installation region 5 of the semiconductor element. A rear surface of the wiring substrate 1 is formed with electrode pads 6 for joining soldering balls.

The wiring substrate 1 includes a ground layer and a power source layer. The ground layer is formed with a ground wire 7, while the power source layer is formed with a power source wire. The electrode pads 3 are connected to the ground wire 7. Further, a part of the electrode pads 2 and a part of the electrode pads 6 are connected to the ground wire 7. The electrode pads 4 are connected to the power source wire. Moreover, a part of the electrode pads 2 and a part of the electrode pads 6 are connected to the power source wire. In FIGS. 1A and 1B, illustrations of the ground layer, the power source layer and the power source wire are omitted.

Figure 2B:
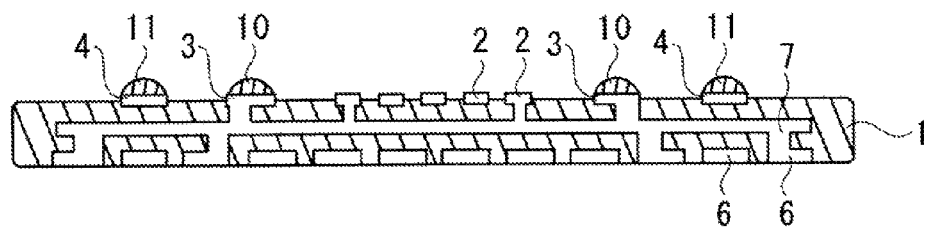
FIG. 2B is a sectional view of the wiring substrate 1, which is taken along the alternate long and short dash line A-A in FIG. 2A.

Next, as illustrated in FIGS. 2A and 2B, solders 10 are formed on the electrode pads 3, and solders 11 are formed on the electrode pads 4. For example, a solder paste is printed by using a printing mask, thereby forming the solder 10 on the electrode pad 3 and the solder 11 on the electrode pad 4. FIG. 2A is a top view of the wiring substrate 1 in the case of forming the solder 10 on the electrode pad 3 and the solder 11 on the electrode pad 4. FIG. 2B is a sectional view of the wiring substrate 1, which is taken along the alternate long and short dash line A-A in FIG. 2A.

Figure 3A:
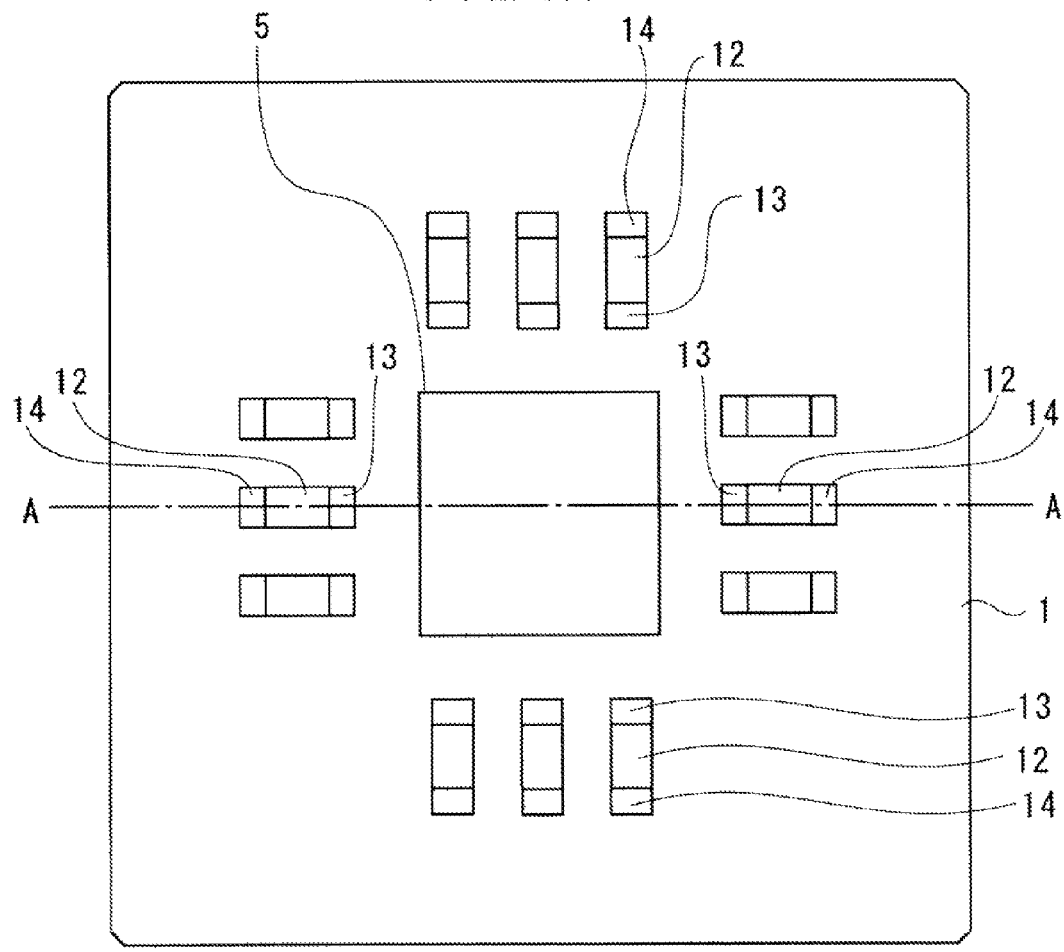
FIG. 3A is a top view of the wiring substrate 1 in the case of disposing a chip capacitors 12 on the wiring substrate 1.
Figure 3B:
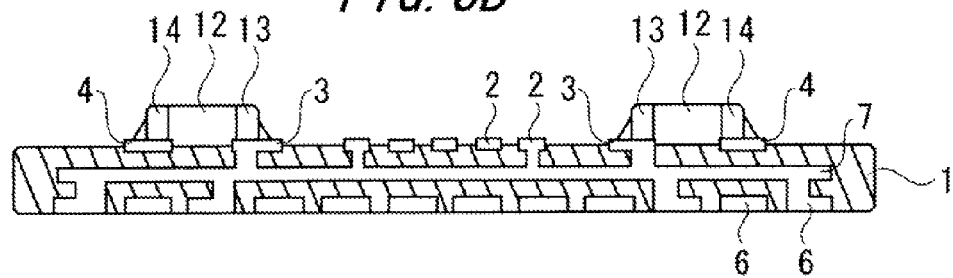
FIG. 3B is a sectional view of the wiring substrate 1, which is taken along the alternate long and short dash line A-A in FIG. 3A.

Then, as depicted in FIGS. 3A and 3B, a plurality of chip capacitors 12 is disposed on the wiring substrate 1. The plurality of chip capacitors 12 is so disposed as to be spaced away from each other at predetermined intervals on the wiring substrate 1. FIG. 3A is a top view of the wiring substrate 1 in the case of disposing the chip capacitors 12 on the wiring substrate 1. FIG. 3B is a sectional view of the wiring substrate 1, which is taken along the alternate long and short dash line A-A in FIG. 3A. As illustrated in FIGS. 3A and 3B, the chip capacitors 12 are disposed laterally on the wiring substrate 1 so that a terminal electrode 13 of the chip capacitor 12 is electrically connected to the electrode pad 3, while a terminal electrode 14 of the chip capacitor 12 is electrically connected to the electrode pad 4. Further, as illustrated in FIGS. 3A and 3B, the chip capacitors 12 are disposed on the wiring substrate 1 so that the terminal electrodes 13 of the chip capacitors 12 are directed to the installation region 5 of the semiconductor element.

Subsequently, the wiring substrate 1 is conveyed to a heating furnace, in which a heating treatment (reflow treatment) is conducted. The heating treatment is executed, whereby the solder 10 and the solder 11 get melted, and the solder 10 is joined to the electrode pad 3 and the terminal electrode 13 of the chip capacitor 12, while the solder 11 is jointed to the electrode pad 4 and the terminal electrode 14 of the chip capacitor 12. Through this operation, the terminal electrode 13 of the chip capacitor 12 is joined to the electrode pad 3 via the solder 10, and the terminal electrode 14 of the chip capacitor 12 is joined to the electrode pad 4 via the solder 11. The terminal electrode 13 of the chip capacitor 12 is joined to the electrode pad 3, and the terminal electrode 14 of the chip capacitor 12 is joined to the electrode pad 4, thereby installing (packaging) the chip capacitors 12 on the wiring substrate 1.

Figure 4A:
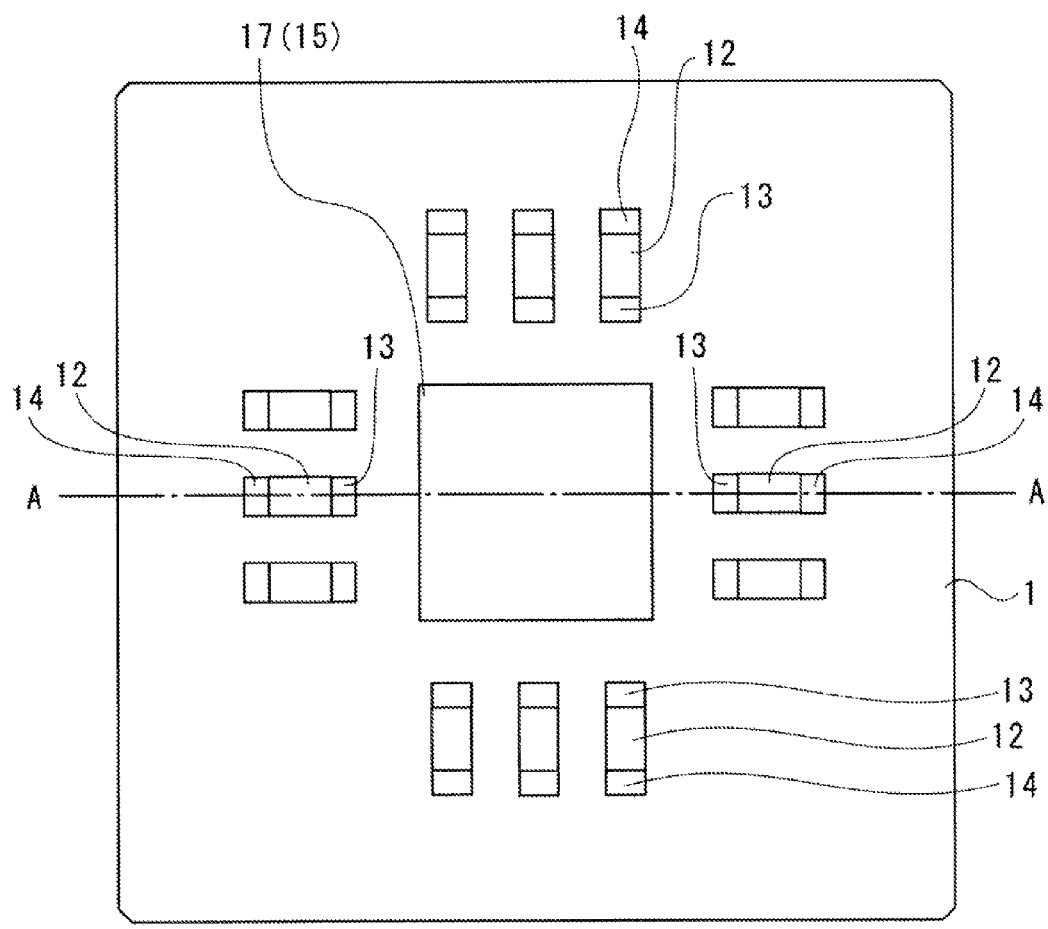
FIG. 4A is a top view of the semiconductor device in the case of installing a semiconductor element 15 on the wiring substrate 1.
Figure 4B:
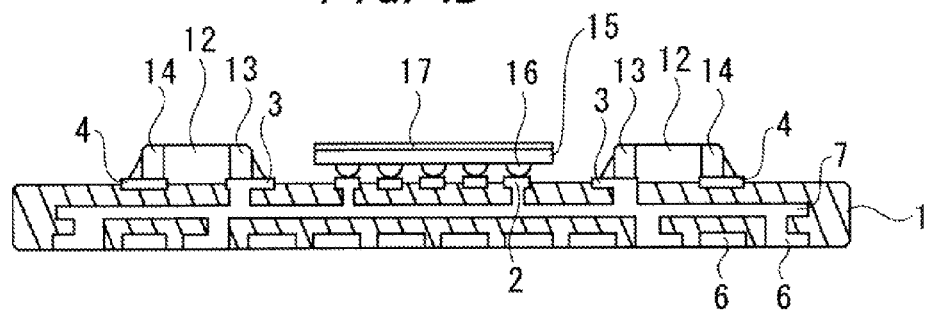
FIG. 4B is a sectional view of the semiconductor device, which is taken along the alternate long and short dash line A-A in FIG. 4A.

Next, as illustrated in FIGS. 4A and 4B, a semiconductor element 15 is installed on the wiring substrate 1. Namely, the semiconductor element 15 is packaged on the packaging surface of the wiring substrate 1. A surface of the semiconductor element 15 is formed with bumps (electrodes) 16, and a metal film 17 is formed on the rear surface opposite to the surface of the semiconductor element 15. For example, the semiconductor element 15 is disposed on the wiring substrate 1 so that the surface of the semiconductor element 15 is directed to the wiring substrate 1. To be specific, the semiconductor element 15 is disposed on the wiring substrate 1 so that the surface of the semiconductor element 15 faces the packaging surface of the wiring substrate 1. Then, the electrode pads 2 of the wiring substrate 1 are joined to the bumps 16 of the semiconductor element 15 by performing the heating treatment, thus installing (packaging) the semiconductor element 15 on the wiring substrate 1. Subsequently, the metal film 17 is formed on the rear surface of the semiconductor element 15 by sputtering, which involves using, e.g., titanium (Ti) and gold (Au).

FIG. 4A is a top view of the semiconductor device in the case of installing the semiconductor element 15 on the wiring substrate 1. In FIG. 4A, the metal film 17 is forme on the semiconductor element 15, and hence the reference numeral 15 is put in parenthesis. FIG. 4B is a sectional view of the semiconductor device, which is taken along the alternate long and short dash line A-A in FIG. 4A. As depicted in FIGS. 4A and 4B, the semiconductor element 15 is installed on the wiring substrate 1 so that the packaging surface of the wiring substrate 1 faces the bumps 16 of the semiconductor element 15.

Figure 5A:
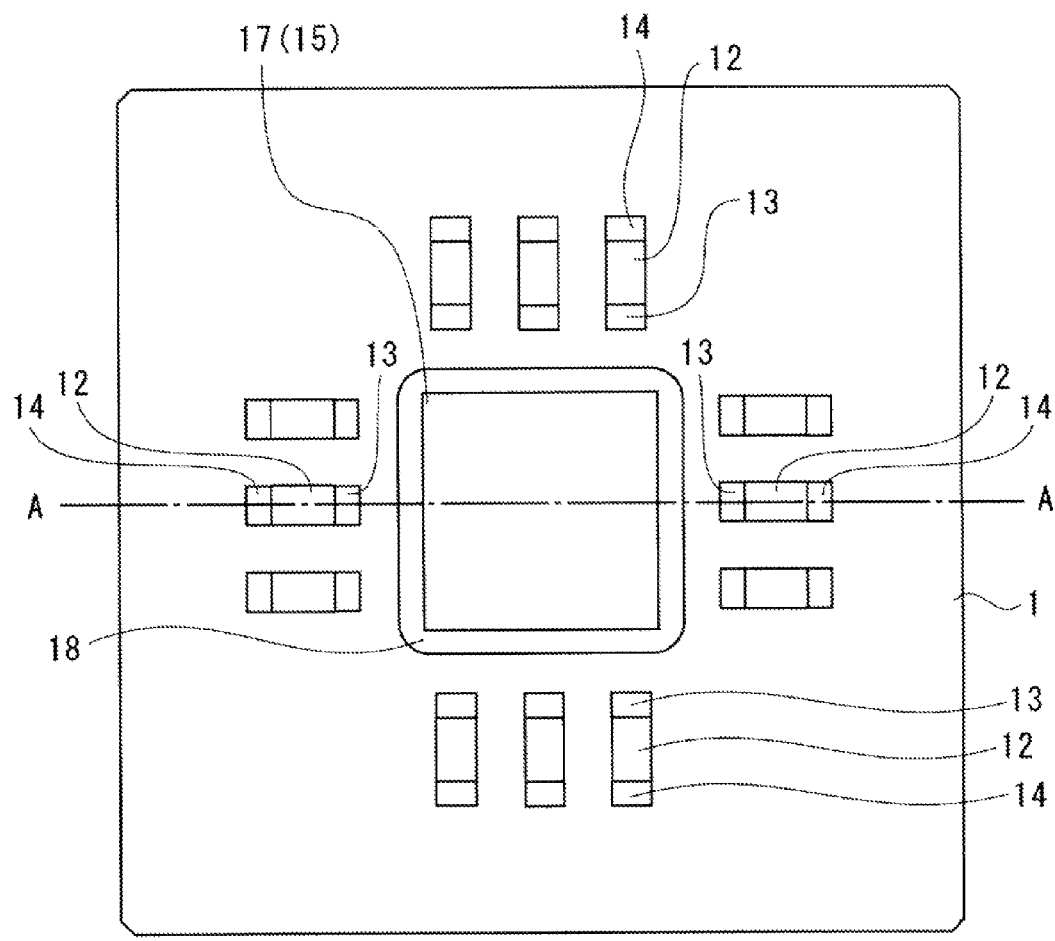
FIG. 5A is a top view of the semiconductor device in the case where an underfill resin 18 is filled in between the wiring substrate 1 and the semiconductor element 15.
Figure 5B:
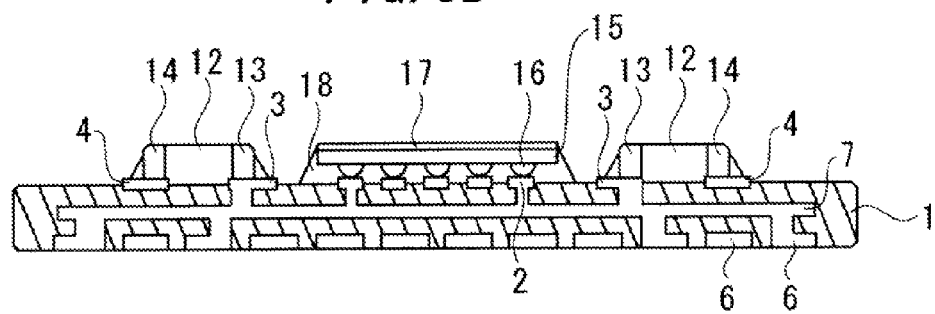
FIG. 5B is a sectional view of the semiconductor device, which is taken along the alternate long and short dash line A-A in FIG. 5A.

Then, as illustrated in FIGS. 5A and 5B, an underfill resin 18 is filled in between the wiring substrate 1 and the semiconductor element 15. FIG. 5A is a top view of the semiconductor device in the case where the underfill resin 18 is filled in between the wiring substrate 1 and the semiconductor element 15. FIG. 5B is a sectional view of the semiconductor device, which is taken along the alternate long and short dash line A-A in FIG. 5A. The filling of the underfill resin 18 is conducted by supplying the underfill resin 18 over to the periphery of the semiconductor element 15 from, e.g., a dispenser. Subsequently, the wiring substrate 1 is conveyed to the heating furnace, in which the heating treatment is executed. The execution of the heating treatment hardens the underfill resin 18 existing between the wiring substrate 1 and the semiconductor element 15.

Figure 6A:
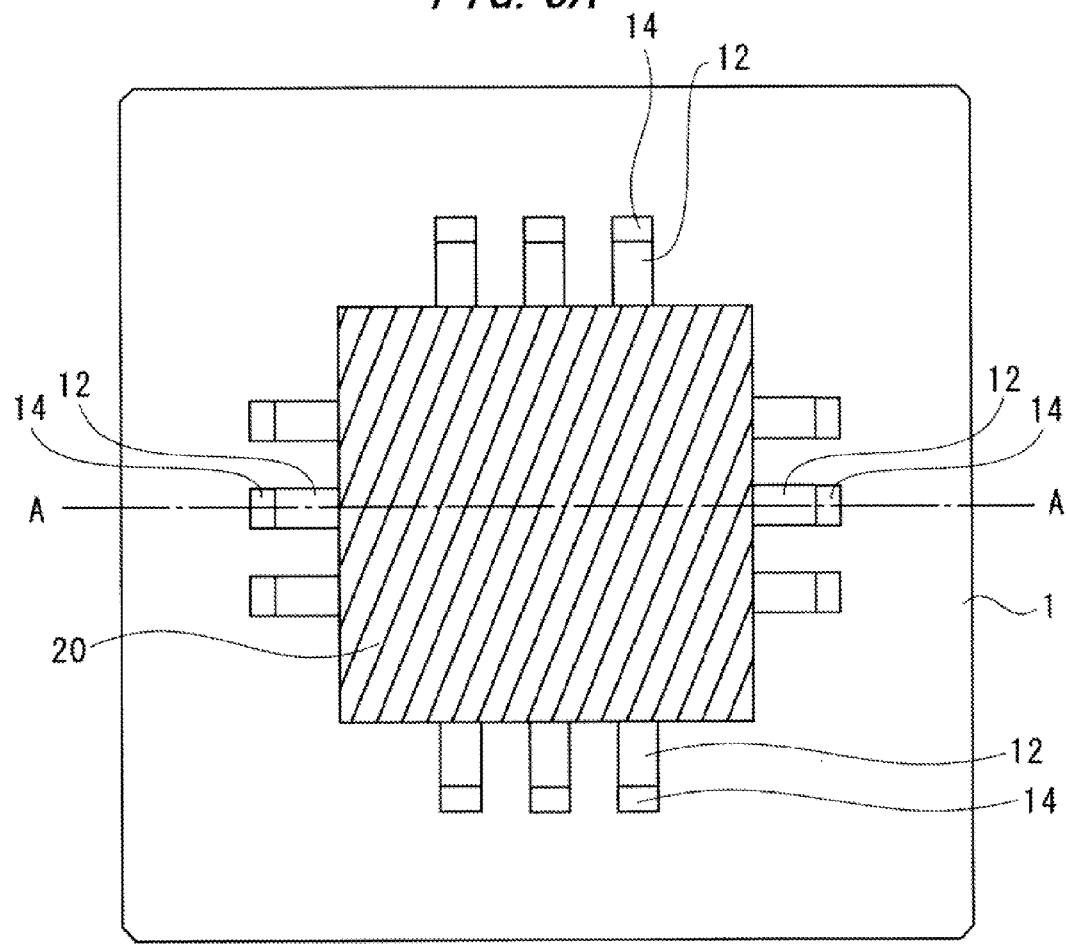
FIG. 6A is a top view of the semiconductor device in the case of disposing a conductive material 20 upwardly of the wiring substrate 1.
Figure 6B:
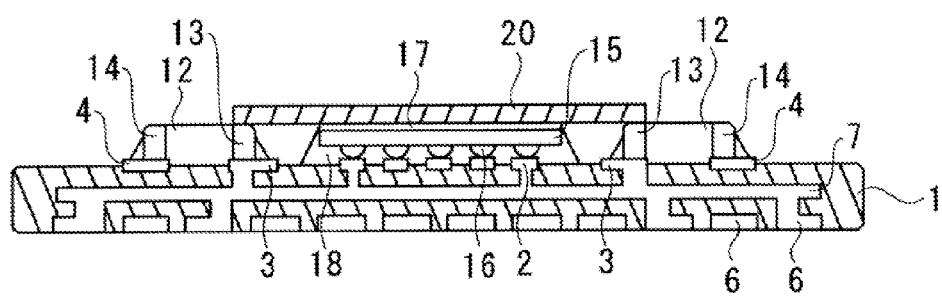
FIG. 6B is a sectional view of the semiconductor device, which is taken along the alternate long and short dash line A-A in FIG. 6A.

Then, as illustrated in FIGS. 6A and 6B, a conductive material 20 is disposed upwardly of the wiring substrate 1. FIG. 6A is a top view of the semiconductor device in the case of disposing the conductive material 20 upwardly of the wiring substrate 1. FIG. 6B is a sectional view of the semiconductor device, which is taken along the alternate long and short dash line A-A in FIG. 6A. It is preferable that the conductive material 20 involves using a material exhibiting satisfactory electrical conductivity, high thermal conductivity and good workability. For instance, a solder paste, a solder pellet, etc may be used as the conductive material 20, and the solder is, e.g., an indium-silver (In—Ag) solder composed mainly of indium (In) and silver (Ag). The conductive material 20 covers the rear surface of the semiconductor element 15, and the terminal electrode 13 of the chip capacitor 12 is brought into contact with the conductive material 20. Namely, a central region of one surface of the conductive material 20 covers the rear surface of the semiconductor element 15, and a part of an outer peripheral region surrounding the central region of one surface of the conductive material 20 is brought into contact with the terminal electrode 13 of the chip capacitor 12.

A thickness of the chip capacitor 12 is, e.g., 0.600 mm, and a thickness of the solder formed on each of the electrode pad 3 and the electrode pad 4 is, e.g., 0.010 mm. Hence, a packaging height of the chip capacitor 12 is 0.610 mm. A thickness of the semiconductor element 15 is, e.g. 0.550 mm, and a height of the bump 16 of the semiconductor element 15 is, e.g., 0.060 mm. Hence, the packaging height of the semiconductor element 15 is 0.610 mm. The packaging height of the chip capacitor 12 is coincident with the packaging height of the semiconductor element 15. A thickness of the conductive material 20 is, e.g., 0.350 mm.

Figure 7A:
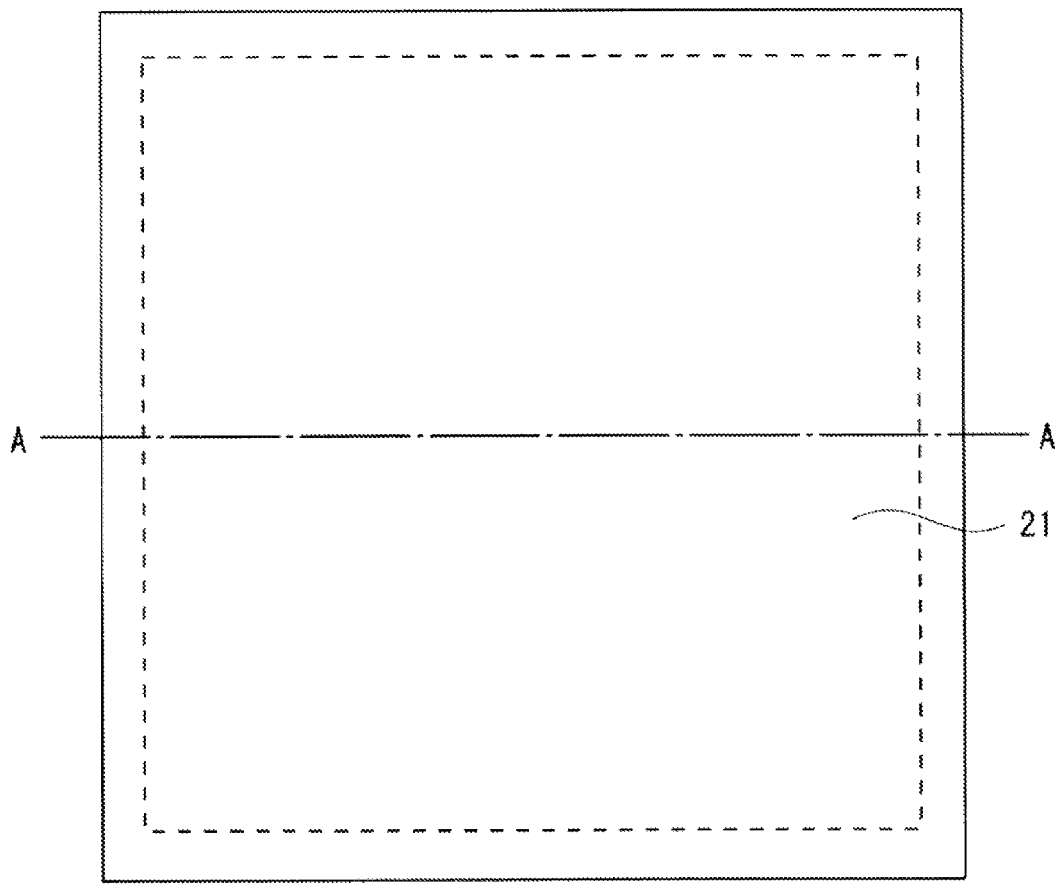
FIG. 7A is a top view of the semiconductor device in the case of disposing a heat radiation plate 21 upwardly of the wiring substrate 1.
Figure 7B:
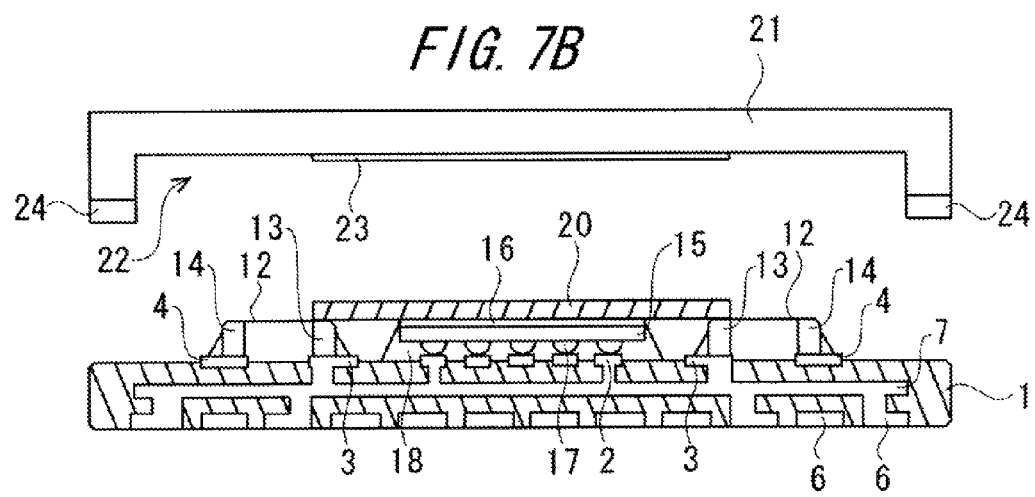
FIG. 7B is a sectional view of the semiconductor device, which is taken along the alternate long and short dash line A-A in FIG. 7A.

Subsequently, as depicted in FIGS. 7A and 7B, a heat radiation plate 21 is disposed upwardly of the wiring substrate 1. FIG. 7A is a top view of the semiconductor device in the case of disposing the heat radiation plate 21 upwardly of the wiring substrate 1. FIG. 7B is a sectional view of the semiconductor device, which is taken along the alternate long and short dash line A-A in FIG. 7A. The heat radiation plate 21 involves employing a material exhibiting the satisfactory heat conductivity (heat radiation property). Metal plates of, e.g., Cu, Al, AlSiC, AlC, etc may be used as the heat radiation plate 21. The heat radiation plate 21 is processed into a recessed shape, and a metal film 23 is formed in a central region of a recessed portion 22 of the heat radiation plate 21. The metal film 23 is formed by applying electroless plating by use of, e.g., nickel (Ni) and gold (Au). A protruded portion of the recessed portion 22 is provided with a bonding agent 24. Namely, the bonding agent 24 is provided on the portion, abutting on the wiring substrate 1, of one surface of the heat radiation plate 21. For example, a bonding agent (APAS1592, made by Sumitomo 3M Limited) taking an insulating tape-like shape may also be employed as the bonding agent 24.

Figure 8:
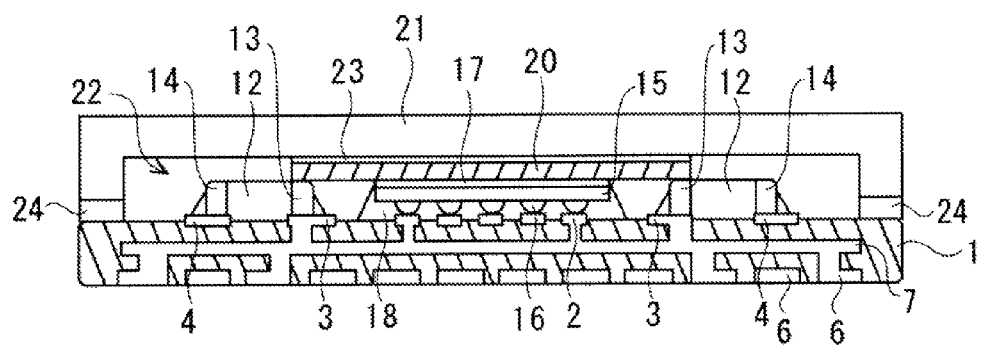
FIG. 8 is a sectional view of the semiconductor device in the case of boding the wiring substrate 1 and the heat radiation plate 21 together via a bonding agent 24 and bringing the conductive material 20 into contact with the central region of a recessed portion 22 of the heat radiation plate 21.

Next, the wiring substrate 1 and the heat radiation plate 21 are aligned with each other. Then, as illustrated in FIG. 8, the heat radiation plate 21 is disposed on the conductive material 20, and the wiring substrate 1 is bonded to the heat radiation plate 21 via the bonding agent 24, thus bringing the conductive material 20 into contact with the central region of the recessed portion 22 of the heat radiation plate 21. FIG. 8 is a sectional view of the semiconductor device in the case of boding the wiring substrate 1 and the heat radiation plate 21 together via the bonding agent 24 and bringing the conductive material 20 into contact with the central region of the recessed portion 22 of the heat radiation plate 21.

Figure 9:
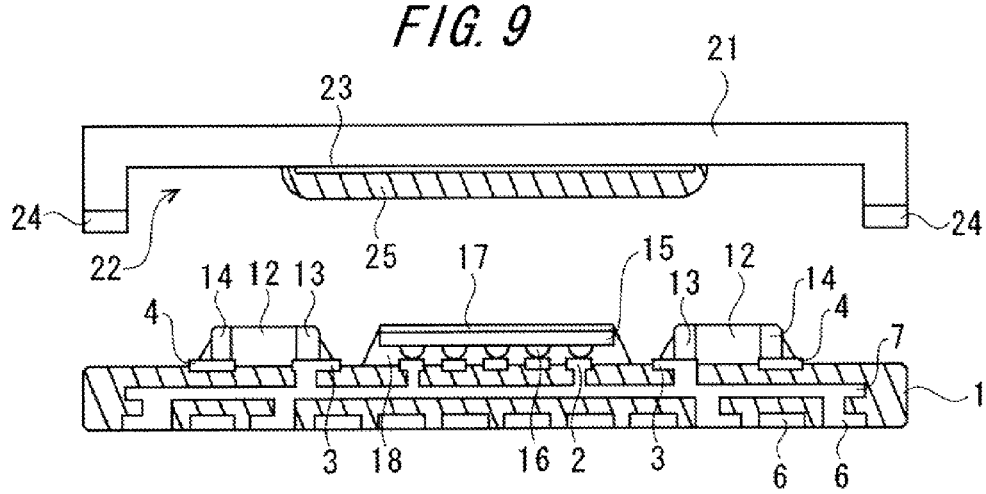
FIG. 9 is a sectional view of the semiconductor device in the case of disposing the heat radiation plate 21 upwardly of the wiring substrate 1 and applying the conductive bonding agent 25 over to the central region of the recessed portion 22 of the heat radiation plate 21.

The conductive material 20 may also be a conductive bonding agent 25. The conductive bonding agent 25 may involve using, e.g., a conductive adhesive transfer tape (made by Sumitomo 3M Limited) or a conductive pressure sensitive adhesive double coated tape (made by Sumitomo 3M Limited). In the case of using the conductive bonding agent 25, as illustrated in FIG. 9, the heat radiation plate 21 is disposed upwardly of the wiring substrate 1, and the conductive bonding agent 25 is applied over to the central region of the recessed portion 22 of the heat radiation plate 21. FIG. 9 is a sectional view of the semiconductor device in the case of disposing the heat radiation plate 21 upwardly of the wiring substrate 1 and applying the conductive bonding agent 25 over to the central region of the recessed portion 22 of the heat radiation plate 21. When employing the conductive bonding agent 25, similarly to FIG. 8, the wiring substrate 1 and the heat radiation plate 21 are aligned with each other, and the heat radiation plate 21 coated with the conductive bonding agent 25 is disposed upwardly of the wiring substrate 1. Then, the wiring substrate 1 and heat radiation plate 21 are bonded together via the bonding agent 24, and the rear surface of the semiconductor element 15 is brought into contact with the conductive bonding agent 25 applied over to the central region of the recessed portion 22 of the heat radiation plate 21.

After bonding the wiring substrate 1 to the heat radiation plate 21, the semiconductor device is conveyed to the heating furnace, in which the heating treatment (reflow treatment) is conducted. The heating treatment is executed, whereby the solder 10 gets melted, the terminal electrode 13 of the chip capacitor 12 is joined to the conductive material 20, then the rear surface of the semiconductor element 15 is joined to the conductive material 20, and the conductive material 20 is joined to the heat radiation plate 21. The rear surface of the semiconductor element 15 is joined to the conductive material 20, thereby installing the conductive material 20 on the semiconductor element 15. The conductive material 20 and the heat radiation plate 21 are joined together, whereby the heat radiation plate 21 is installed on the conductive material 20. For instance, in the case of using the indium-series solder as the conductive material 20, a melting point of the indium-series solder is 156° C., and hence the conductive material 20 is melted by heating the conductive material 20 at a temperature equal to or higher than 156° C. Note that the melted conductive material 20 gets deformed due to a weight of the heat radiation plate 21, with the result that the thickness of the conductive material 20 comes to, e.g., 0.280 mm.

Figure 10:
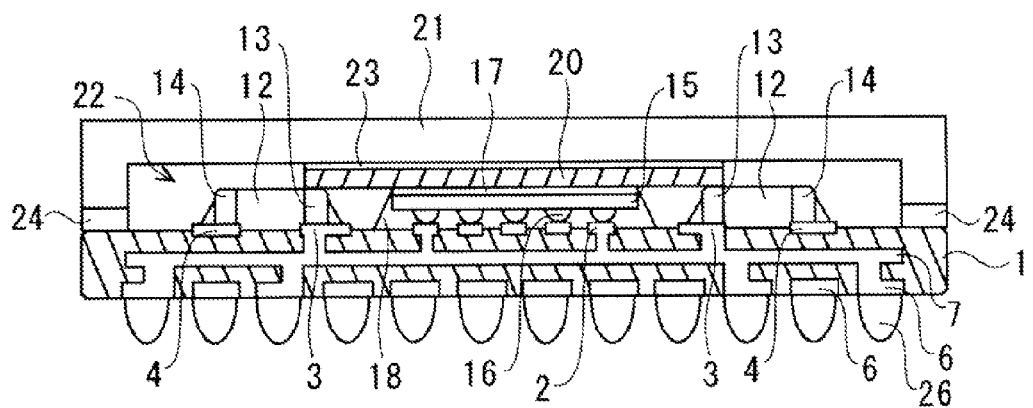
FIG. 10 is a sectional view of the semiconductor device when joining soldering balls 26 onto the electrode pads 6 of the wiring substrate 1.

Subsequently, a flux is applied onto the electrode pad 6 of the wiring substrate 1 by use of a mask. Next, soldering balls 26 are disposed on the electrode pads 6 of the wiring substrate 1, and the semiconductor device is conveyed to the heating furnace, in which the heating treatment (reflow treatment) is conducted. The heating treatment is carried out, whereby the soldering balls 26 are, as illustrated in FIG. 10, joined onto the electrode pads 6 of the wiring substrate 1. FIG. 10 is a sectional view of the semiconductor device when joining the soldering balls 26 onto the electrode pads 6 of the wiring substrate 1.

The terminal electrode 13 of the chip capacitor 12 is electrically connected to the electrode pad 3 connecting with the ground wire 7, and a ground voltage is supplied to the terminal electrode 13 of the chip capacitor 12 via the ground wire 7. The terminal electrode 13 of the chip capacitor 12 is connected to the conductive material 20, and therefore the terminal electrode 13 of the chip capacitor 12 is electrically connected to the conductive material 20. As a result, the terminal electrode 13 of the chip capacitor 12 and the conductive material 20 come to ground potential, and the periphery of the semiconductor element 15 is shielded electromagnetically. Note that the ground wire 7 is provided over the entire downward surface of the semiconductor element 15, whereby the whole downward portion of the semiconductor element 15 may be electromagnetically shielded.

The terminal electrode 14 of the chip capacitor 12 is electrically connected to the electrode pad 4 connecting with the power source wire, and the power voltage is supplied to the terminal electrode 14 of the chip capacitor 12 via the power source wire. The heat generated by the semiconductor element 15 is transmitted to the heat radiation plate 21 via the conductive material 20 and radiated by the heat radiation plate 21.

The terminal electrode 13 of the chip capacitor 12 functions as a shield member which electromagnetically shields the portion along the side surface of the semiconductor element 15 and functions also as a connecting member which connects the wiring substrate 1 to the conductive material 20. Accordingly, the semiconductor device in the first working example has no necessity for installing, on the semiconductor device, a new member for electromagnetically shielding the peripheral along the side surface of the semiconductor element 15 and enables the semiconductor device to be restrained from upsizing.

What has been discussed so far exemplified the case of making the packaging height of the chip capacitor 12 coincident with the packaging height of the semiconductor element 15. If the conductive material 20 is flat, as the packaging height of the chip capacitor 12 is equalized to the packaging height of the semiconductor element 15, there are more facilitated the junction between the terminal electrode 13 of the chip capacitor 12 and the conductive material 20 and the junction between the rear surface of the semiconductor element 15 and the conductive material 20. If the terminal electrode 13 of the chip capacitor 12 may be joined to the conductive material 20 and if the rear surface of the semiconductor element 15 may be joined to the conductive material 20, the packaging height of the chip capacitor 12 may be either larger or smaller than the packaging height of the semiconductor element 15.

Figure 11:
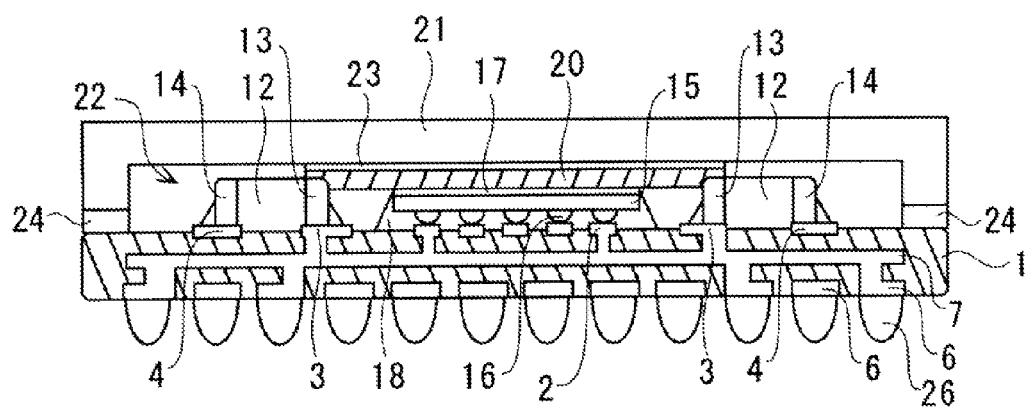
FIG. 11 is a sectional view of the semiconductor device when the packaging height of the chip capacitor 12 is larger than the packaging height of the semiconductor element 15.

FIG. 11 is a sectional view of the semiconductor device when the packaging height of the chip capacitor 12 is larger than the packaging height of the semiconductor element 15. In the semiconductor device depicted in FIG. 11, on the occasion of melting the conductive material 20, the conductive material 20 gets deformed in a protruded shape by pressing the heat radiation plate 21 against the wiring substrate 1, thereby enabling the rear surface of the semiconductor element 15 to be joined to the conductive material 20. The thickness of the chip capacitor 12 is, e.g., 0.850 mm, and the thickness of each of the solders formed on the electrode pads 3 and 4 is, e.g., 0.010 mm. Hence, the packaging height of the chip capacitor 12 is 0.860 mm. The thickness of the semiconductor element 15 is, e.g., 0.550 mm, and the height of the bump 16 of the semiconductor element 15 is, e.g., 0.060 mm. Hence, the packaging height of the semiconductor element 15 is 0.610 mm. The thickness of the conductive material 20 between the semiconductor element 15 and the heat radiation plate 21 is, e.g., 0.280 mm, and the thickness of the conductive material 20 between the terminal electrode 13 of the chip capacitor 12 and the heat radiation plate 21 is, e.g., 0.030 mm. Note that the thickness of the conductive material 20 before being melted is 0.350 mm.

Figure 12:
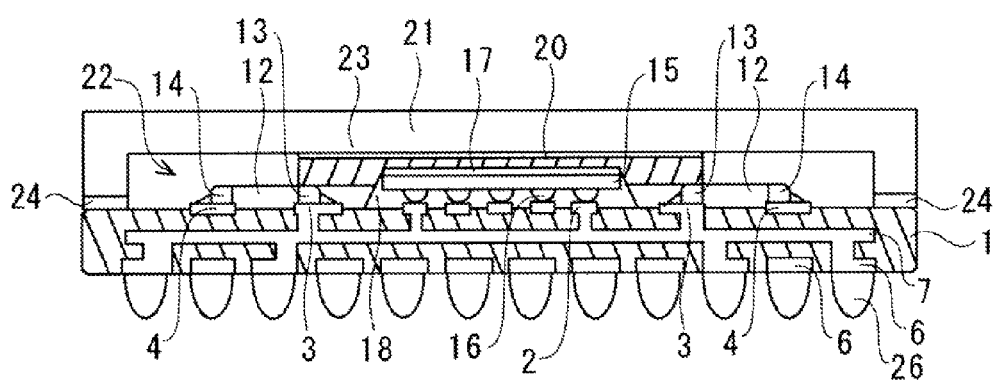
FIG. 12 is a sectional view of the semiconductor device when the packaging height of the chip capacitor 12 is smaller than the packaging height of the semiconductor element 15.

FIG. 12 is a sectional view of the semiconductor device when the packaging height of the chip capacitor 12 is smaller than the packaging height of the semiconductor element 15. In the semiconductor device depicted in FIG. 12, on the occasion of melting the conductive material 20, the conductive material 20 gets deformed in a recessed shape by pressing the heat radiation plate 21 against the wiring substrate 1, thereby enabling the terminal electrode 13 of the chip capacitor 12 to be joined to the conductive material 20. The thickness of the chip capacitor 12 is, e.g., 0.300 mm, and the thickness of each of the solders formed on the electrode pads 3 and 4 is, e.g., 0.010 mm. Therefore, the packaging height of the chip capacitor 12 is 0.310 mm. The thickness of the semiconductor element 15 is, e.g., 0.550 mm, and the height of the bump 16 of the semiconductor element 15 is, e.g., 0.060 mm. Hence, the packaging height of the semiconductor element 15 is 0.610 mm. The thickness of the conductive material 20 between the semiconductor element 15 and the heat radiation plate 21 is, e.g., 0.350 mm, and the thickness of the conductive material 20 between the terminal electrode 13 of the chip capacitor 12 and the heat radiation plate 21 is, e.g., 0.050 mm. Note that the thickness of the pre-melting conductive material 20 is 0.350 mm.

Moreover, the thickness of the conductive material 20 between the semiconductor element 15 and the heat radiation plate 21 and the thickness of the conductive material 20 between the terminal electrode 13 of the chip capacitor 12 and the heat radiation plate 21, may be controlled by changing the thickness of the heat radiation plate 21 and the thickness of the bonding agent 24. Further, the thickness of the conductive material 20 may also be controlled in a way that uses a material having ductility as the bonding agent 24 and adjusts the thickness of the bonding agent 24 by applying a load to the heat radiation plate 21. For instance, if the bonding agent 24 is composed of the material having the ductility, the conductive material 20 is pressed against the rear surface of the semiconductor element 15 and against the chip capacitor 12 by applying the load to the heat radiation plate 21, whereby the thickness of the conductive material 20 may be decreased. A load value per area of the heat radiation plate 21 is previously obtained based on the packaging height of the chip capacitor 12, the packaging height of the semiconductor element 15, the thickness of the heat radiation plate 21 and the thickness of the bonding agent 24.

Modified Example of First Working Example

Figure 13A:
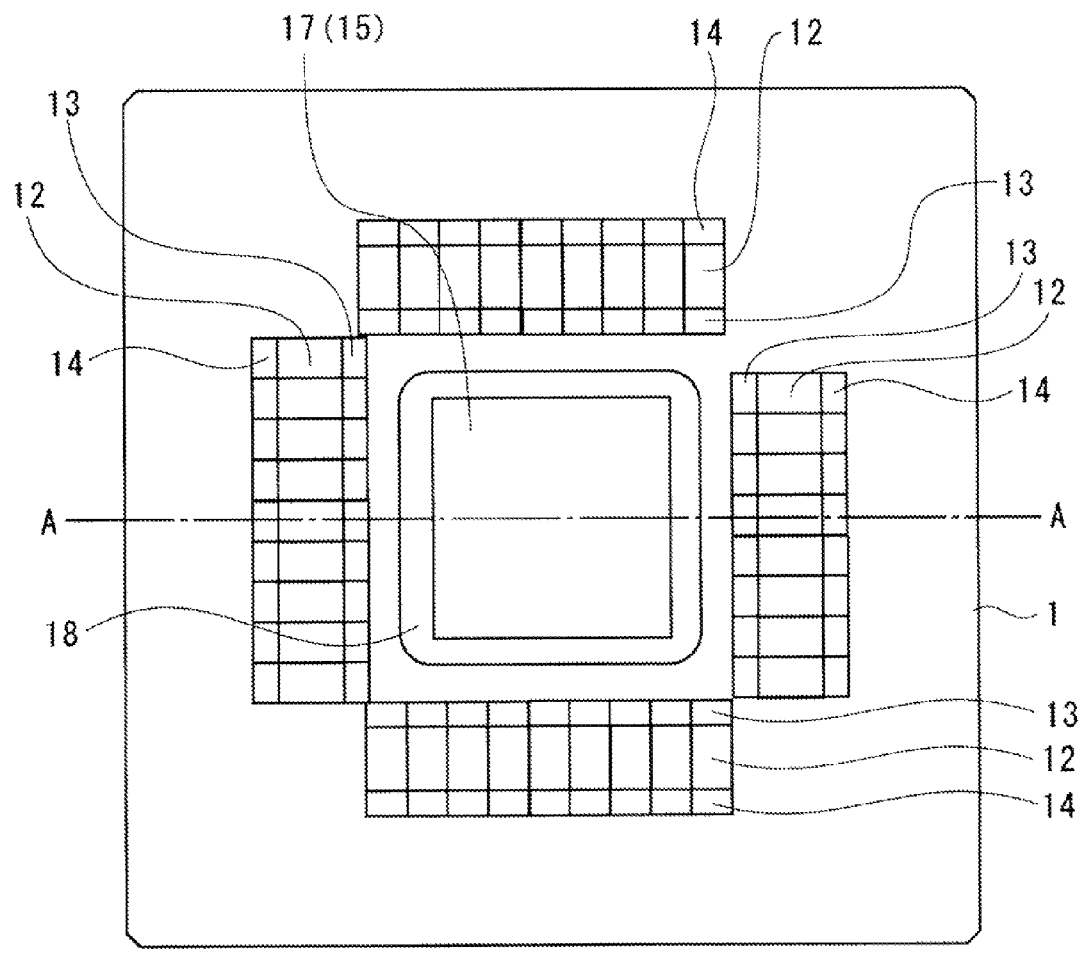
FIG. 13A is a top view of the semiconductor device in the case where the plurality of chip capacitors 12 is tightly fitted and thus consecutively disposed on the wiring substrate 1.
Figure 13B:
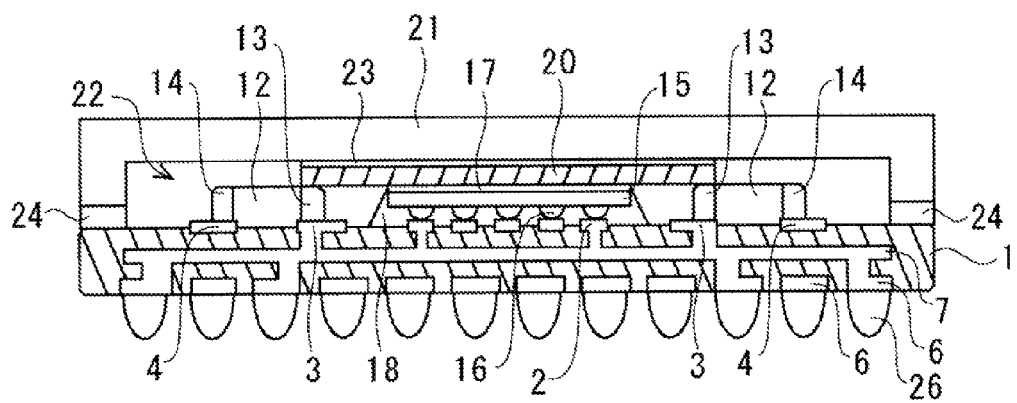
FIG. 13B is a sectional view of the semiconductor device, which is taken along the alternate long and short dash line A-A in FIG. 13A.

FIG. 3 has illustrated the example where the plurality of chip capacitors 12 is so disposed as to be spaced away from each other at the predetermined intervals on the wiring substrate 1, however, the plurality of chip capacitors 1 may also be disposed consecutively on the wiring substrate 1 in a manner that tightly fits the chip capacitors 12. FIG. 13A is a top view of the semiconductor device in the case where the plurality of chip capacitors 12 is tightly fitted and thus consecutively disposed on the wiring substrate 1. In FIG. 13A, the illustrations of the conductive material 20, the heat radiation plate 21, the metal film 23 and the bonding agent 24 are omitted. FIG. 13B is a sectional view of the semiconductor device, which is taken along the alternate long and short dash line A-A in FIG. 13A. The semiconductor device by the method demonstrated in the first working example is manufactured in a way that employs the wiring substrate 1 on which the plurality of chip capacitors 12 is tightly fitted and thus consecutively disposed, thereby enabling enhancement of the electromagnetic shield effect in the periphery along the side surface of the semiconductor element 15. Further, the modified example of the first working example may also be applied to the semiconductor devices and the manufacturing methods thereof according to a second working example through a sixteenth working example that will hereinafter be discussed.

Second Working Example

Figure 14A:
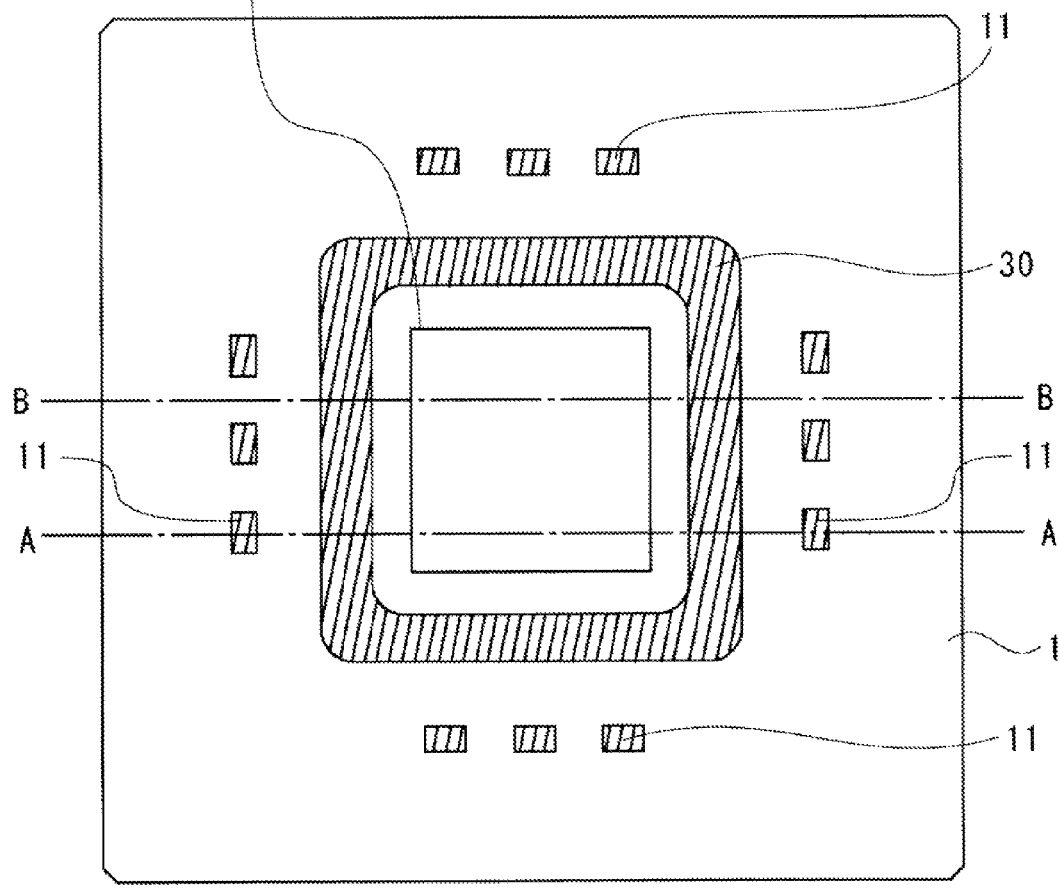
FIG. 14A is a top view of the wiring substrate 1 in the case of forming a conductive layer 30 so that the installation region 5 of the semiconductor element 15 is enclosed by the conductive layer 30 and forming the solders 11 on the electrode pads 4.
Figure 14B:
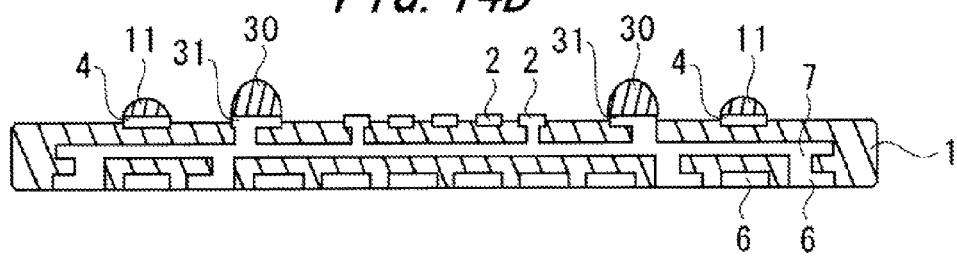
FIG. 14B is a sectional view of the wiring substrate 1, which is taken along the alternate long and short dash line A-A in FIG. 14A.
Figure 14C:
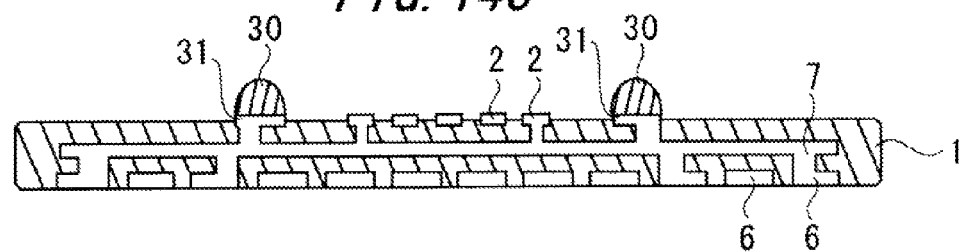
FIG. 14C is a sectional view of the wiring substrate 1, which is taken along the alternate long and short dash line B-B in FIG. 14A.

The semiconductor device and the manufacturing method thereof according to a second working example will hereinafter be described. Note that the same components as those in the first working example are marked with the same reference numerals as those in the first working example, and their explanations are omitted. To begin with, the wiring substrate 1 is prepared, a conductive layer 30 is formed in the periphery of the installation region 5 of the semiconductor element 15, and the solders 11 are formed on the electrode pads 4. As depicted in FIG. 14A, the conductive layer 30 may also be formed so that the installation region 5 of the semiconductor element 15 is enclosed by this conductive layer 30. For example, the conductive layer 30 is formed so that the installation region 5 of the semiconductor element 15 is enclosed by the conductive layer 30 in a way that prints the solder paste by use of the print mask, and the solders 11 are formed on the electrode pads 4. The conductive layer 30 is formed on a conductive layer pad 31, which is formed on the wiring substrate 1 so that the installation region 5 of the semiconductor element 15 is enclosed by this conductive layer pad 31. FIG. 14A is a top view of the wiring substrate 1 in the case of forming the conductive layer 30 so that the installation region 5 of the semiconductor element 15 is enclosed by the conductive layer 30 and forming the solders 11 on the electrode pads 4. FIG. 14B is a sectional view of the wiring substrate 1, which is taken along the alternate long and short dash line A-A in FIG. 14A. FIG. 14C is a sectional view of the wiring substrate 1, which is taken along the alternate long and short dash line B-B in FIG. 14A. As depicted in FIG. 14A, the conductive layer 30, which is formed so that the installation region 5 of the semiconductor element 15 is enclosed by the conductive layer 30, takes a ring shape.

Figure 15A:
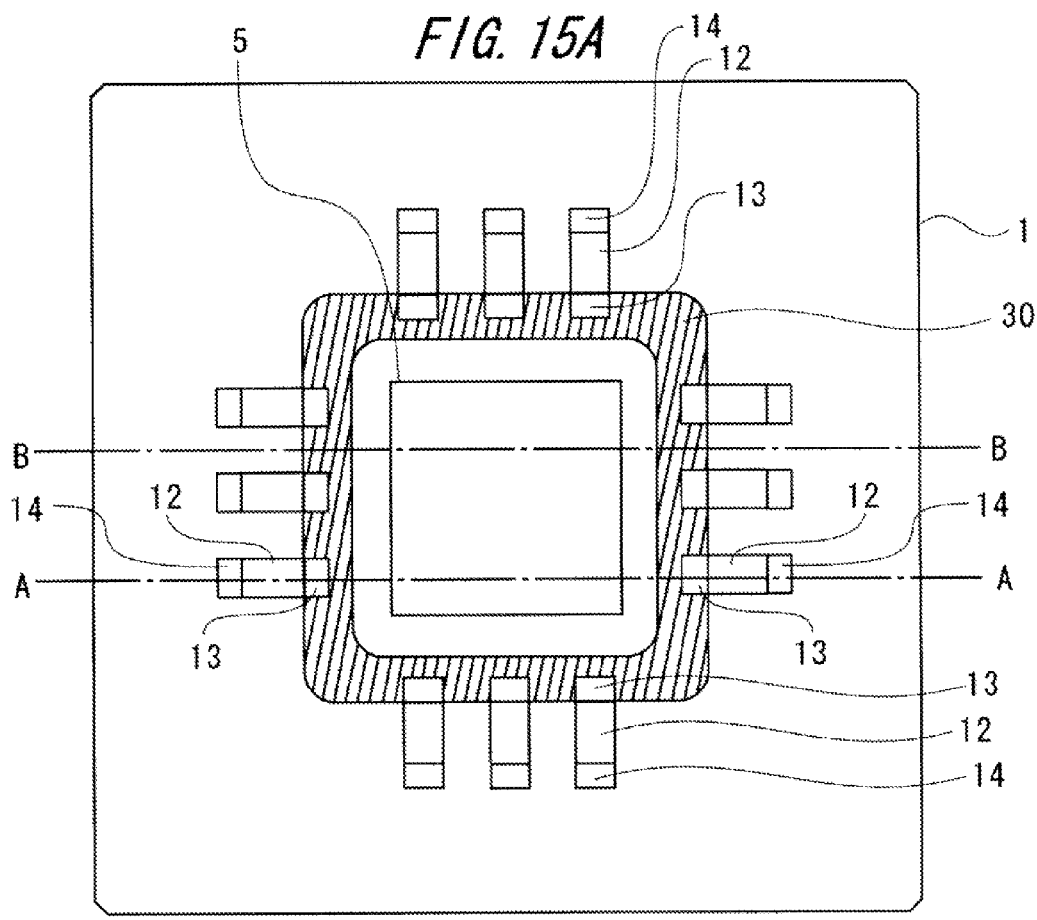
FIG. 15A is a top view of the wiring substrate 1 in the case of disposing the chip capacitors 12 on the wiring substrate 1.
Figure 15B:
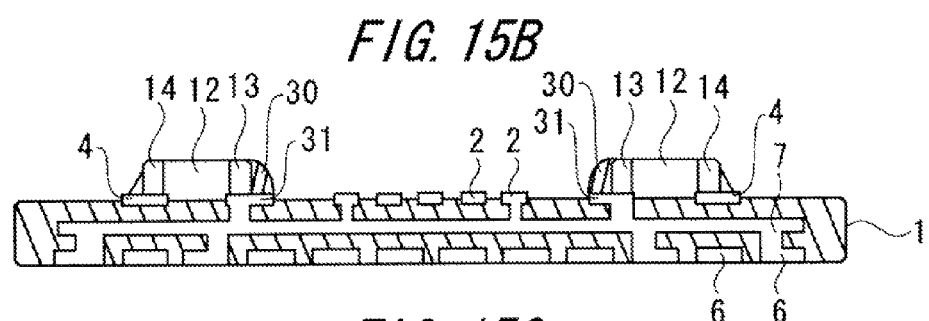
FIG. 15B is a sectional view of the wiring substrate 1, which is taken along the alternate long and short dash line A-A in FIG. 15A.
Figure 15C:
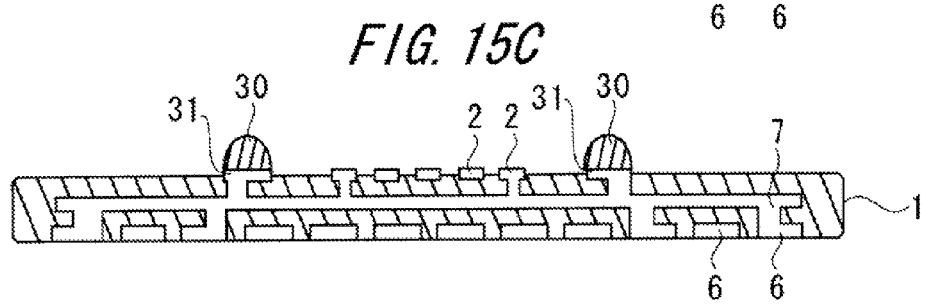
FIG. 15C is a sectional view of the wiring substrate 1, which is taken along the alternate long and short dash line B-B in FIG. 15A.

Then, as illustrated in FIGS. 15A, 15B and 15C, the plurality of chip capacitors 12 is disposed on the wiring substrate 1. The plurality of chip capacitors 12 is so disposed as to be spaced away from each other at the predetermined intervals. FIG. 15A is a top view of the wiring substrate 1 in the case of disposing the chip capacitors 12 on the wiring substrate 1. FIG. 15B is a sectional view of the wiring substrate 1, which is taken along the alternate long and short dash line A-A in FIG. 15A. FIG. 15C is a sectional view of the wiring substrate 1, which is taken along the alternate long and short dash line B-B in FIG. 15A. As depicted in FIG. 15, the chip capacitors 12 are disposed laterally on the wiring substrate 1 so that the terminal electrode 13 of the chip capacitor 12 is brought into contact with the conductive layer 30. Further, as illustrated in FIGS. 15A and 15B, the chip capacitors 12 are disposed on the wiring substrate 1 so that the terminal electrode 13 of the chip capacitor 12 is electrically connected to the conductive layer pad 31, while the terminal electrode 14 of the chip capacitor 12 is electrically connected to the electrode pad 4. As illustrated in FIGS. 15A and 15B, the chip capacitors 12 are disposed on the wiring substrate 1 so that the terminal electrodes 13 of the chip capacitors 12 are directed to the installation region 5 of the semiconductor element 15.

Subsequently, the wiring substrate 1 is conveyed to the heating furnace, in which the heating treatment is conducted. The heating treatment is executed, whereby the conductive layer 30 and the solder 11 get melted, and the conductive layer 30 is joined to the conductive layer pad 31 and the terminal electrode 13 of the chip capacitor 12, while the solder 11 is jointed to the electrode pad 4 and the terminal electrode 14 of the chip capacitor 12. Through this operation, the terminal electrode 13 of the chip capacitor 12 is joined to the conductive layer pad 31 via the conductive layer 30, and the terminal electrode 14 of the chip capacitor 12 is joined to the electrode pad 4 via the solder 11. The terminal electrode 13 of the chip capacitor 12 is joined to the conductive layer pad 31, and the terminal electrode 14 of the chip capacitor 12 is joined to the electrode pad 4, thereby installing (packaging) the chip capacitors 12 on the wiring substrate 1.

Next, as illustrated in FIG. 16, the semiconductor element 15 is installed on the wiring substrate 1. Namely, the semiconductor element 15 is packaged on the packaging surface of the wiring substrate 1. For instance, the semiconductor element 15 is disposed on the wiring substrate 1 in such a way that the surface of the semiconductor element 15 is directed to the wiring substrate 1. Then, the electrode pads 2 of the wiring substrate 1 are joined to the bumps 16 of the semiconductor element 15 by performing the heating treatment, thus installing the semiconductor element 15 on the wiring substrate 1. Subsequently, the metal film 17 is formed on the rear surface of the semiconductor element 15 by sputtering, which involves using, e.g., titanium (Ti) and gold (Au).

Figure 16A:
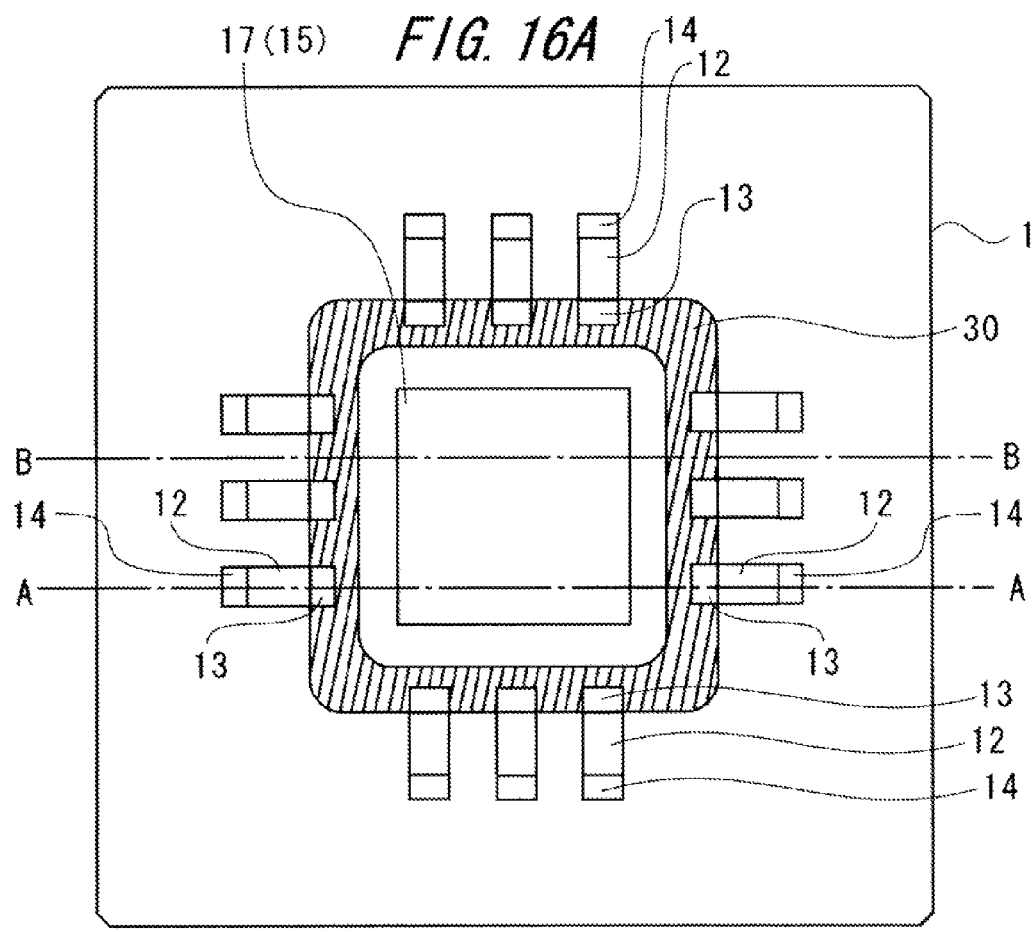
FIG. 16A is a top view of the semiconductor device in the case of installing the semiconductor element 15 on the wiring substrate 1.
Figure 16B:
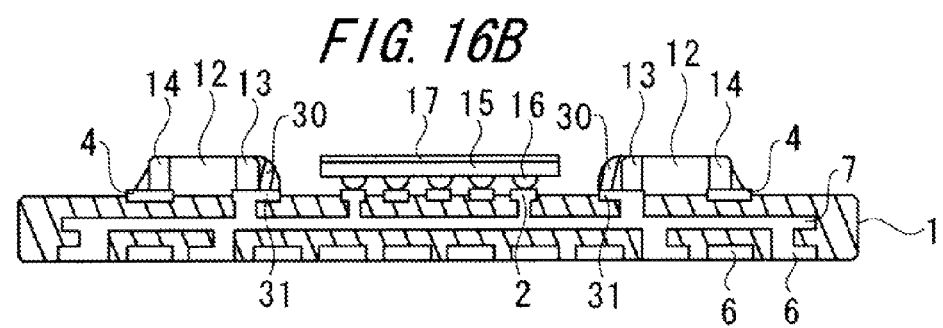
FIG. 16B is a sectional view of the semiconductor device, which is taken along the alternate long and short dash line A-A in FIG. 16A.
Figure 16C:
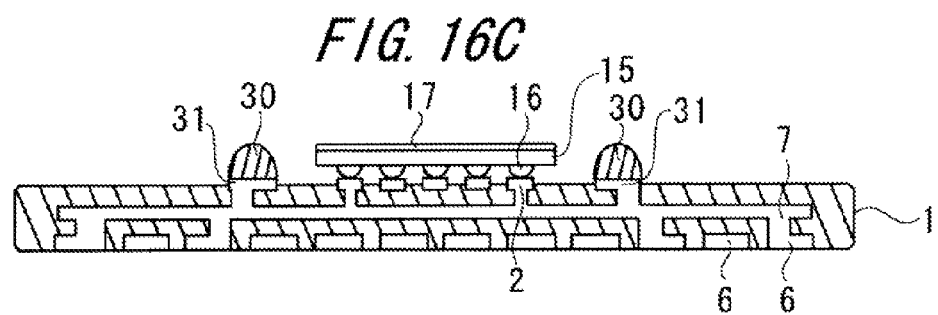
FIG. 16C is a sectional view of the wiring substrate 1, which is taken along the alternate long and short dash line B-B in FIG. 16A.

FIG. 16A is a top view of the semiconductor device in the case of installing the semiconductor element 15 on the wiring substrate 1. FIG. 16B is a sectional view of the semiconductor device, which is taken along the alternate long and short dash line A-A in FIG. 16A. FIG. 16C is a sectional view of the wiring substrate 1, which is taken along the alternate long and short dash line B-B in FIG. 16A. As depicted in FIGS. 16A, 16B and 16C, the semiconductor element 15 is installed on the wiring substrate 1 so that the packaging surface of the wiring substrate 1 faces the bumps 16 of the semiconductor element 15.

Then, as illustrated in FIGS. 17A, 17B and 17C, the underfill resin 18 is filled in between the wiring substrate 1 and the semiconductor element 15. FIG. 17A is a top view of the semiconductor device in the case where the underfill resin 18 is filled in between the wiring substrate 1 and the semiconductor element 15. FIG. 17B is a sectional view of the semiconductor device, which is taken along the alternate long and short dash line A-A in FIG. 17A. FIG. 17C is a sectional view of the wiring substrate 1, which is taken along the alternate long and short dash line B-B in FIG. 17A. The filling of the underfill resin 18 is conducted by supplying the underfill resin 18 over to the periphery of the semiconductor element 15 from, e.g., the dispenser.

Figure 17D:
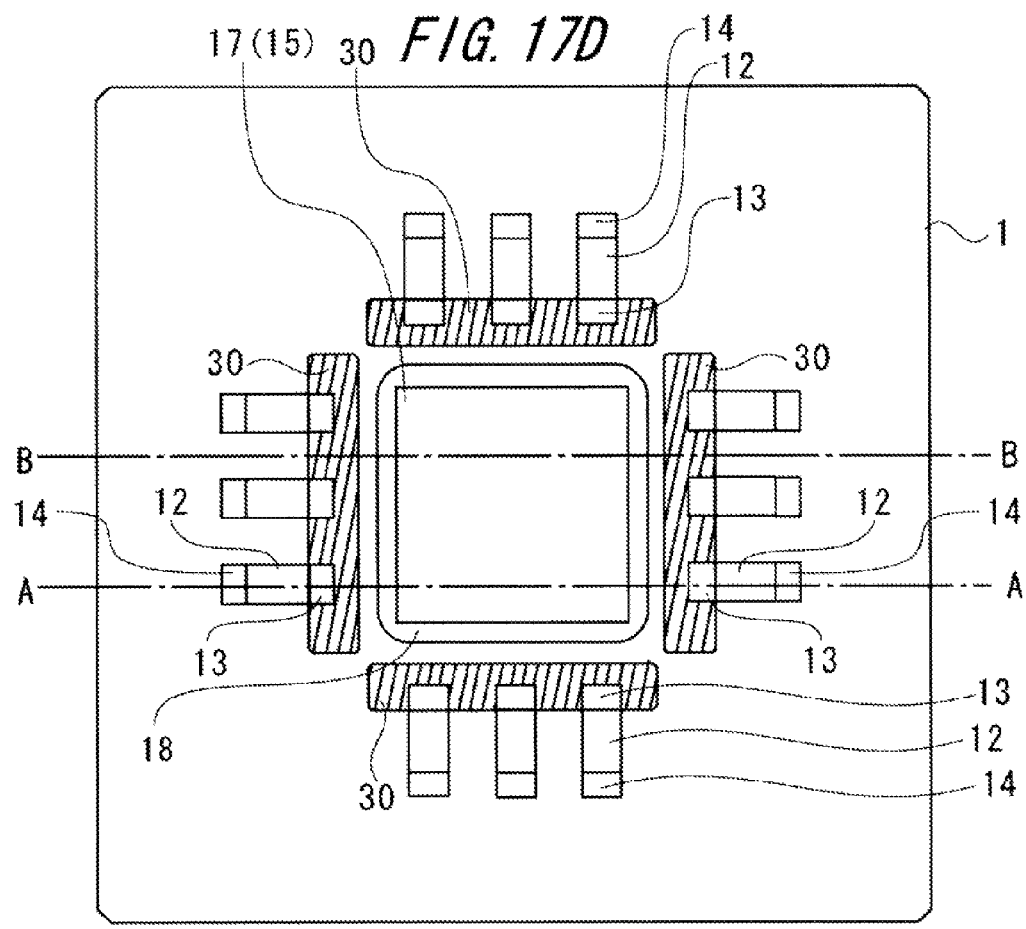
FIG. 17D is a top view of the wiring substrate 1 in the case of forming the plurality of conductive layers 30 along the periphery of the installation region 5 of the semiconductor element 15, forming the solders 11 on the electrode pads 4 and installing the chip capacitors 12 on the wiring substrate 1.
Figure 17E:
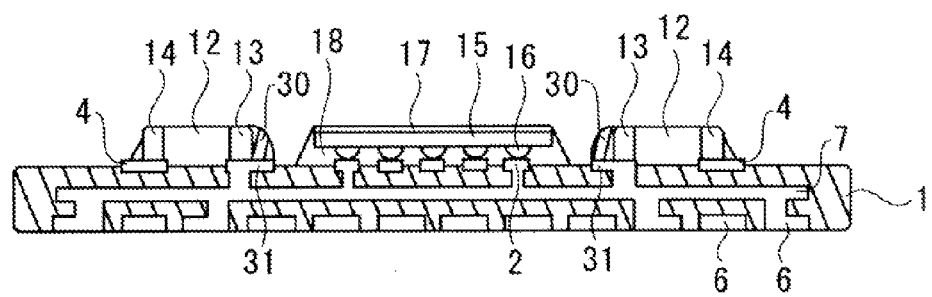
FIG. 17E is a sectional view of the wiring substrate 1, which is taken along the alternate long and short dash line A-A in FIG. 17D.
Figure 17F:
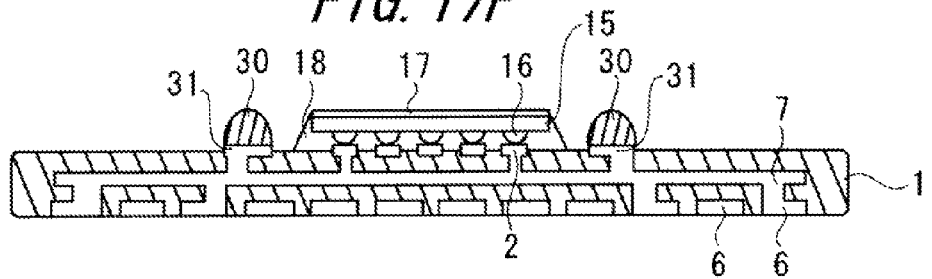
FIG. 17F is a sectional view of the wiring substrate 1, which is taken along the alternate long and short dash line B-B in FIG. 17D.

The second working example exemplifies the example of forming the conductive layer 30 so that the installation region 5 of the semiconductor element 15 is enclosed by this conductive layer 30, however, the conductive layer 30 is not limited to this shape but may take other shapes. For example, as depicted in FIG. 17D, a plurality of conductive layers 30 each taking a rectangular shape may be formed along the periphery of the installation region 5 of the semiconductor element 15. FIG. 17D is a top view of the wiring substrate 1 in the case of forming the plurality of conductive layers 30 along the periphery of the installation region 5 of the semiconductor element 15, forming the solders 11 on the electrode pads 4 and installing the chip capacitors 12 on the wiring substrate 1. FIG. 17E is a sectional view of the wiring substrate 1, which is taken along the alternate long and short dash line A-A in FIG. 17D. FIG. 17F is a sectional view of the wiring substrate 1, which is taken along the alternate long and short dash line B-B in FIG. 17D.

Figure 18A:
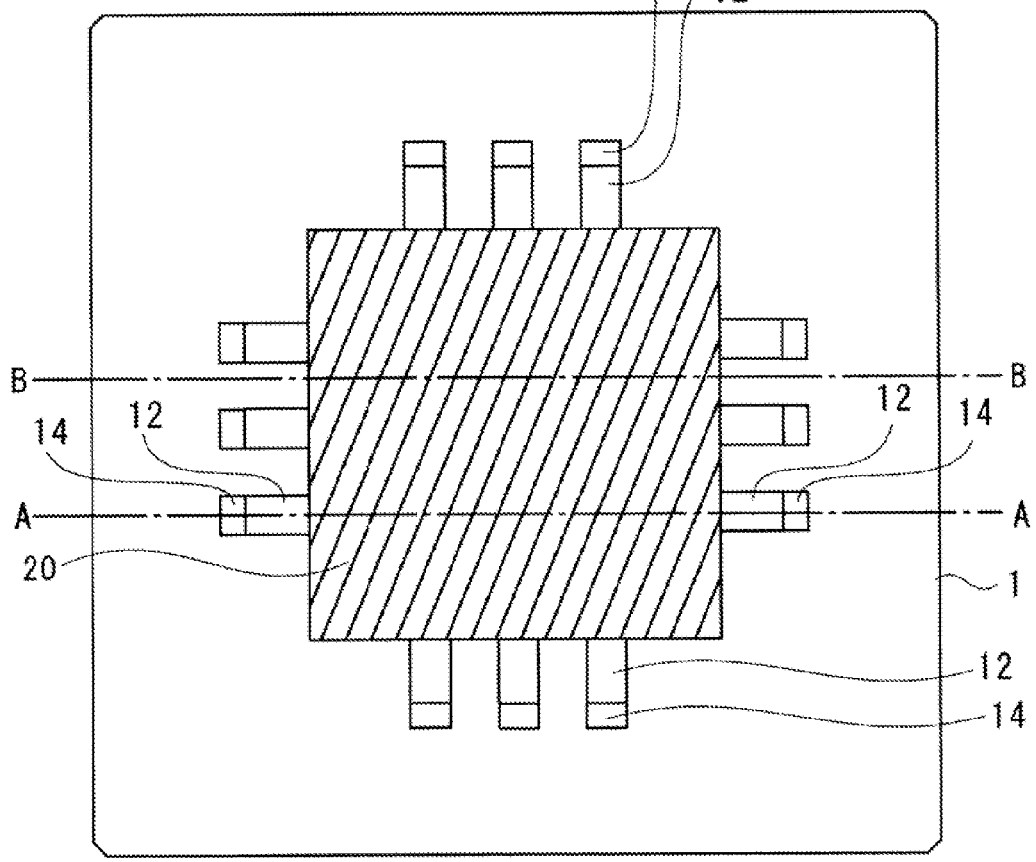
FIG. 18A is a top view of the semiconductor device in the case of disposing the conductive material 20 upwardly of the wiring substrate 1.
Figure 18B:
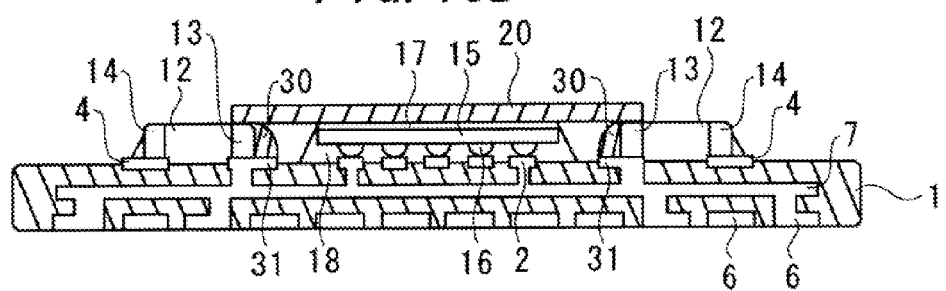
FIG. 18B is a sectional view of the semiconductor device, which is taken along the alternate long and short dash line A-A in FIG. 18A.
Figure 18C:
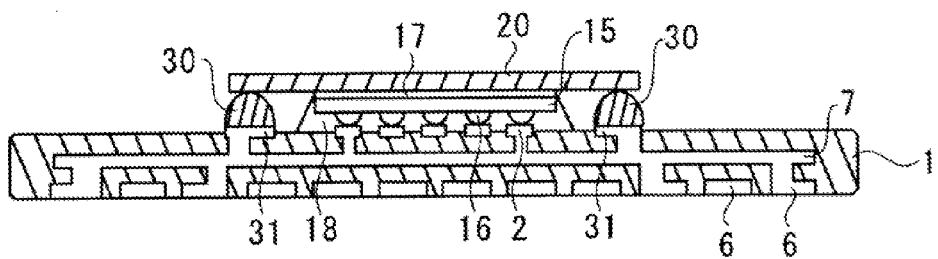
FIG. 18C is a sectional view of the wiring substrate 1, which is taken along the alternate long and short dash line B-B in FIG. 18A.

Subsequently, the wiring substrate 1 is conveyed to the heating furnace, in which the heating treatment is executed. The execution of the heating treatment hardens the underfill resin 18 existing between the wiring substrate 1 and the semiconductor element 15. Then, as illustrated in FIGS. 18A, 18B and 18C, the conductive material 20 is disposed upwardly of the wiring substrate 1. FIG. 18A is a top view of the semiconductor device in the case of disposing the conductive material 20 upwardly of the wiring substrate 1. FIG. 18B is a sectional view of the semiconductor device, which is taken along the alternate long and short dash line A-A in FIG. 18A. FIG. 18C is a sectional view of the wiring substrate 1, which is taken along the alternate long and short dash line B-B in FIG. 18A. The conductive material 20 covers the rear surface of the semiconductor element 15, and the terminal electrode 13 of the chip capacitor 12 is brought into contact with the conductive material 20, and the conductive material 20 abuts on the conductive layer 30. Namely, the central region of one surface of the conductive material 20 covers the rear surface of the semiconductor element 15, and the outer peripheral region surrounding the central region of one surface of the conductive material 20 is brought into contact with the terminal electrode 13 of the chip capacitor 12 and the conductive layer 30.

Figure 19A:
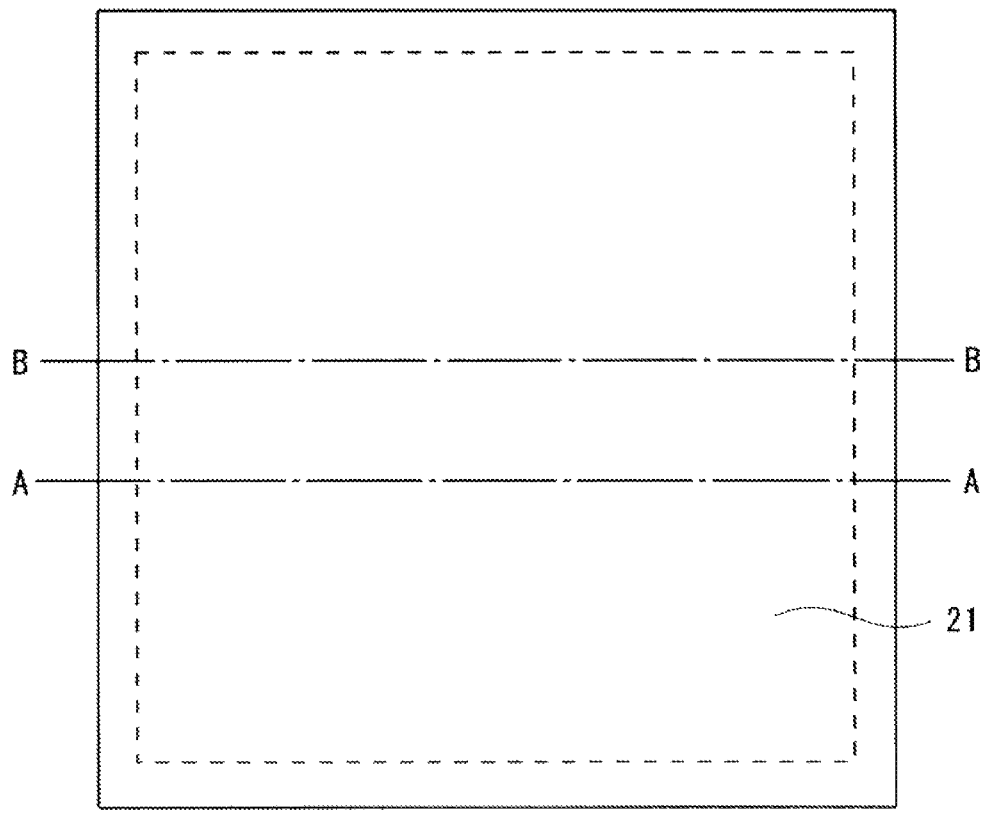
FIG. 19A is a top view of the semiconductor device in the case of boding the wiring substrate 1 and the heat radiation plate 21 together via the bonding agent 24 and bringing the conductive material 20 into contact with the central region of the recessed portion 22 of the heat radiation plate 21.
Figure 19B:
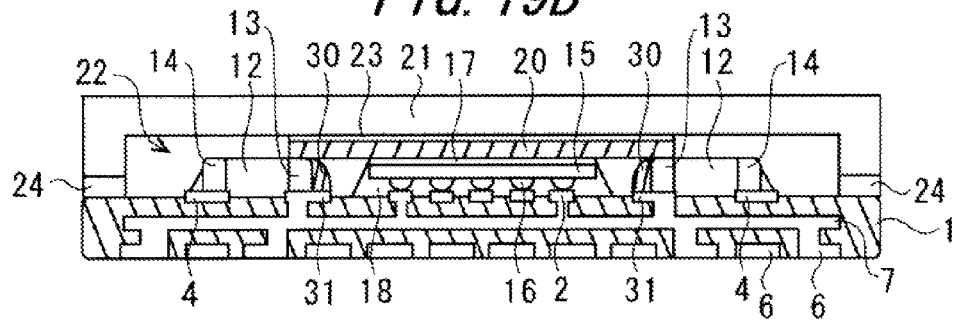
FIG. 19B is a sectional view of the semiconductor device, which is taken along the alternate long and short dash line A-A in FIG. 19A.
Figure 19C:
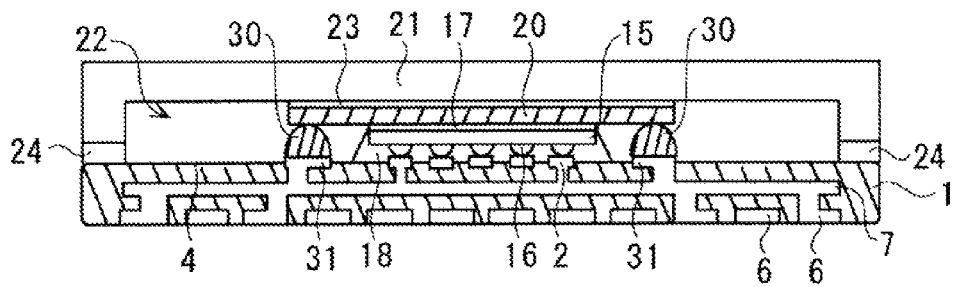
FIG. 19C is a sectional view of the wiring substrate 1, which is taken along the alternate long and short dash line B-B in FIG. 19A.

Subsequently, the heat radiation plate 21 is disposed upwardly of the wiring substrate 1, and the wiring substrate 1 and the heat radiation plate 21 are aligned with each other. Then, as illustrated in FIGS. 19A, 19B and 19C, the wiring substrate 1 is bonded to the heat radiation plate 21 via the bonding agent 24, thus bringing the conductive material 20 into contact with the central region of the recessed portion 22 of the heat radiation plate 21. FIG. 19A is a top view of the semiconductor device in the case of boding the wiring substrate 1 and the heat radiation plate 21 together via the bonding agent 24 and bringing the conductive material 20 into contact with the central region of the recessed portion 22 of the heat radiation plate 21. FIG. 19B is a sectional view of the semiconductor device, which is taken along the alternate long and short dash line A-A in FIG. 19A. FIG. 19C is a sectional view of the wiring substrate 1, which is taken along the alternate long and short dash line B-B in FIG. 19A.

Then, the semiconductor device is conveyed to the heating furnace, in which the heating treatment is conducted. The heating treatment is executed, whereby the conductive material 20 gets melted, the terminal electrode 13 of the chip capacitor 12 is joined to the conductive material 20, then the rear surface of the semiconductor element 15 is joined to the conductive material 20, further the conductive material 20 is joined to the heat radiation plate 21, and the conductive material 20 is joined to the conductive layer 30. The rear surface of the semiconductor element 15 is joined to the conductive material 20, thereby installing the conductive material 20 on the semiconductor element 15. The conductive material 20 and the heat radiation plate 21 are joined together, whereby the heat radiation plate 21 is installed on the conductive material 20.

Figure 20A:
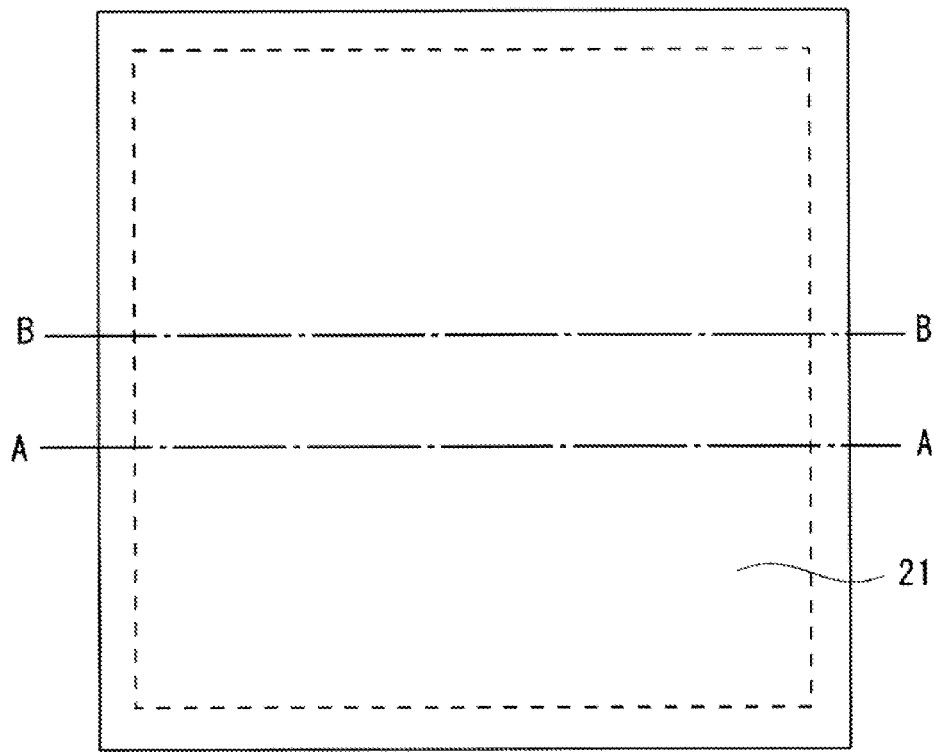
FIG. 20A is a top view of the semiconductor device in the case of joining the soldering balls 26 onto the electrode pads 6 of the wiring substrate 1.
Figure 20B:
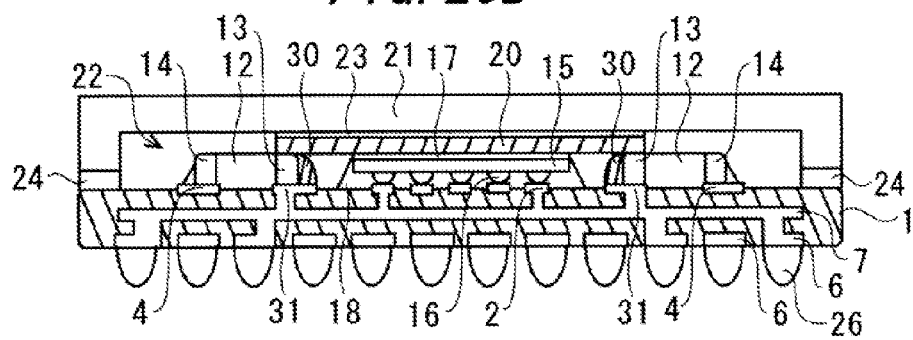
FIG. 20B is a sectional view of the semiconductor device, which is taken along the alternate long and short dash line A-A in FIG. 20A.
Figure 20C:
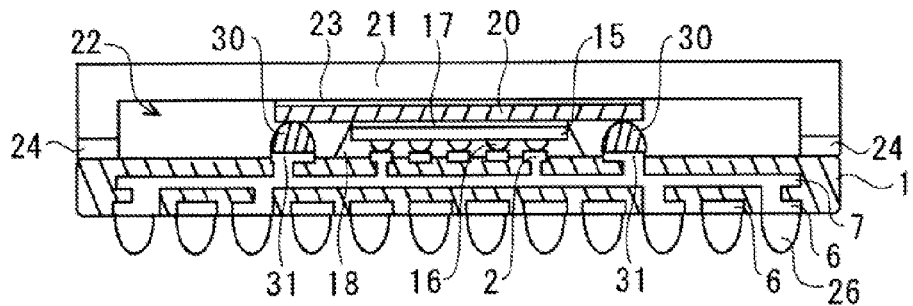
FIG. 20C is a sectional view of the wiring substrate 1, which is taken along the alternate long and short dash line B-B in FIG. 20A.

Subsequently, the flux is applied onto the electrode pad 6 of the wiring substrate 1 by use of the mask. Next, the soldering balls 26 are disposed on the electrode pads 6 of the wiring substrate 1, and the semiconductor device is conveyed to the heating furnace, in which the heating treatment is conducted. The heating treatment is carried out, whereby the soldering balls 26 are, as illustrated in FIGS. 20B and 20C, joined onto the electrode pads 6 of the wiring substrate 1. FIG. 20A is a top view of the semiconductor device in the case of joining the soldering balls 26 onto the electrode pads 6 of the wiring substrate 1. FIG. 20B is a sectional view of the semiconductor device, which is taken along the alternate long and short dash line A-A in FIG. 20A. FIG. 20C is a sectional view of the wiring substrate 1, which is taken along the alternate long and short dash line B-B in FIG. 20A.

The terminal electrode 13 of the chip capacitor 12 is electrically connected to the electrode pad 3 connecting with the ground wire 7, and the ground voltage is supplied to the terminal electrode 13 of the chip capacitor 12 via the ground wire 7. The terminal electrode 13 of the chip capacitor 12 is joined to the conductive material 20, and therefore the terminal electrode 13 of the chip capacitor 12 is electrically connected to the conductive material 20. The terminal electrode 13 of the chip capacitor 12 is joined to the conductive layer 30, and hence the terminal electrode 13 of the chip capacitor 12 is electrically connected to the conductive layer 30. As a result, the terminal electrode 13 of the chip capacitor 12, the conductive material 20 and the conductive layer 30 come to ground potential, and the periphery of the semiconductor element 15 is electromagnetically shielded. The terminal electrode 13 of the chip capacitor 12 and the conductive layer 30 function as the shield members which electromagnetically shield the portion along the side surface of the semiconductor element 15 and function also as the connecting members which connect the wiring substrate 1 to the conductive material 20. Note that the ground wire 7 is provided over the entire downward surface of the semiconductor element 15, whereby the whole downward portion of the semiconductor element 15 may be electromagnetically shielded.

Third Working Example

The semiconductor device and the manufacturing method thereof according to a third working example will hereinafter be described. Note that the same components as those in the first and second working examples are marked with the same reference numerals as those in the first and second working examples, and their explanations are omitted. The semiconductor device and the manufacturing method thereof according to the third working example are the same as those in the first working example till the heating treatment is carried out after executing the process explained with reference to FIGS. 5A and 5B in the first working example, and hence the description till the heating treatment is omitted.

Figure 21A:
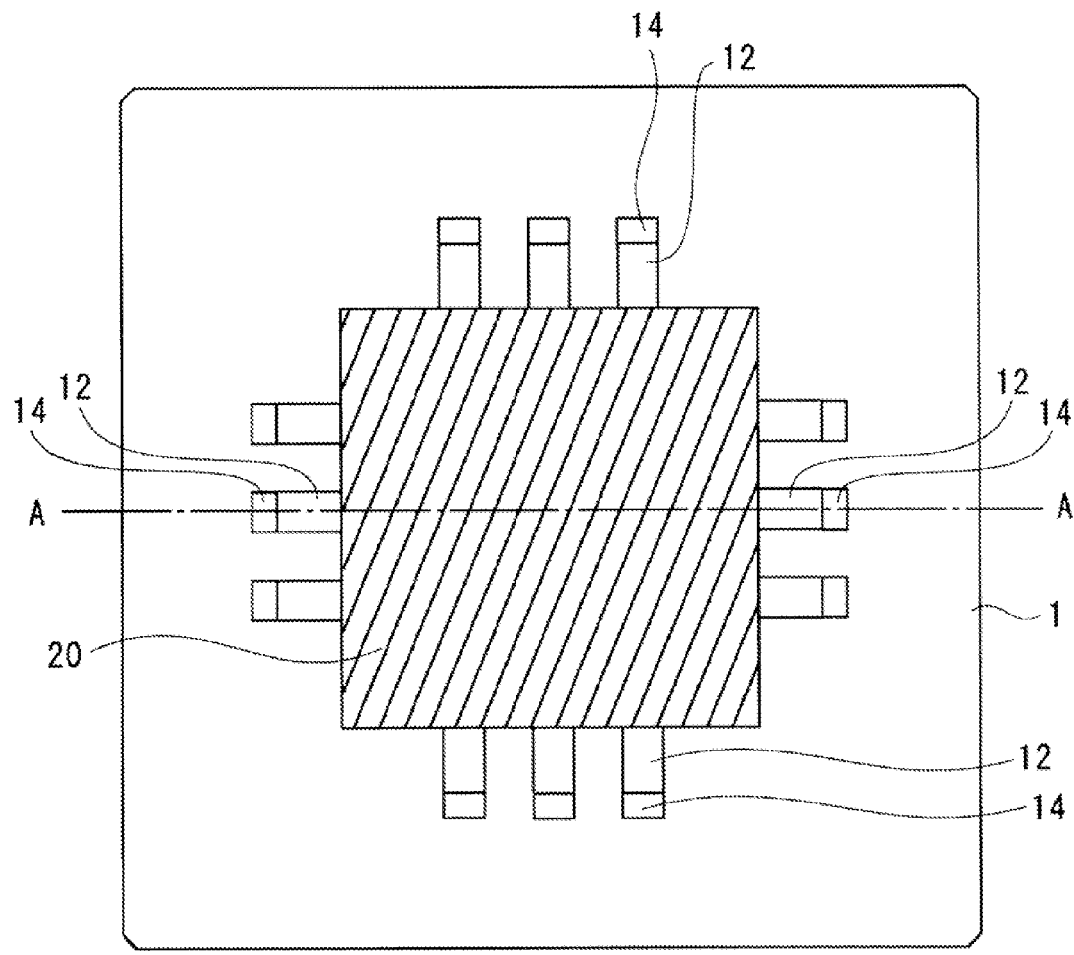
FIG. 21A is a top view of the semiconductor device in the case of installing the conductive material 20 upwardly of the wiring substrate 1.
Figure 21B:
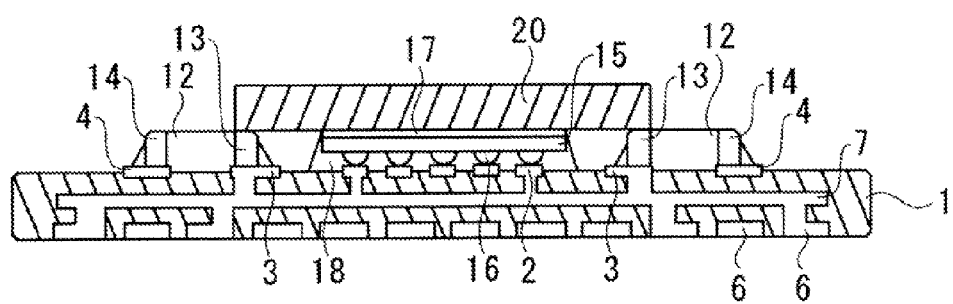
FIG. 21B is a sectional view of the semiconductor device, which is taken along the alternate long and short dash line A-A in FIG. 21A.

In the semiconductor device and the manufacturing method thereof according to the third working example, after executing the heating treatment, as illustrated in FIGS. 21A and 21B, the conductive material 20 is installed upwardly of the wiring substrate 1. FIG. 21A is a top view of the semiconductor device in the case of installing the conductive material 20 upwardly of the wiring substrate 1. FIG. 21B is a sectional view of the semiconductor device, which is taken along the alternate long and short dash line A-A in FIG. 21A. The conductive material 20 covers the rear surface of the semiconductor element 15, and the conductive material 20 is brought into contact with the terminal electrode 13 of the chip capacitor 12. Namely, the central region of one surface of the conductive material 20 covers the rear surface of the semiconductor element 15, and a part of the outer peripheral region surrounding the central region of one surface of the conductive material 20 is brought into contact with the terminal electrode 13 of the chip capacitor 12.

The thickness of the chip capacitor 12 is, e.g., 0.600 mm, and the thickness of the solder formed on each of the electrode pad 3 and the electrode pad 4 is, e.g., 0.010 mm. Hence, the packaging height of the chip capacitor 12 is 0.610 mm. The thickness of the semiconductor element 15 is, e.g. 0.550 mm, and the height of the bump 16 of the semiconductor element 15 is, e.g., 0.060 mm. Hence, the packaging height of the semiconductor element 15 is 0.610 mm. The packaging height of the chip capacitor 12 is coincident with the packaging height of the semiconductor element 15. A thickness of the conductive material 20 is, e.g., 0.660 mm.

Figure 22A:
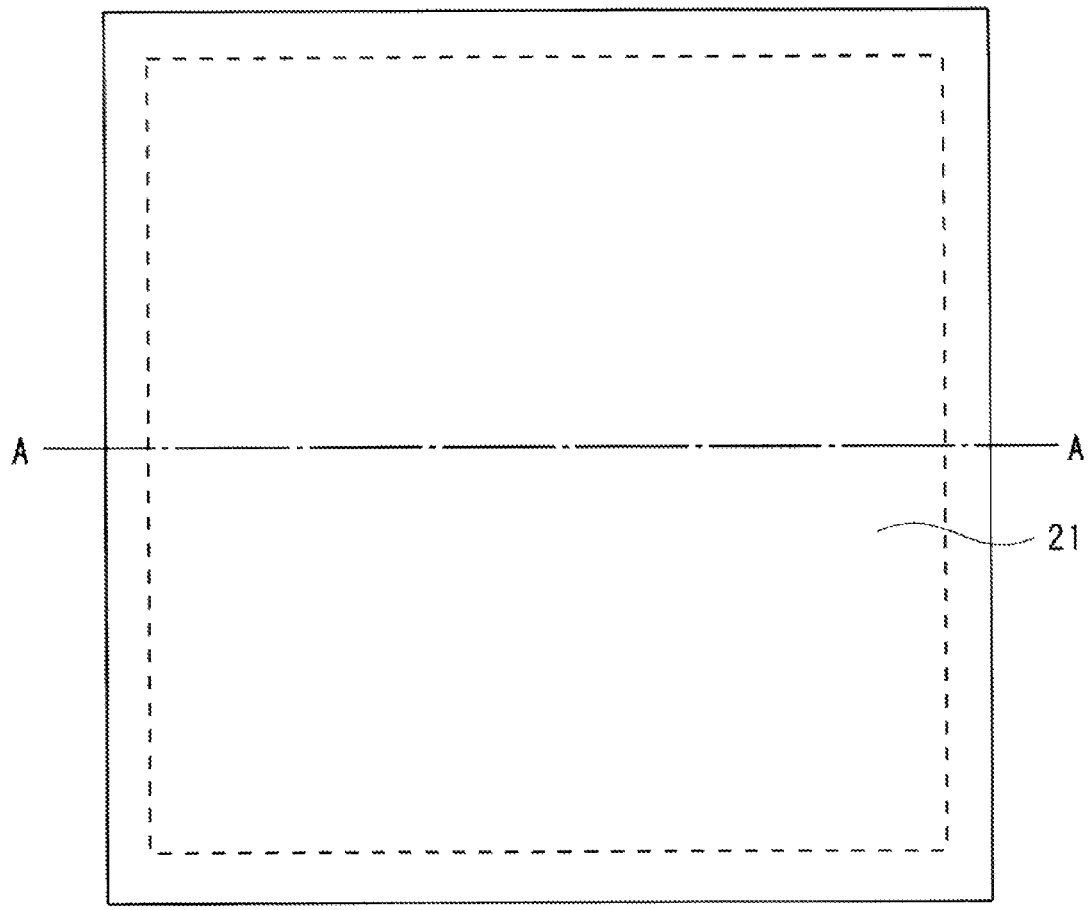
FIG. 22A is a top view of the semiconductor device in the case of installing the heat radiation plate 21 upwardly of the wiring substrate 1.
Figure 22B:
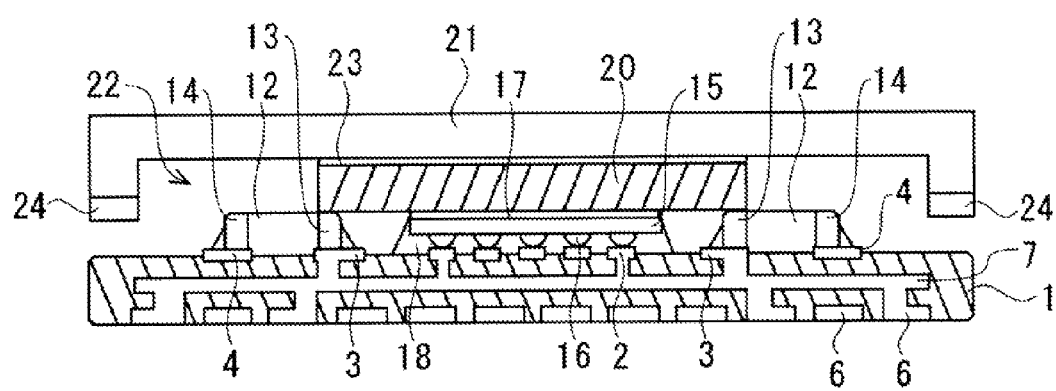
FIG. 22B is a sectional view of the semiconductor device, which is taken along the alternate long and short dash line A-A in FIG. 22A.

Subsequently, the heat radiation plate 21 is disposed upwardly of the wiring substrate 1, then the wiring substrate 1 and the heat radiation plate 21 are aligned with each other, and, as depicted in FIGS. 22A and 22B, the conductive material 20 is brought into contact with the central region of the recessed portion 22 of the heat radiation plate 21. FIG. 22A is a top view of the semiconductor device in the case of installing the heat radiation plate 21 upwardly of the wiring substrate 1. FIG. 22B is a sectional view of the semiconductor device, which is taken along the alternate long and short dash line A-A in FIG. 22A.

Figure 23A:
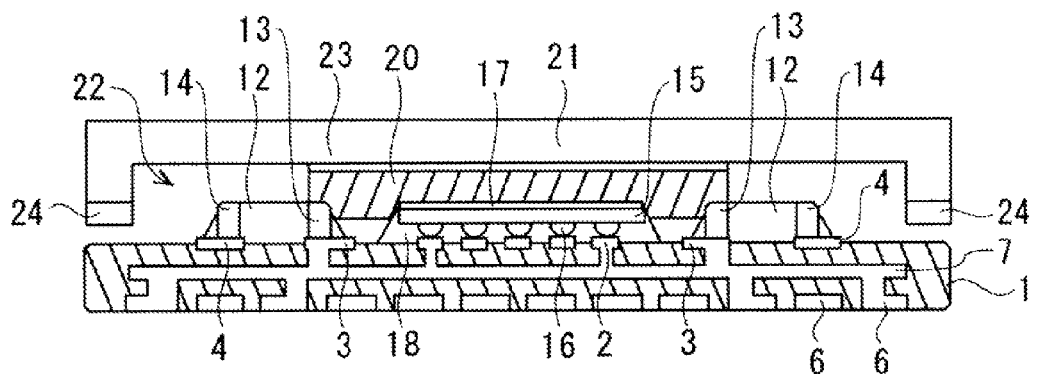
FIG. 23A is a sectional view of the semiconductor device in the case where the conductive material 20 wet-spreads over between the chip capacitor 12 and the semiconductor element 15.

Then, the semiconductor device is conveyed to the heating furnace, in which the heating treatment is executed. The heating treatment is carried out, whereby the conductive material 20 gets melted and then wet-spreads over between the chip capacitor 12 and the semiconductor element 15. Further, on the occasion of performing the heating treatment, the load is applied to the heat radiation plate 21, whereby the conductive material 20 may wet-spread over between the chip capacitor 12 and the semiconductor element 15. FIG. 23A is a sectional view of the semiconductor device in the case where the conductive material 20 wet-spreads over between the chip capacitor 12 and the semiconductor element 15.

Figure 23B:
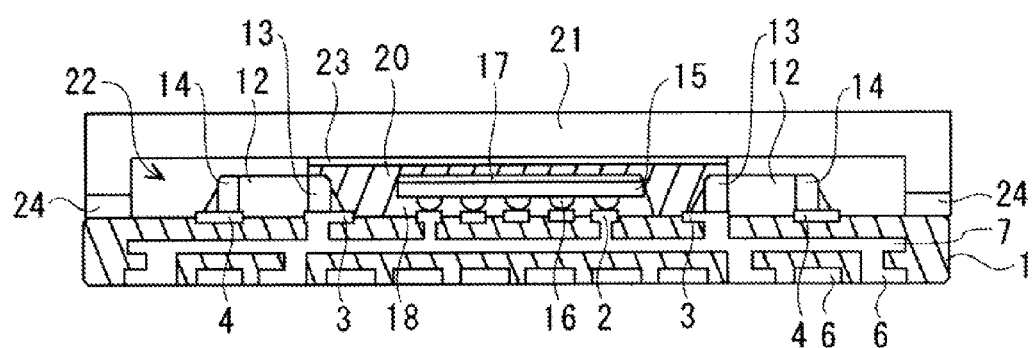
FIG. 23B is a sectional view of the semiconductor device in the case where the conductive material 20 wet-spreads up to the packaging surface of the wiring substrate 1.

The conductive material 20, which wet-spreads over between the chip capacitor 12 and the semiconductor element 15, transfers along the side surface of the terminal electrode 13 of the chip capacitor 12 as well as along the side surface of the semiconductor element 15, with the result that the conductive material 20, as depicted in FIG. 23B, wet-spreads up to the packaging surface of the wiring substrate 1. FIG. 23B is a sectional view of the semiconductor device in the case where the conductive material 20 wet-spreads up to the packaging surface of the wiring substrate 1. The conductive material 20 wet-spreads up to the packaging surface of the wiring substrate 1, with the result that the conductive material 20 exists in between the chip capacitor 12 and the semiconductor element 15. Accordingly, the central region of one surface of the conductive material 20 covers the rear surface of the semiconductor element 15, the peripheral region surrounding the central region of one surface of the conductive material 20 covers the side surface of the semiconductor element 15, and a part of the peripheral region surrounding the central region of one surface of the conductive material 20 abuts on the terminal electrode 13 of the chip capacitor 12.

The conductive material 20 wet-spreads up to the packaging surface of the wiring substrate 1, whereby the wiring substrate 1 and the heat radiation plate 21 are, as illustrated in FIG. 23B, bonded together via the bonding agent 24. Further, on the occasion of performing the heating treatment, the bonding agent 24 may be brought into contact with the wiring substrate 1 by applying the load to the heat radiation plate 21. Note that a thickness, a volume and a size of the pre-melting conductive material 20 may be designed based on calculations, experiments, simulations, etc so that the post-melting conductive material 20 covers the side surface of the semiconductor element 15.

Figure 24A:
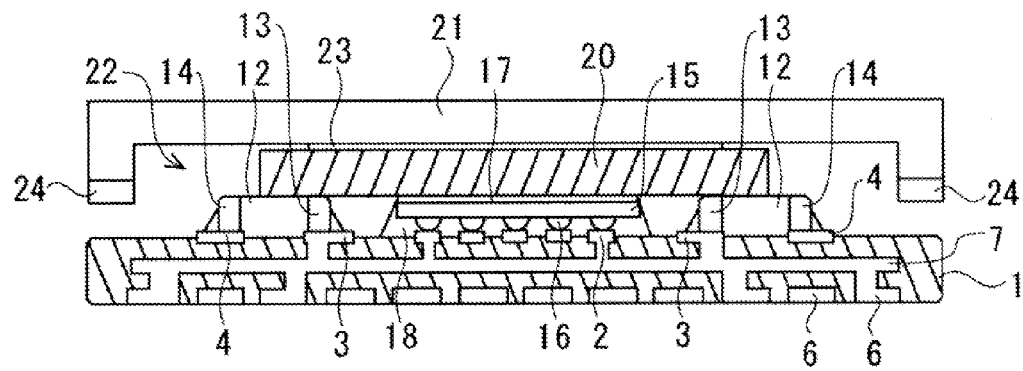
FIG. 24A is a sectional view of the semiconductor device in the case where quantity of the conductive material 20 is larger than a predetermined quantity.
Figure 24B:
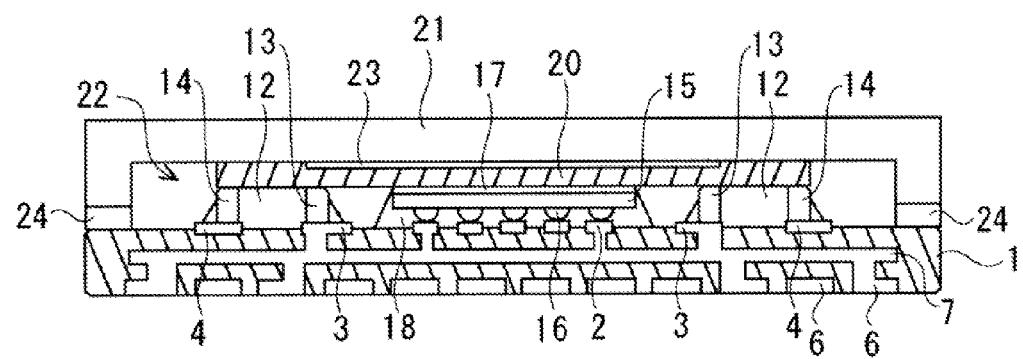
FIG. 24B is a sectional view of the semiconductor device in the case where the terminal electrode 13 of the chip capacitor 12 is electrically connected to the terminal electrode 14 via the conductive material 20.

The conductive material 20 is the solder paste or the solder pellet, in which case if dispersion in quantity of the solder is large or if the load on the heat radiation plate 21 is large, the conductive material 20 excessively spreads as the case may be. If the conductive material 20 excessively spreads, such a possibility exists that the terminal electrode 13 of the chip capacitor 12 and the terminal electrode 14 get short-circuited due to the conductive material 20. For instance, as illustrated in FIG. 24A, if the quantity of the conductive material 20 is larger than a predetermined quantity and when the wiring substrate 1 is bonded to the heat radiation plate 21, as illustrated in FIG. 24B, the terminal electrode 13 of the chip capacitor 12 is electrically connected to the terminal electrode 14 via the conductive material 20. FIG. 24A is a sectional view of the semiconductor device in the case where the quantity of the conductive material 20 is larger than the predetermined quantity. FIG. 24B is a sectional view of the semiconductor device in the case where the terminal electrode 13 of the chip capacitor 12 is electrically connected to the terminal electrode 14 via the conductive material 20. Fourth through tenth, twelfth and fourteenth working examples will discuss a method of inhibiting the terminal electrode 13 of the chip capacitor 12 from being electrically connected to the terminal electrode 14 thereof.

Fourth Working Example

Figure 25A:
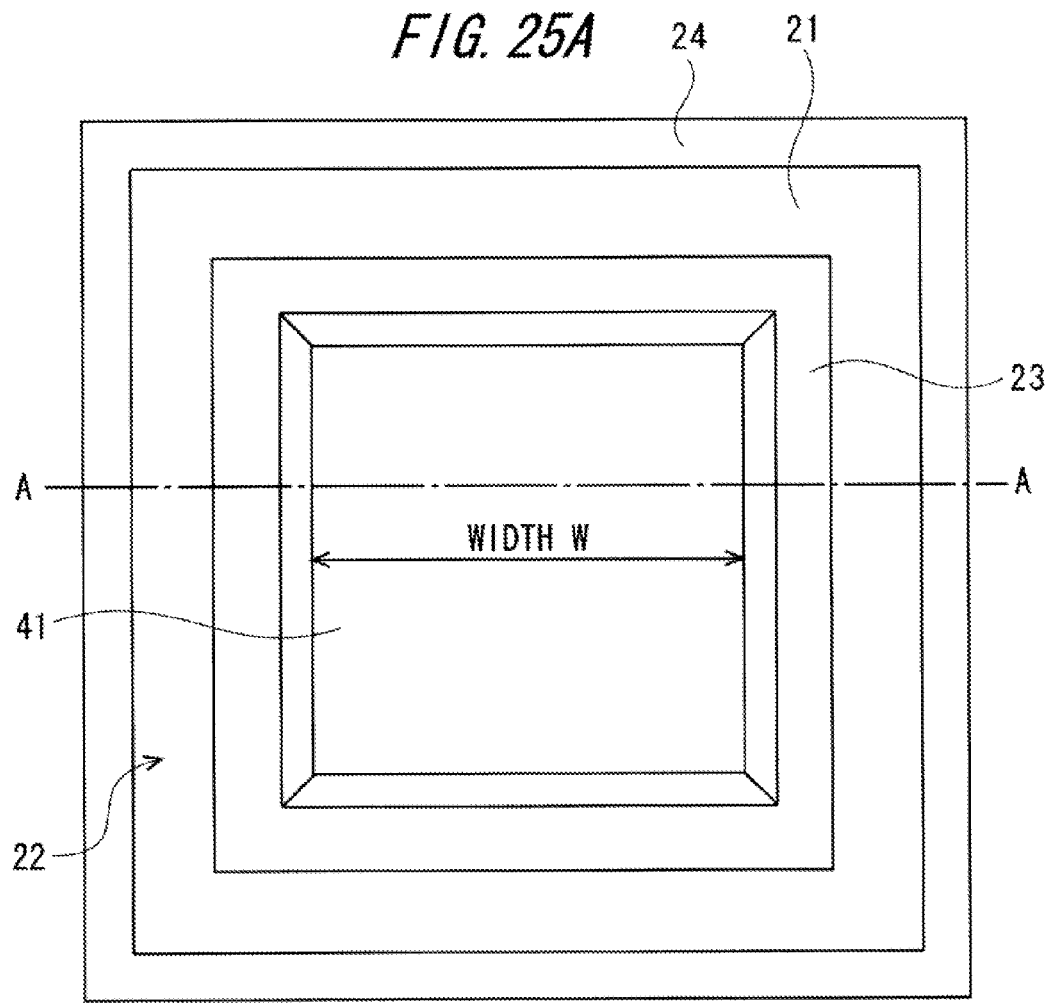
FIG. 25A is a bottom view of the heat radiation plate 21 formed with a protruded surface 41 in the central region of the recessed portion 22 of the heat radiation plate 21.
Figure 25B:
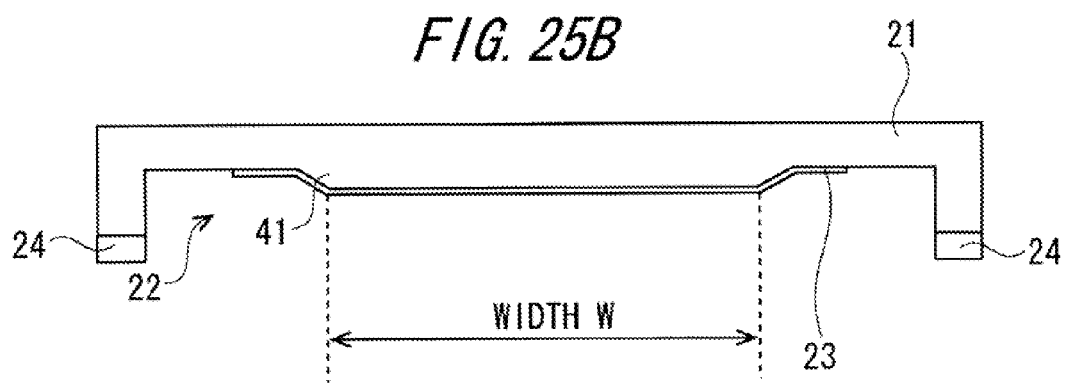
FIG. 25B is a sectional view of the heat radiation plate 21, which is taken along the alternate long and short dash line A-A in FIG. 25A.

The semiconductor device and the manufacturing method thereof according to a fourth working example will hereinafter be described. Note that the same components as those in the first through third working examples are marked with the same reference numerals as those in the first through third working examples, and their explanations are omitted. In the semiconductor device and the manufacturing method thereof according to the fourth working example, a protruded surface 41 is formed in the central region of the recessed portion 22 of the heat radiation plate 21, thereby inhibiting the electrical connection between the terminal electrode 13 and the terminal electrode 14 of the chip capacitor 12. FIG. 25A is a bottom view of the heat radiation plate 21 formed with the protruded surface 41 in the central region of the recessed portion 22 of the heat radiation plate 21. FIG. 25B is a sectional view of the heat radiation plate 21, which is taken along the alternate long and short dash line A-A in FIG. 25A. As illustrated in FIG. 25B, the protruded surface 41 of the heat radiation plate 21 is formed in a trapezoidal shape but may, without being limited to this shape, take other shapes such as a rectangular shape and a semispherical shape. The protruded surface 41 is given as one example of an inhibiting portion.

Figure 26A:
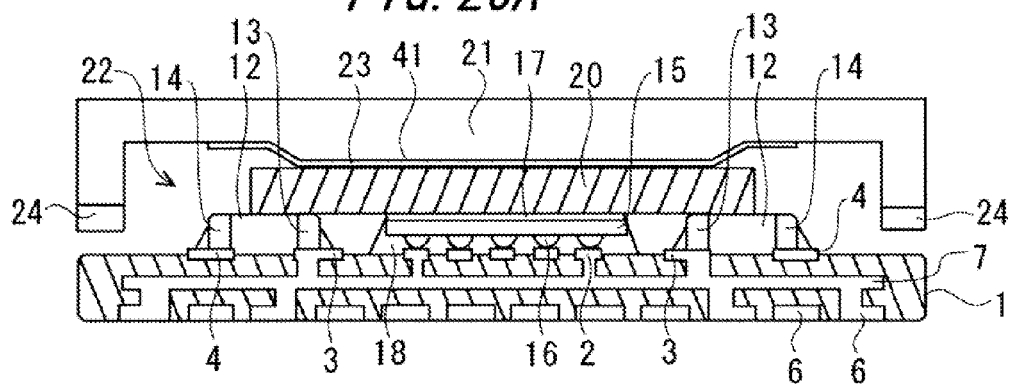
FIG. 26A is a sectional view of the semiconductor device in the case of disposing, upwardly of the wiring substrate 1, the heat radiation plate 21 formed with the protruded surface 41 in the central region of the recessed portion 22 of the heat radiation plate 21.
Figure 26B:
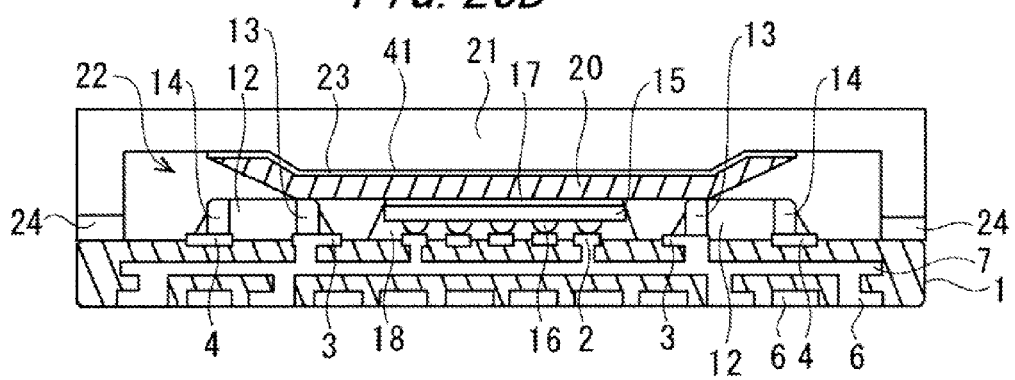
FIG. 26B is a sectional view of the semiconductor device in the case of bonding the wiring substrate 1 to the heat radiation plate 21 formed with the protruded surface 41 in the central region of the recessed portion 22 of the heat radiation plate 21.
Figure 26C:
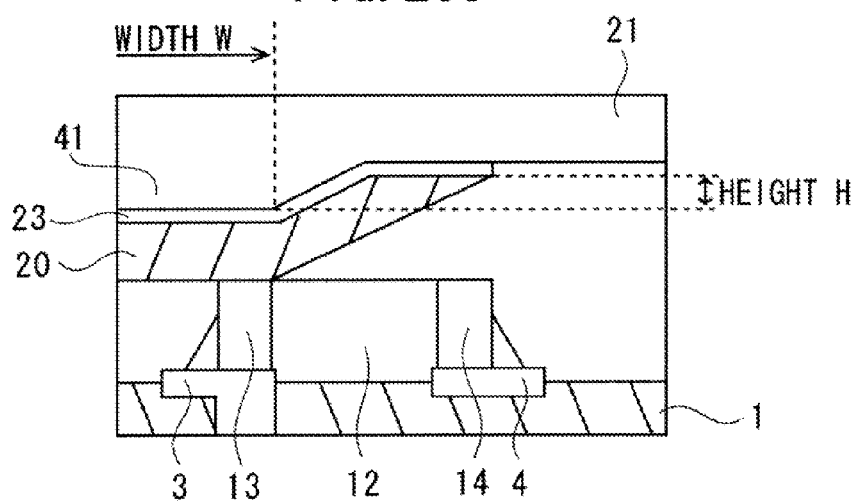
FIG. 26C is a partial enlarged view of the semiconductor device in the case of bonding the wiring substrate 1 to the heat radiation plate 21 formed with the protruded surface 41 in the central region of the recessed portion 22 of the heat radiation plate 21.

The protruded surface 41 is formed in the central region of the recessed portion 22 of the heat radiation plate 21, whereby even when the conductive material 20 spreads, as illustrated in FIG. 26, the conductive material 20 flows into the recessed portion 22 of the heat radiation plate 21, and hence the terminal electrode 13 of the chip capacitor 12 is inhibited from being electrically connected to the terminal electrode 14 thereof. FIG. 26A is a sectional view of the semiconductor device in the case of disposing, upwardly of the wiring substrate 1, the heat radiation plate 21 formed with the protruded surface 41 in the central region of the recessed portion 22 of the heat radiation plate 21. FIG. 26B is a sectional view of the semiconductor device in the case of bonding the wiring substrate 1 to the heat radiation plate 21 formed with the protruded surface 41 in the central region of the recessed portion 22 of the heat radiation plate 21. FIG. 26C is a partial enlarged view of the semiconductor device in the case of bonding the wiring substrate 1 to the heat radiation plate 21 formed with the protruded surface 41 in the central region of the recessed portion 22 of the heat radiation plate 21.

In the case of bonding the wiring substrate 1 to the heat radiation plate 21, a width W of the protruded surface 41 of the heat radiation plate 21 is set so that the terminal electrode 13 of the chip capacitor 12 is bonded to the conductive material 20. For example, in the case of bonding the wiring substrate 1 and the heat radiation plate 21 together, the width W of the protruded surface 41 of the heat radiation plate 21 may also be set so that an edge portion of the protruded surface 41 of the heat radiation plate 21 is disposed upwardly of the terminal electrode 13 of the chip capacitor 12. Further, the spread of the conductive material 20 changes depending on the thickness of the conductive material 20 and the load on the heat radiation plate 21, and therefore a height H of the protruded surface 41 of the heat radiation plate 21 may be determined based on the calculations, the experiments or the simulations and the like.

Moreover, on the occasion of the melting the conductive material 20, the heating treatment may be executed so that the heat radiation plate 21 is positioned downwardly of the wiring substrate 1. Namely, the heating treatment may be carried out on the occasion of melting the conductive material 20 by directing the packaging surface of the wiring substrate 1 downward (in the direction of gravity) and directing the protruded surface 41 of the heat radiation plate 21 upward (in the direction opposite to the direction of gravity). The heating treatment is conducted on the occasion of melting the conductive material 20 by directing the protruded surface 41 of the heat radiation plate 21 upward (in the direction opposite to the direction of gravity), thereby facilitating a flow of the conductive material 20 into the recessed portion 22 of the heat radiation plate 21.

Fifth Working Example

Figure 27A:
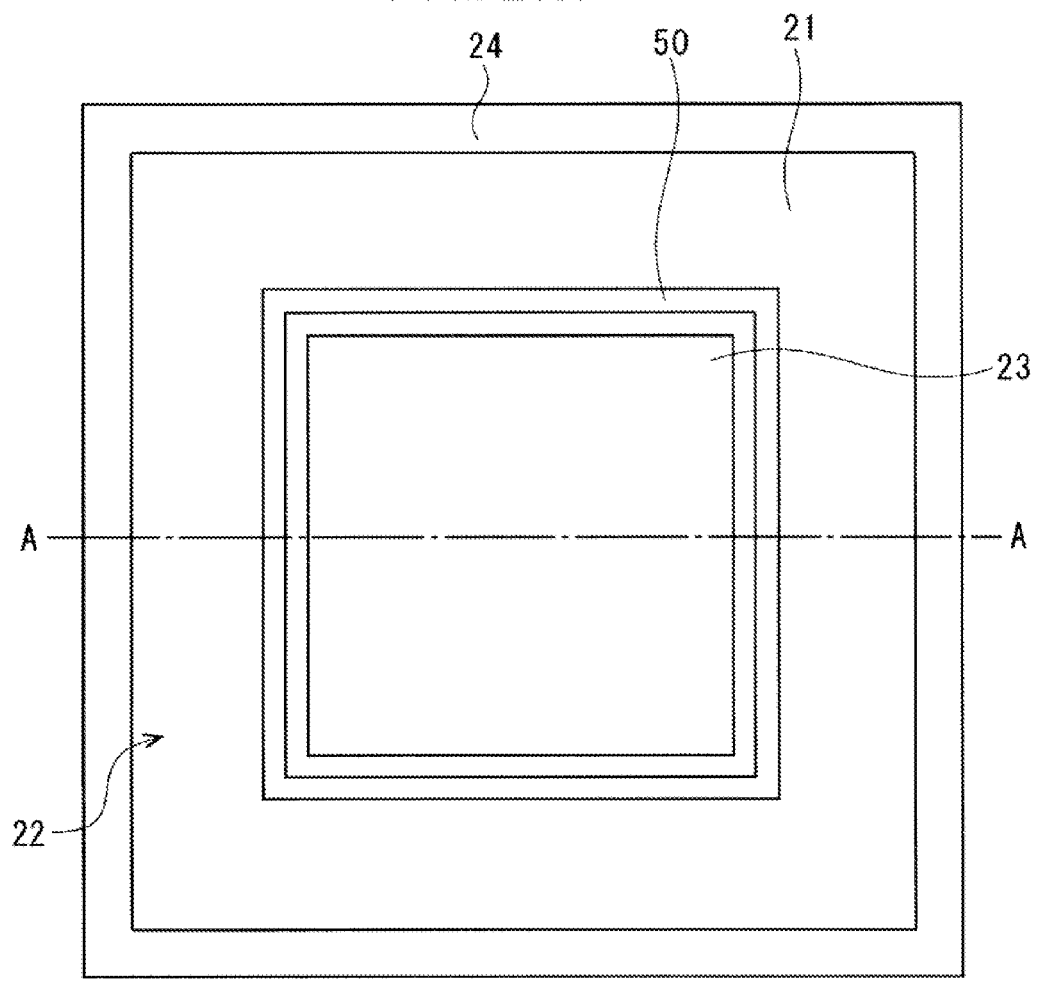
FIG. 27A is a bottom view of the heat radiation plate 21 in the case of forming a projected portion 50 on the heat radiation plate 21 so as to surround the central region of the recessed portion 22 of the heat radiation plate 21.
Figure 27B:
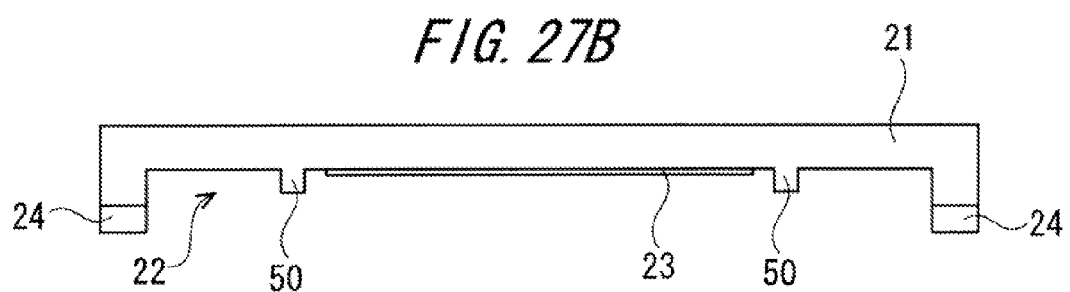
FIG. 27B is a sectional view of the heat radiation plate 21, which is taken along the alternate long and short dash line A-A in FIG. 27A.

The semiconductor device and the manufacturing method thereof according to a fifth working example will hereinafter be described. Note that the same components as those in the first through fourth working examples are marked with the same reference numerals as those in the first through fourth working examples, and their explanations are omitted. In the semiconductor device and the manufacturing method thereof according to the fifth working example, a projected portion 50 is formed on the heat radiation plate 21 so as to surround the central region of the recessed portion 22 of the heat radiation plate 21, thereby inhibiting the electrical connection between the terminal electrode 13 and the terminal electrode 14 of the chip capacitor 12. FIG. 27A is a bottom view of the heat radiation plate 21 in the case of forming the projected portion 50 on the heat radiation plate 21 so as to surround the central region of the recessed portion 22 of the heat radiation plate 21. FIG. 27B is a sectional view of the heat radiation plate 21, which is taken along the alternate long and short dash line A-A in FIG. 27A. The projected portion 50 is given by way of one example of the inhibiting portion.

Figure 28A:
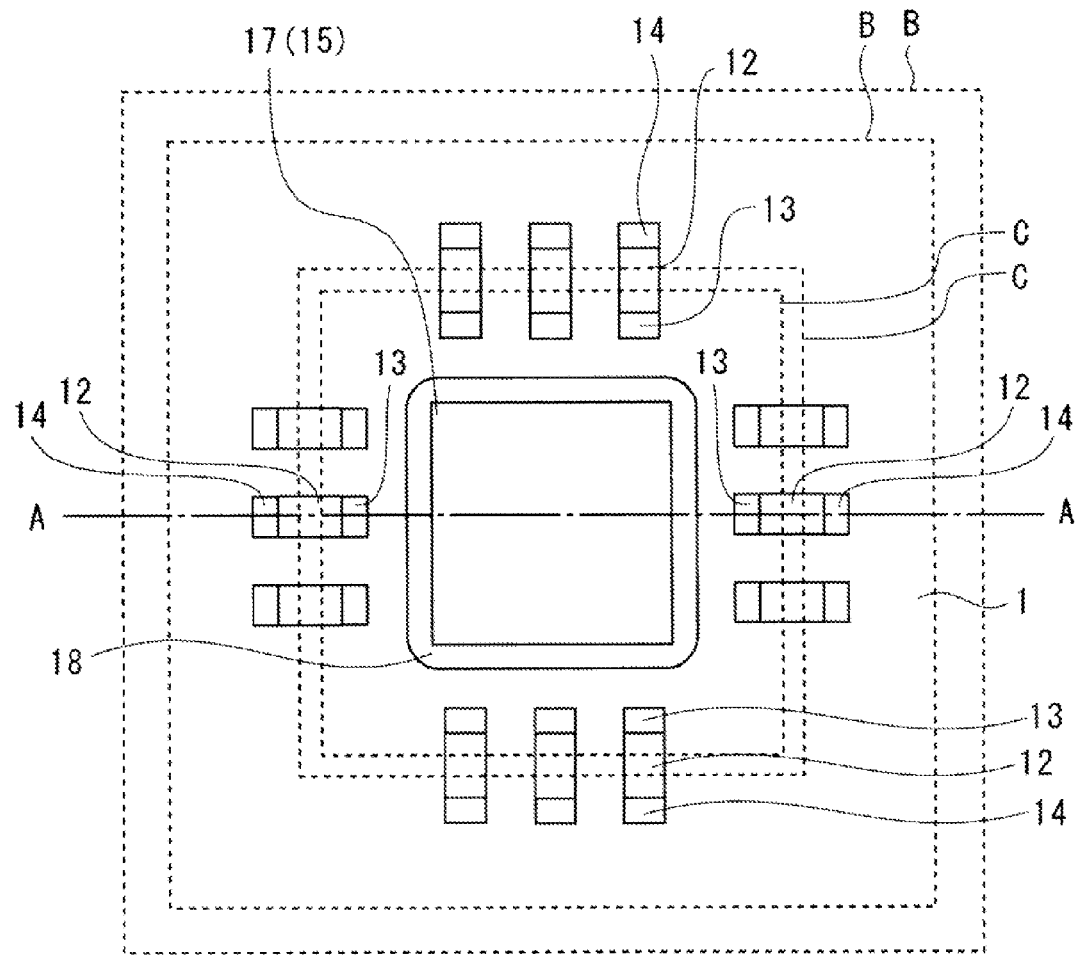
FIG. 28A is a top view of the semiconductor device in the case of disposing, upwardly of the wiring substrate 1, the heat radiation plate 21 formed with the projected portion 50 so as to surround the central region of the recessed portion 22 of the heat radiation plate 21.
Figure 28B:
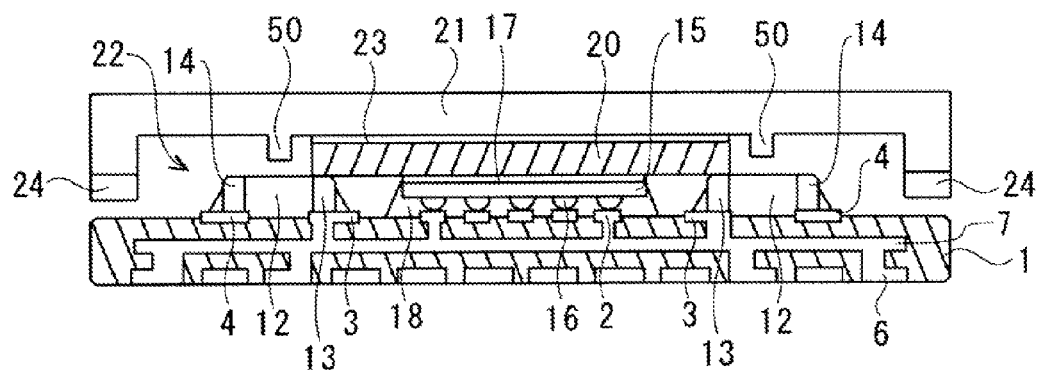
FIG. 28B is a sectional view of the semiconductor device, which is taken along the alternate long and short dash line A-A in FIG. 28A.

FIG. 28A is a top view of the semiconductor device in the case of disposing, upwardly of the wiring substrate 1, the heat radiation plate 21 formed with the projected portion 50 so as to surround the central region of the recessed portion 22 of the heat radiation plate 21. FIG. 28B is a sectional view of the semiconductor device, which is taken along the alternate long and short dash line A-A in FIG. 28A. Incidentally, in FIG. 28A, a shape of the heat radiation plate 21 is depicted by dotted lines B, and a shape of the projected portion 50 of the heat radiation plate 21 is depicted by dotted lines C, while the illustrations of the conductive material 20, the metal film 23 and the bonding agent 24 are omitted. As illustrated in FIGS. 28A and 28B, the conductive material 20 is surrounded with the projected portion 50 formed on the heat radiation plate 21. The packaging height of the chip capacitor 12 is, e.g., 0.610 mm. The packaging height of the semiconductor element 15 is, e.g., 0.610 mm. The packaging height of the chip capacitor 12 is coincident with the packaging height of the semiconductor element 15. The thickness of the conductive material 20 is, e.g., 0.350 mm. A height of the projected portion 50 of the heat radiation plate 21 is, e.g., 0.280 mm. The projected portion 50 is composed of the same material as the material of the heat radiation plate 21.

Figure 29A:
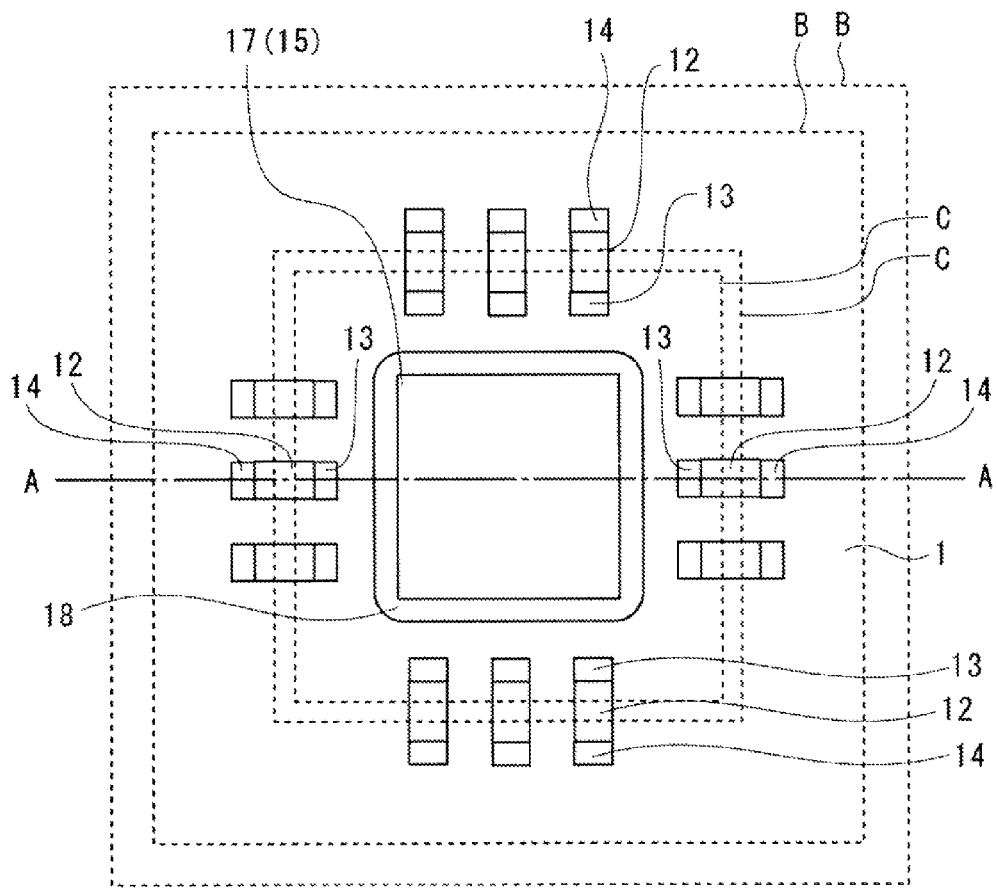
FIG. 29A is a top view of the semiconductor device in the case of bonding the wiring substrate 1 to the heat radiation plate 21 formed with the projected portion 50 so as to surround the central region of the recessed portion 22 of the heat radiation plate 21.
Figure 29B:
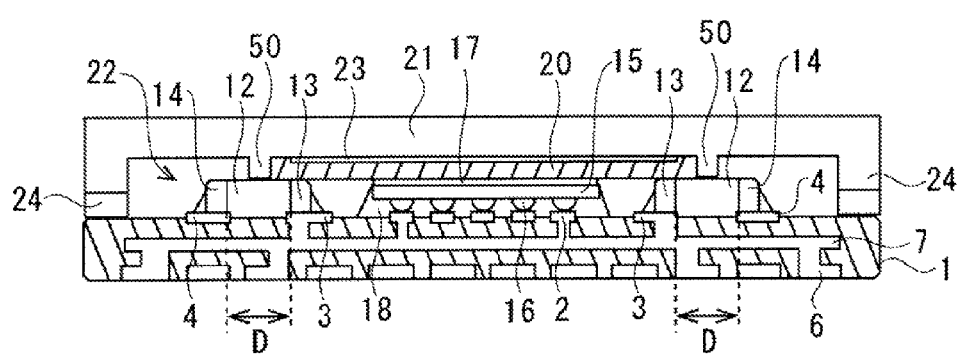
FIG. 29B is a sectional view of the semiconductor device, which is taken along the alternate long and short dash line A-A in FIG. 29A.

FIG. 29A is a top view of the semiconductor device in the case of bonding the wiring substrate 1 to the heat radiation plate 21 formed with the projected portion 50 so as to surround the central region of the recessed portion 22 of the heat radiation plate 21. FIG. 29B is a sectional view of the semiconductor device, which is taken along the alternate long and short dash line A-A in FIG. 29A. Note that in FIG. 29A, the shape of the heat radiation plate 21 is depicted by the dotted lines B, and the shape of the projected portion 50 of the heat radiation plate 21 is depicted by the dotted lines C, while the illustrations of the conductive material 20, the metal film 23 and the bonding agent 24 are omitted. After bonding the heat radiation plate 21 and the wiring substrate 1 together, the thickness of the conductive material 20 is 0.280 mm.

As illustrated in FIG. 29B, the projected portion 50 is formed on the heat radiation plate 21 so as to surround the conductive material 20, thereby restraining the spread of the conductive material 20 and inhibiting the electrical connection between the terminal electrode 13 and the terminal electrode 14 of the chip capacitor 12. The projected portion 50 of the heat radiation plate 21 may or may not abut on the chip capacitor 12. The projected portion 50 may be formed on the heat radiation plate 21 so that the projected portion 50 of the heat radiation plate 21 is disposed (in a position indicated by an arrowhead D in FIG. 29B) between the terminal electrode 13 and the terminal electrode 14 of the chip capacitor 12.

Sixth Working Example

Figure 30A:
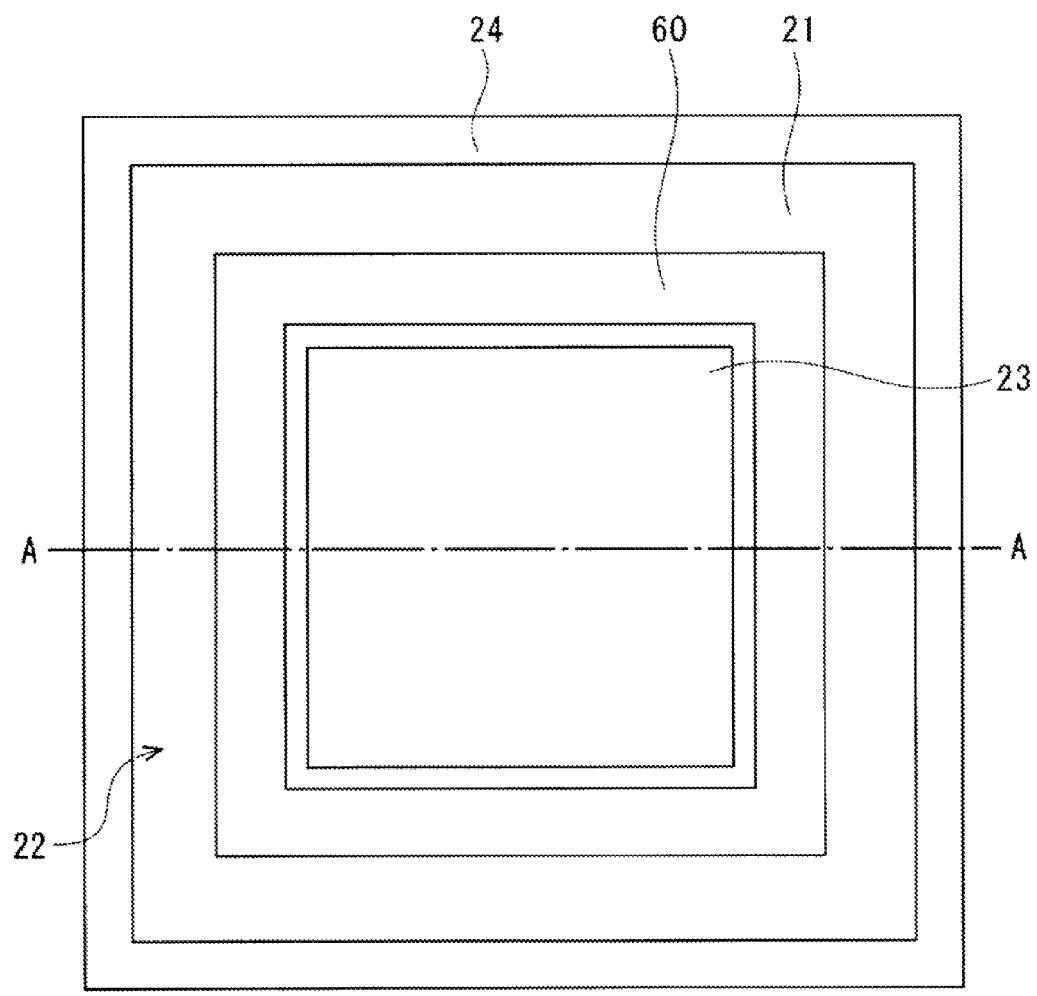
FIG. 30A is a bottom view of the heat radiation plate 21 provided with an insulating portion 60 so as to surround the central region of the recessed portion 22 of the heat radiation plate 21.
Figure 30B:
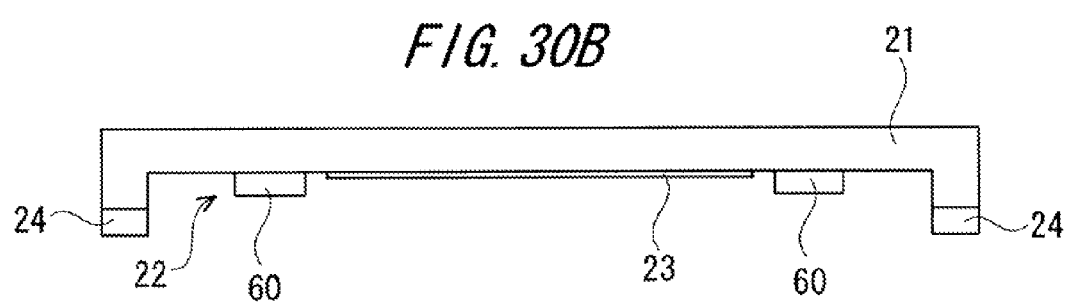
FIG. 30B is a sectional view of the heat radiation plate 21, which is taken along the alternate long and short dash line A-A in FIG. 30A.

The semiconductor device and the manufacturing method thereof according to a sixth working example will hereinafter be described. Note that the same components as those in the first through fifth working examples are marked with the same reference numerals as those in the first through fifth working examples, and their explanations are omitted. In the semiconductor device and the manufacturing method thereof according to the sixth working example, an insulating portion 60 is provided on the heat radiation plate 21 so as to surround the central region of the recessed portion 22 of the heat radiation plate 21, thereby inhibiting the electrical connection between the terminal electrode 13 and the terminal electrode 14 of the chip capacitor 12. FIG. 30A is a bottom view of the heat radiation plate 21 provided with the insulating portion 60 so as to surround the central region of the recessed portion 22 of the heat radiation plate 21. FIG. 30B is a sectional view of the heat radiation plate 21, which is taken along the alternate long and short dash line A-A in FIG. 30A. A height of the insulating portion 60 is, e.g., 0.280 mm. The insulating portion 60 may involve using, for instance, a polyimide adhesive tape (made by Nitto Denko Corporation). The insulating portion 60 is given by way of one example of the inhibiting portion.

Figure 31A:
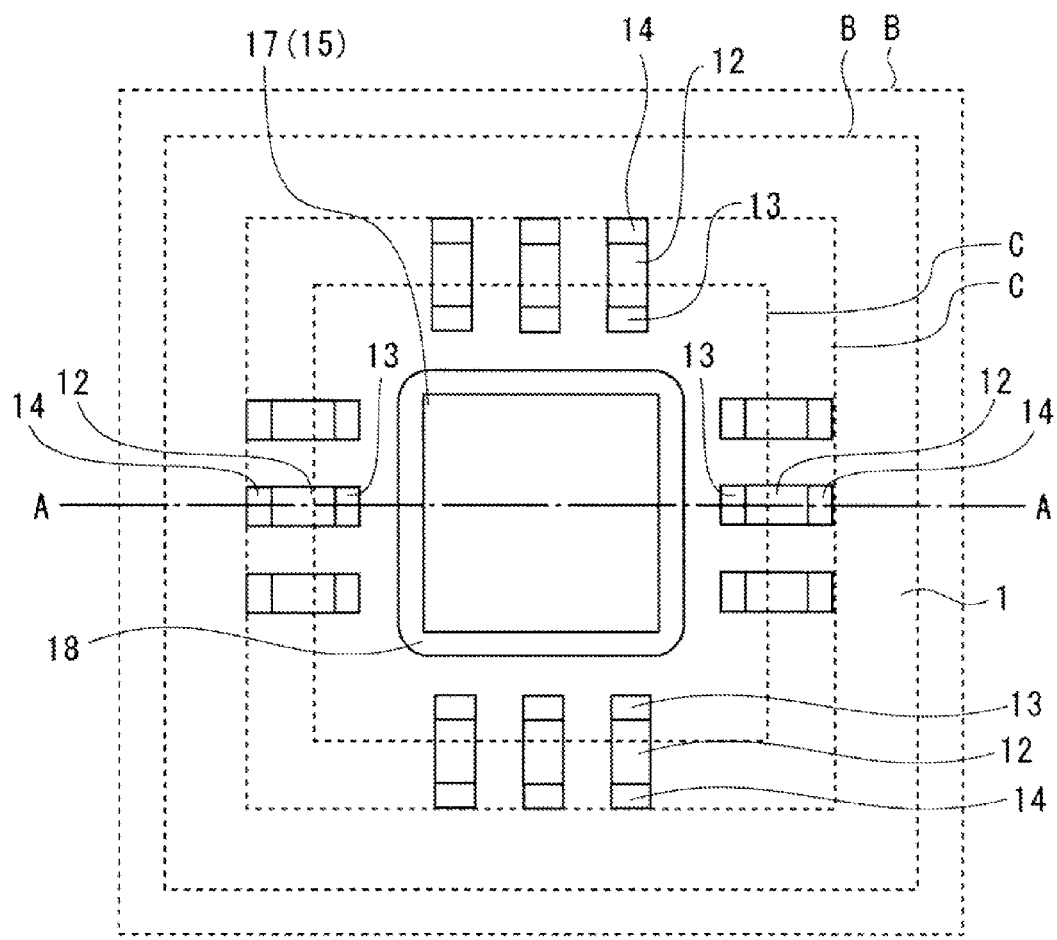
FIG. 31A is a bottom view of the semiconductor device in the case of disposing, upwardly of the wiring substrate 1, the heat radiation plate 21 provided with the insulating portion 60 so as to surround the central region of the recessed portion 22 of the heat radiation plate 21.
Figure 31B:
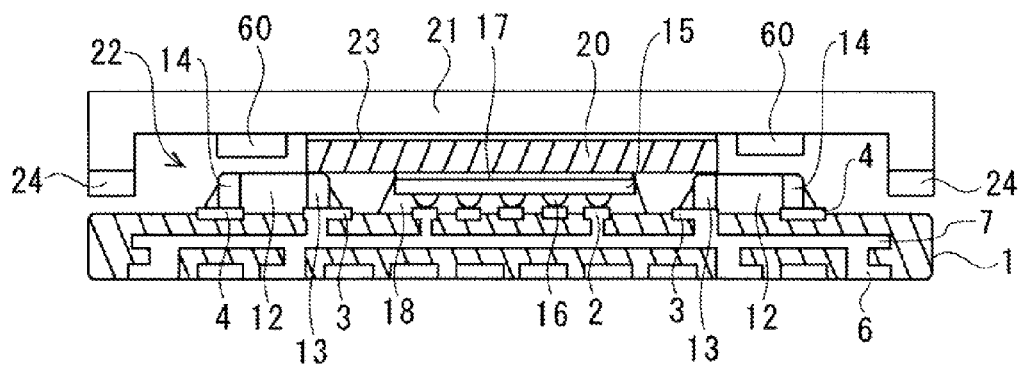
FIG. 31B is a sectional view of the semiconductor device, which is taken along the alternate long and short dash line A-A in FIG. 31A.

FIG. 31A is a bottom view of the semiconductor device in the case of disposing, upwardly of the wiring substrate 1, the heat radiation plate 21 provided with the insulating portion 60 so as to surround the central region of the recessed portion 22 of the heat radiation plate 21. FIG. 31B is a sectional view of the semiconductor device, which is taken along the alternate long and short dash line A-A in FIG. 31A. Note that in FIG. 31A, the shape of the heat radiation plate 21 is depicted by the dotted lines B, and a shape of the insulating portion 60 provided on the heat radiation plate 21 is depicted by the dotted lines C, while the illustrations of the conductive material 20, the metal film 23 and the bonding agent 24 are omitted. As illustrated in FIGS. 31A and 31B, the conductive material 20 is surrounded with the insulating portion 60 provided on the heat radiation plate 21. The packaging height of the chip capacitor 12 is, e.g., 0.610 mm. The packaging height of the semiconductor element 15 is, e.g., 0.610 mm. The packaging height of the chip capacitor 12 is coincident with the packaging height of the semiconductor element 15. The thickness of the conductive material 20 is, e.g., 0.350 mm. A height of the insulating portion 60 provided on the heat radiation plate 21 is, e.g., 0.280 mm.

Figure 32A:
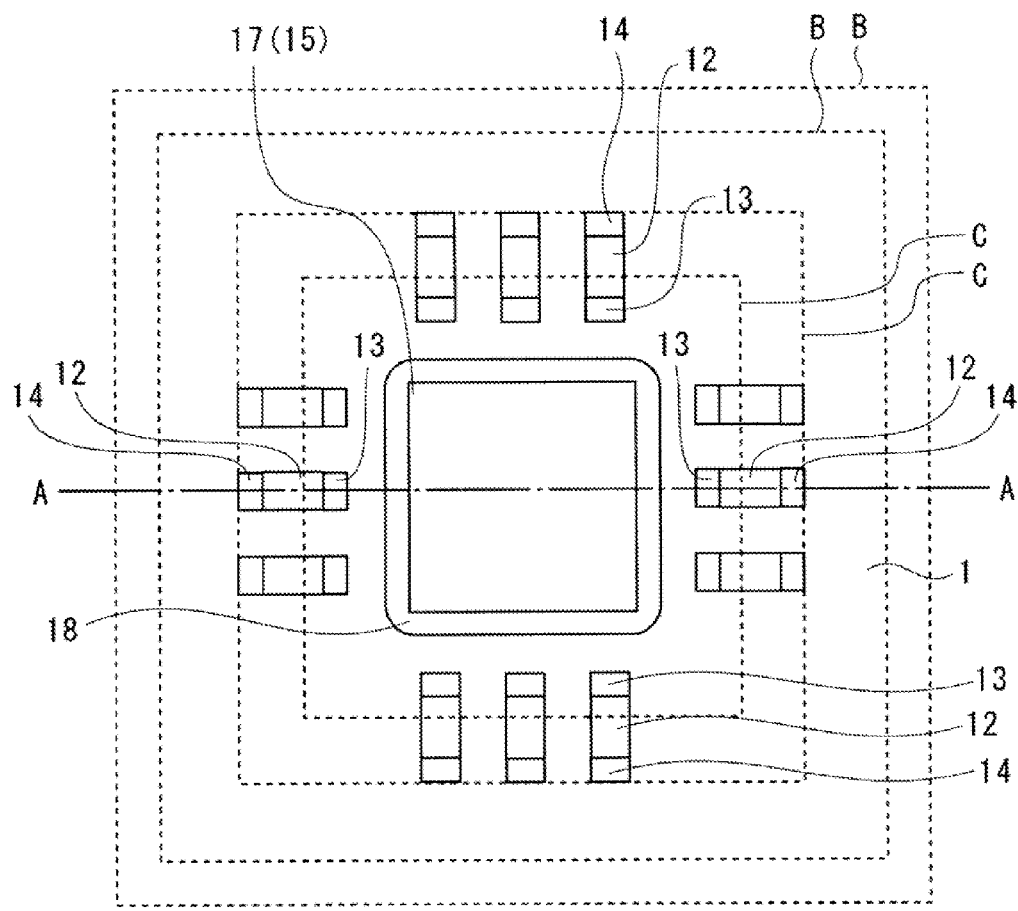
FIG. 32A is a top view of the semiconductor device in the case of bonding the wiring substrate 1 to the heat radiation plate 21 provided with the insulating portion 60 so as to surround the central region of the recessed portion 22 of the heat radiation plate 21.
Figure 32B:
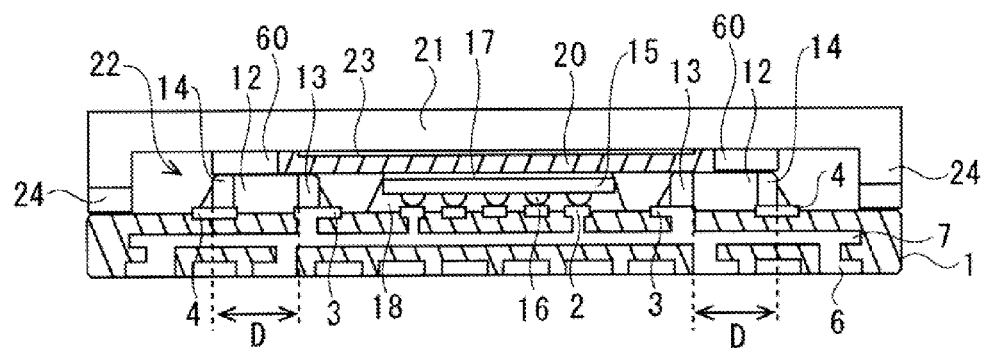
FIG. 32B is a sectional view of the semiconductor device, which is taken along the alternate long and short dash line A-A in FIG. 32A.

FIG. 32A is a top view of the semiconductor device in the case of bonding the wiring substrate 1 to the heat radiation plate 21 provided with the insulating portion 60 so as to surround the central region of the recessed portion 22 of the heat radiation plate 21. FIG. 32B is a sectional view of the semiconductor device, which is taken along the alternate long and short dash line A-A in FIG. 32A. Note that in FIG. 32A, the shape of the heat radiation plate 21 is depicted by the dotted lines B, and the shape of the insulating portion 60 provided on the heat radiation plate 21 is depicted by the dotted lines C, while the illustrations of the conductive material 20, the metal film 23 and the bonding agent 24 are omitted. After bonding the wiring substrate 1 and the heat radiation plate 21 together, the thickness of the conductive material 20 is 0.280 mm.

As illustrated in FIG. 32B, the insulating portion 60 provided on the heat radiation plate 21 restrains the conductive material 20 from spreading. Further, as depicted in FIG. 32B, an upper region of the terminal electrode 14 of the chip capacitor 12 is covered by the insulating portion 60 provided on the heat radiation plate 21, thereby inhibiting the contact between the spread-out conductive material 20 and the terminal electrode 14 of the chip capacitor 12. Thus, the insulating portion 60 is provided on the heat radiation plate 21 so as to surround the conductive material 20, thereby inhibiting the electrical connection between the terminal electrode 13 and the terminal electrode 14 of the chip capacitor 12. The insulating portion 60 provided on the heat radiation plate 21 may or may not abut on the chip capacitor 12. The insulating portion 60 may be provided on the heat radiation plate 21 so that the insulating portion 60 of the heat radiation plate 21 is disposed (in a position indicated by an arrowhead D in FIG. 32B) between the terminal electrode 13 and the terminal electrode 14 of the chip capacitor 12.

Seventh Working Example

The semiconductor device and the manufacturing method thereof according to a seventh working example will hereinafter be described. Note that the same components as those in the first through sixth working examples are marked with the same reference numerals as those in the first through sixth working examples, and their explanations are omitted. In the semiconductor device and the manufacturing method thereof according to the seventh working example, a chip capacitor 70 having a large interval between the positions of the terminal electrodes is installed on the wiring substrate 1, thereby inhibiting an electrical connection between a terminal electrode 71 and a terminal electrode 72 of the chip capacitor 70.

Figure 33A:
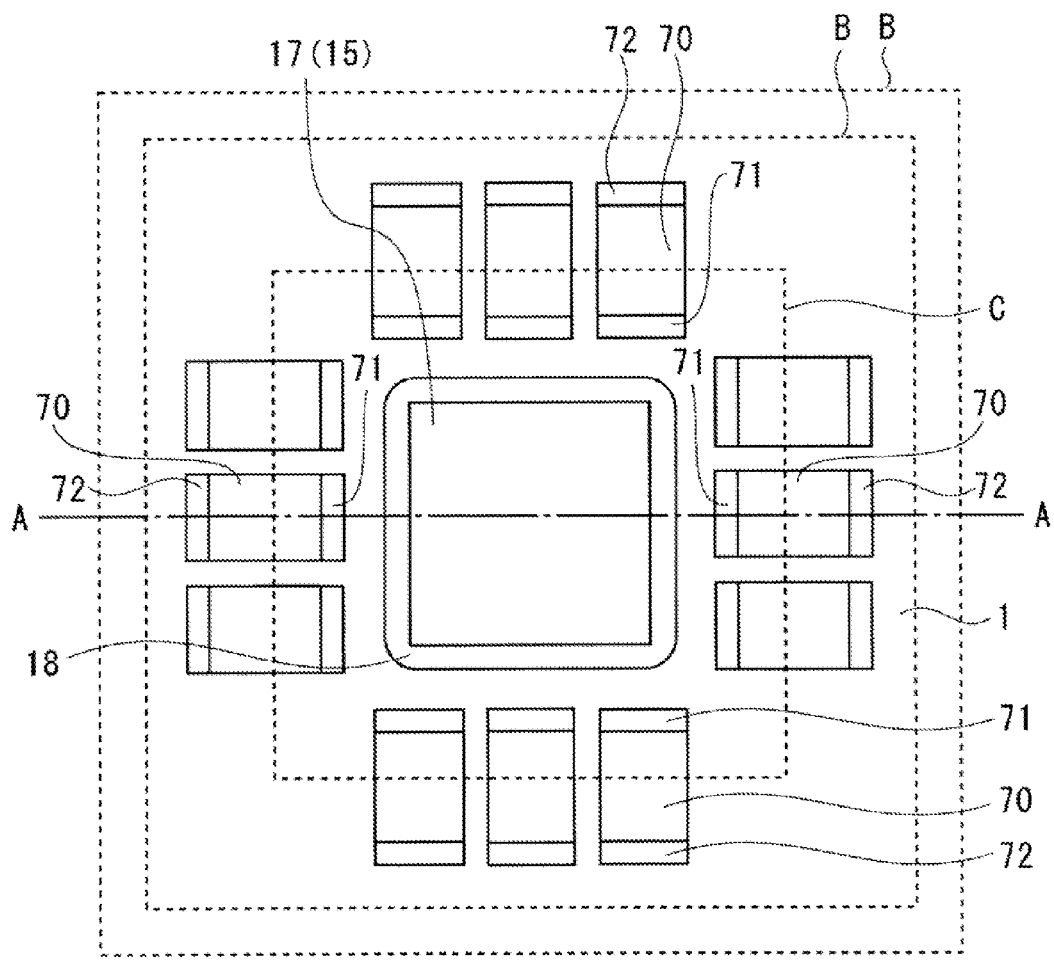
FIG. 33A is a top view of the semiconductor device in the case of installing a chip capacitor 70 having the large interval between the positions of the terminal electrodes on the wiring substrate 1 and disposing the heat radiation plate 21 upwardly of the wiring substrate 1.
Figure 33B:
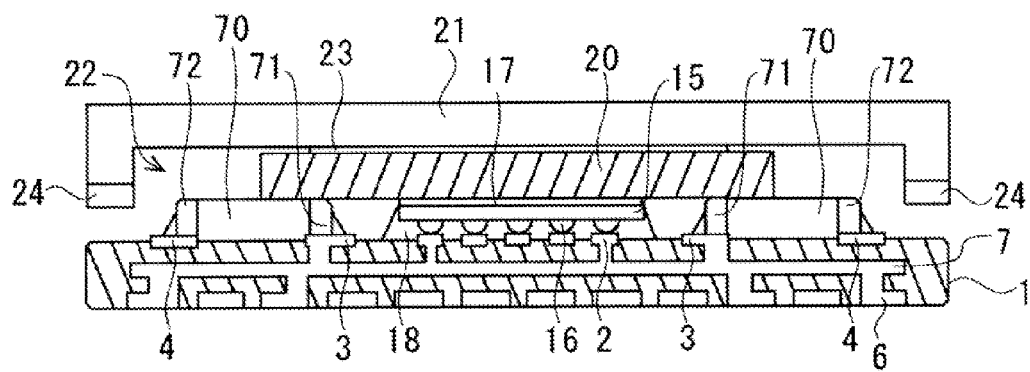
FIG. 33B is a sectional view of the semiconductor device, which is taken along the alternate long and short dash line A-A in FIG. 33A.

FIG. 33A is a top view of the semiconductor device in the case of installing the chip capacitor 70 having the large interval between the positions of the terminal electrodes on the wiring substrate 1 and disposing the heat radiation plate 21 upwardly of the wiring substrate 1. FIG. 33B is a sectional view of the semiconductor device, which is taken along the alternate long and short dash line A-A in FIG. 33A. Note that in FIG. 33A, the shape of the heat radiation plate 21 is depicted by the dotted lines B, and the shape of the conductive material 20 is depicted by the dotted lines C, while the illustrations of the metal film 23 and the bonding agent 24 are omitted. As illustrated in FIGS. 33A and 33B, the chip capacitor 70 is laterally installed on the wiring substrate 1 so that the terminal electrode 71 of the chip capacitor 70 is electrically connected to the electrode pad 3, while the terminal electrode 72 of the chip capacitor 70 is electrically connected to the electrode pad 4.

Figure 34A:
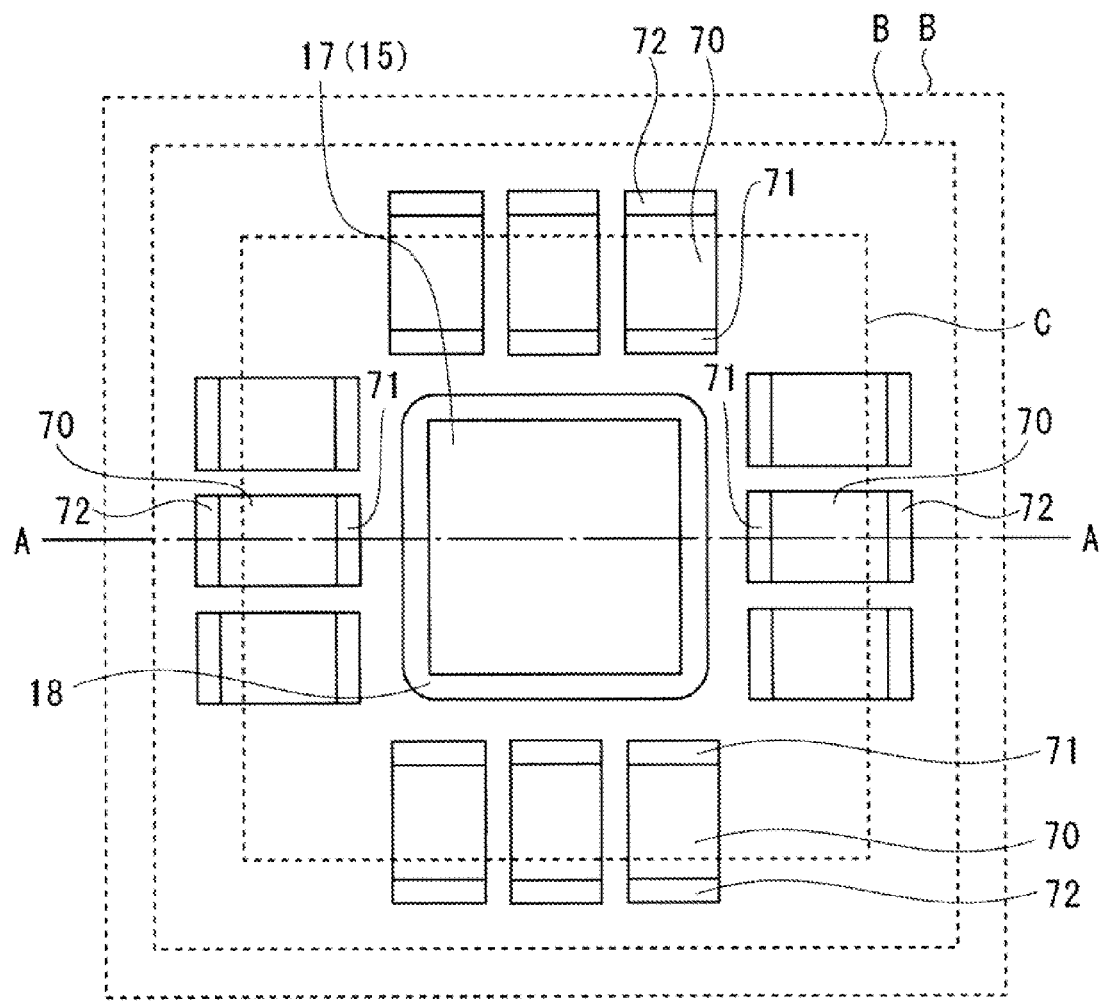
FIG. 34A is a top view of the semiconductor device in the case of bonding the heat radiation plate 21 to the wiring substrate 1 on which the chip capacitor 70 is installed.
Figure 34B:
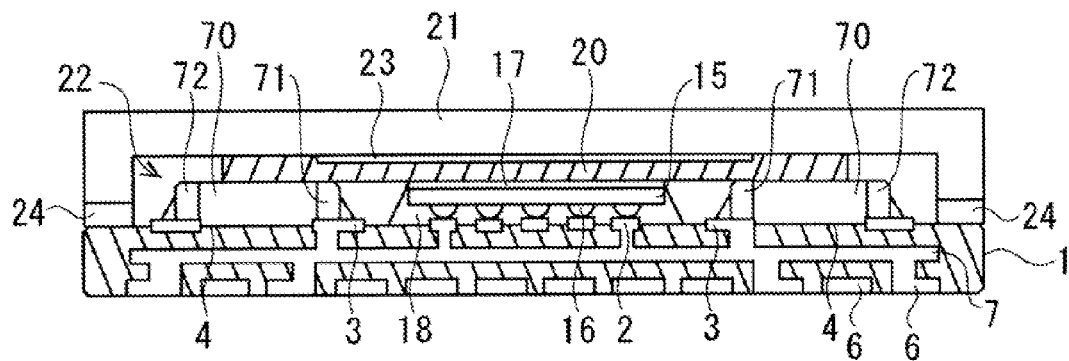
FIG. 34B is a sectional view of the semiconductor device, which is taken along the alternate long and short dash line A-A in FIG. 34A.

FIG. 34A is a top view of the semiconductor device in the case of bonding the heat radiation plate 21 to the wiring substrate 1 on which the chip capacitor 70 is installed. FIG. 34B is a sectional view of the semiconductor device, which is taken along the alternate long and short dash line A-A in FIG. 34A. Note that in FIG. 34A, the shape of the heat radiation plate 21 is depicted by the dotted lines B, and the shape of the conductive material 20 is depicted by the dotted lines C, while the illustrations of the metal film 23 and the bonding agent 24 are omitted.

The chip capacitor 70 having the large interval between the positions of the terminal electrodes is installed on the wiring substrate 1, thereby inhibiting, as illustrated in FIG. 34B, the electrical connection between the terminal electrode 71 and the terminal electrode 72 of the chip capacitor 70 even when the conductive material 20 spreads. Namely, even when the conductive material 20 spreads in the direction of the terminal electrode 72, the conductive material 20 does not reach the terminal electrode 72 because of the large interval between the position of the terminal electrode 71 and the position of the terminal electrode 72, thereby inhibiting the electrical connection between the terminal electrode 71 and the terminal electrode 72. The spread of the conductive material 20 changes depending on the thickness of the conductive material 20 and the load on the heat radiation plate 21, and hence the interval between the position of the terminal electrode 71 and the position of the terminal electrode 72 of the chip capacitor 70 may be determined based on the calculations, experiments or the simulations and the like.

Eighth Working Example

The semiconductor device and the manufacturing method thereof according to an eighth working example will hereinafter be described. Note that the same components as those in the first through seventh working examples are marked with the same reference numerals as those in the first through seventh working examples, and their explanations are omitted. In the semiconductor device and the manufacturing method thereof according to the eighth working example, a terminal electrode 82 is not formed on the upper surface of the chip capacitor 80, thereby inhibiting an electrical connection between the terminal electrode 81 and a terminal electrode 82 of the chip capacitor 80.

Figure 35A:
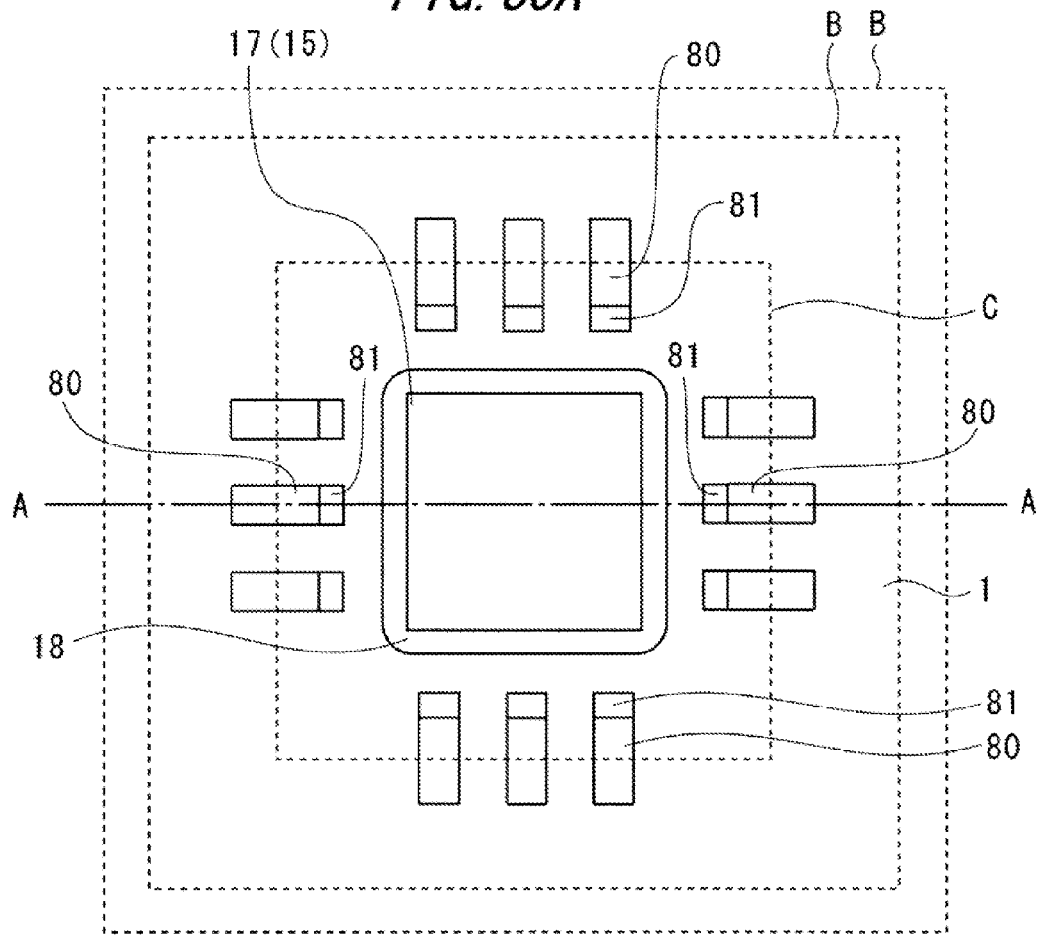
FIG. 35A is a top view of the semiconductor device in the case of installing a chip capacitor 80 having a terminal electrode 82 formed on the lower surface of the chip capacitor 80 on the wiring substrate 1 and disposing the heat radiation plate 21 upwardly of the wiring substrate 1.
Figure 35B:
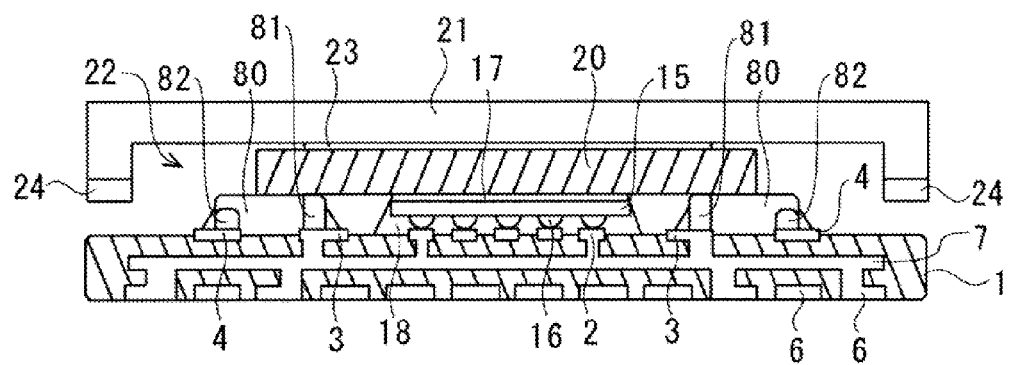
FIG. 35B is a sectional view of the semiconductor device, which is taken along the alternate long and short dash line A-A in FIG. 35A.

FIG. 35A is a top view of the semiconductor device in the case of installing the chip capacitor 80 having the terminal electrode 82 formed on the lower surface of the chip capacitor 80 on the wiring substrate 1 and disposing the heat radiation plate 21 upwardly of the wiring substrate 1. FIG. 35B is a sectional view of the semiconductor device, which is taken along the alternate long and short dash line A-A in FIG. 35A. Note that in FIG. 35A, the shape of the heat radiation plate 21 is depicted by the dotted lines B, and the shape of the conductive material 20 is depicted by the dotted lines C, while the illustrations of the metal film 23 and the bonding agent 24 are omitted.

The terminal electrodes 81 are formed on both of the upper and lower surfaces of the chip capacitor 80, while the terminal electrode 82 is formed on only the lower surface of the chip capacitor 80. As illustrated in FIGS. 35A and 35B, the chip capacitor 80 is laterally installed on the wiring substrate 1 so that the terminal electrode 81 of the chip capacitor 80 is electrically connected to the electrode pad 3, while the terminal electrode 82 of the chip capacitor 80 is electrically connected to the electrode pad 4.

Figure 36A:
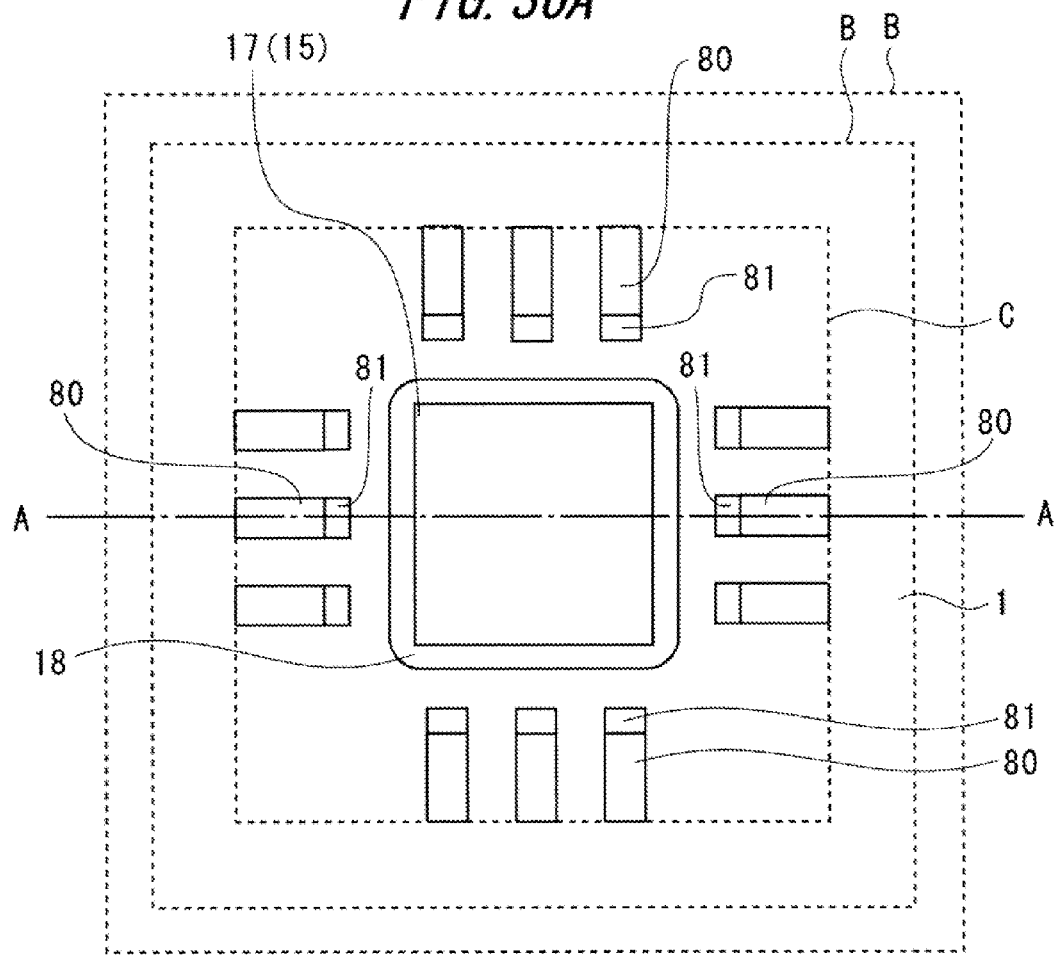
FIG. 36A is a top view of the semiconductor device in the case of bonding the heat radiation plate 21 to the wiring substrate 1 on which the chip capacitor 80 is installed.
Figure 36B:
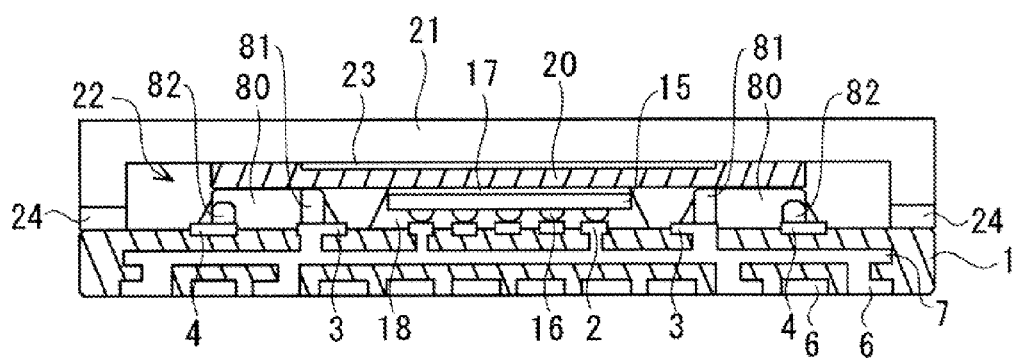
FIG. 36B is a sectional view of the semiconductor device, which is taken along the alternate long and short dash line A-A in FIG. 36A.

FIG. 36A is a top view of the semiconductor device in the case of bonding the heat radiation plate 21 to the wiring substrate 1 on which the chip capacitor 80 is installed. FIG. 36B is a sectional view of the semiconductor device, which is taken along the alternate long and short dash line A-A in FIG. 36A. Note that in FIG. 36A, the shape of the heat radiation plate 21 is depicted by the dotted lines B, and the shape of the conductive material 20 is depicted by the dotted lines C, while the illustrations of the metal film 23 and the bonding agent 24 are omitted.

The terminal electrode 82 is formed on the lower surface of the chip capacitor 80, thereby inhibiting, as illustrated in FIG. 36B, the electrical connection between the terminal electrode 81 and the terminal electrode 82 of the chip capacitor 80 even when the conductive material 20 spreads. Namely, even when the conductive material 20 spreads in the direction of the terminal electrode 82, the conductive material 20 does not reach the terminal electrode 82 because of forming none of the terminal electrode 82 on the upper surface of the chip capacitor 80, thereby inhibiting the electrical connection between the terminal electrode 81 and the terminal electrode 82. For instance, in the case of using a chip capacitor of which the terminal electrodes are both formed on the lower surface as the chip capacitor 80, one of terminal electrodes may be formed on both of the upper and lower surfaces of the chip capacitor by a dipping method.

Ninth Working Example

The semiconductor device and the manufacturing method thereof according to a ninth working example will hereinafter be described. Note that the same components as those in the first through eighth working examples are marked with the same reference numerals as those in the first through eighth working examples, and their explanations are omitted. In the semiconductor device and the manufacturing method thereof according to the ninth working example, a quantity of the conductive material 20 is reduced in a manner that varies the shape of the conductive material 20, thereby inhibiting the conductive material 20 from excessively spreading.

Figure 37A:
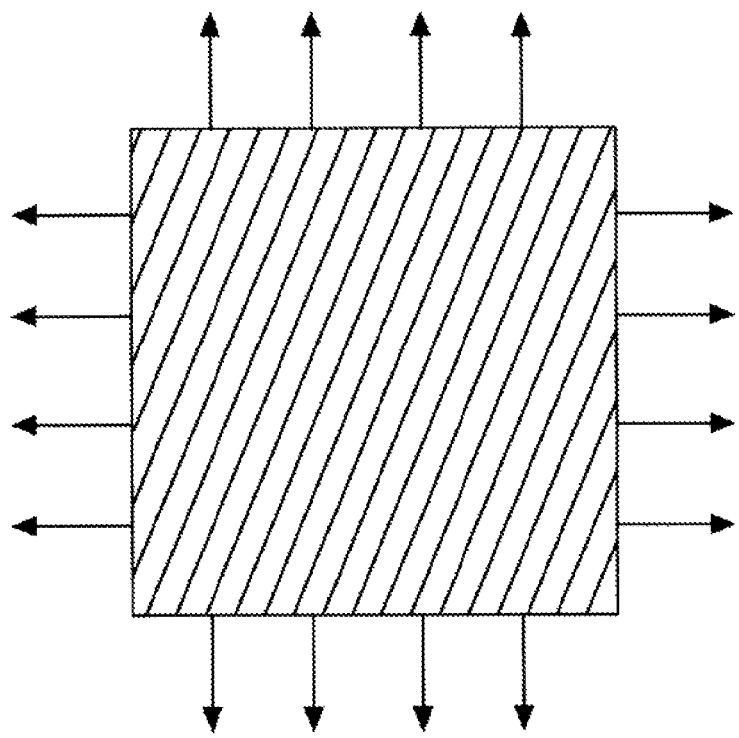
FIG. 37A is a top view of the conductive material 20 taking a quadrangle shape.

FIG. 37A is a top view of the conductive material 20 taking a quadrangle (square) shape. On the occasion of heating treatment, the conductive material 20 in the quadrangle shape, as depicted in FIG. 37A spreads widely in fixed directions (directions of arrowheads), and consequently the conductive material 20 excessively spreads as the case may be.

Figure 37B:
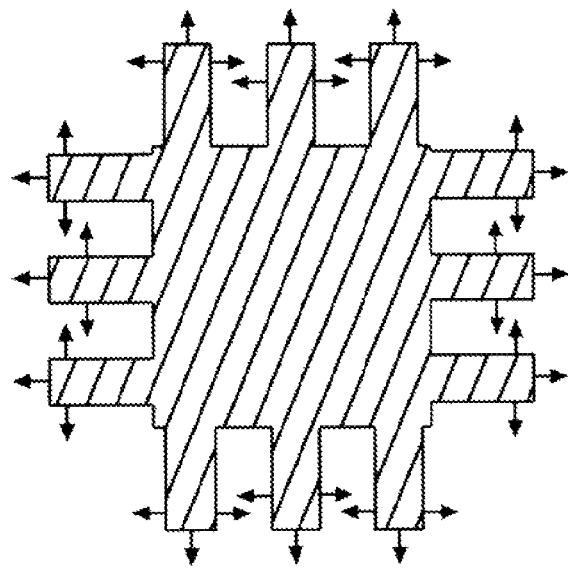
FIG. 37B is a top view of the conductive material 20 in such a case that an outer peripheral portion of the conductive material 20 is varied in a multi-protruded shape.

FIG. 37B is a top view of the conductive material 20 in such a case that an outer peripheral portion of the conductive material 20 is varied in a multi-protruded shape. As compared with the conductive material 20 illustrated in FIG. 37A, the conductive material 20 illustrated in FIG. 37B is formed in such a way that the outer peripheral portion of the conductive material 20 takes the multi-protruded shape. As illustrated in FIG. 37B, the conductive material 20, of which the outer peripheral portion is formed in the multi-protruded shape, gets dispersed in the directions (the directions of the arrowheads) in which the conductive material 20 spreads in the heating treatment. Hence, there is reduced a spreading width of the conductive material 20 with respect to the front edges of the multi-protruded shape.

Figure 38A:
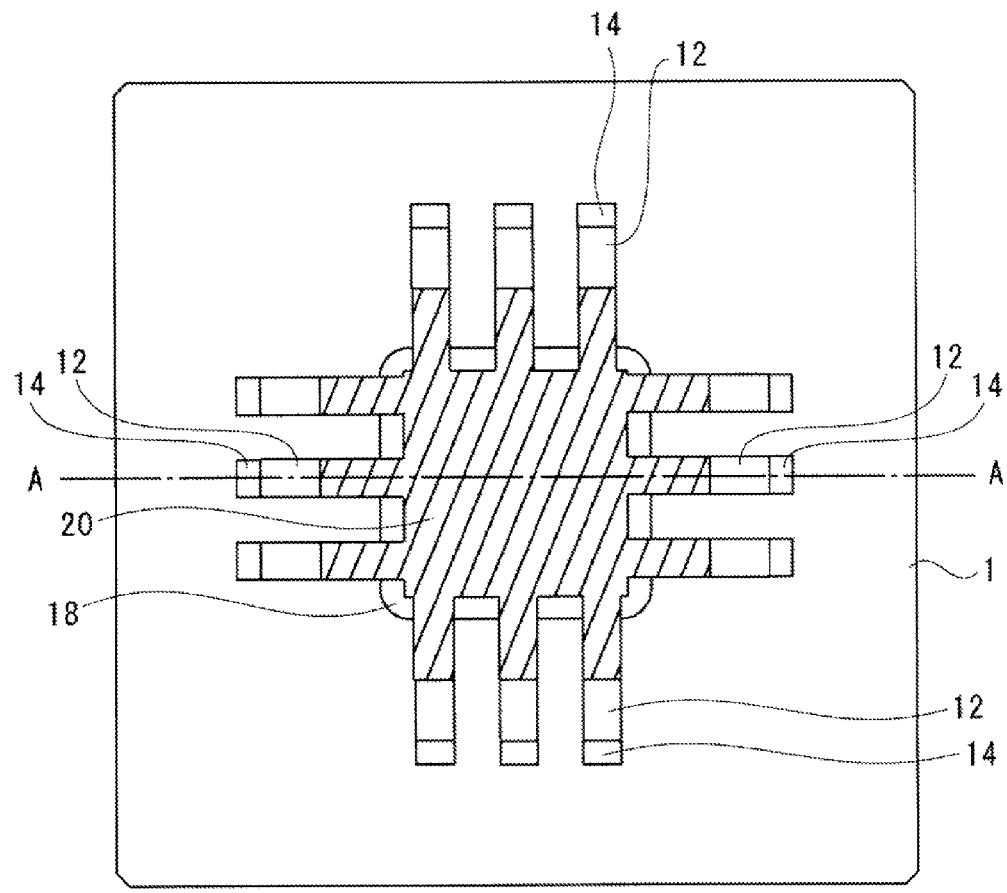
FIG. 38A is a top view of the semiconductor device in the case of disposing, upwardly of the wiring substrate 1, the conductive material 20 of which the outer peripheral portion is varied in the multi-protruded shape.
Figure 38B:
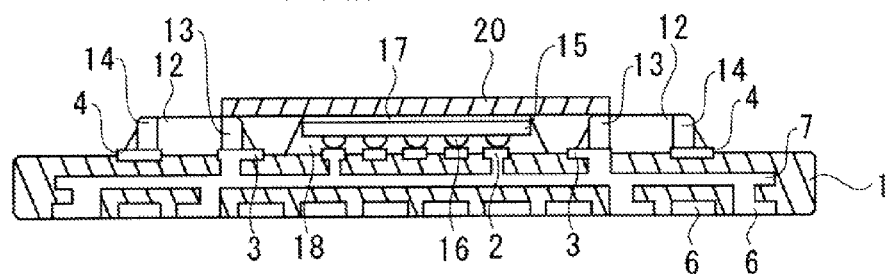
FIG. 38B is a sectional view of the semiconductor device, which is taken along the alternate long and short dash line A-A in FIG. 38A.

FIG. 38A is a top view of the semiconductor device in the case of disposing, upwardly of the wiring substrate 1, the conductive material 20 of which the outer peripheral portion is varied in the multi-protruded shape. FIG. 38B is a sectional view of the semiconductor device, which is taken along the alternate long and short dash line A-A in FIG. 38A. As illustrated in FIG. 38A, the conductive material 20, of which the outer peripheral portion is varied in the multi-protruded shape, decreases in quantity of the outer peripheral portion of the conductive material 20 as compared with the case of disposing the conductive material 20 taking the quadrangle shape upwardly of the wiring substrate 1 (see FIG. 6). Therefore, the spreading width of the conductive material 20 is reduced corresponding to the decreased quantity of the outer peripheral portion of the conductive material 20.

Tenth Working Example

The semiconductor device and the manufacturing method thereof according to a tenth working example will hereinafter be described. Note that the same components as those in the first through ninth working examples are marked with the same reference numerals as those in the first through ninth working examples, and their explanations are omitted. In the semiconductor device and the manufacturing method thereof according to the tenth working example, the quantity of the conductive material 20 is decreased by shrinking the shape of the conductive material 20, thereby inhibiting the conductive material 20 from excessively spreading.

Figure 39A:
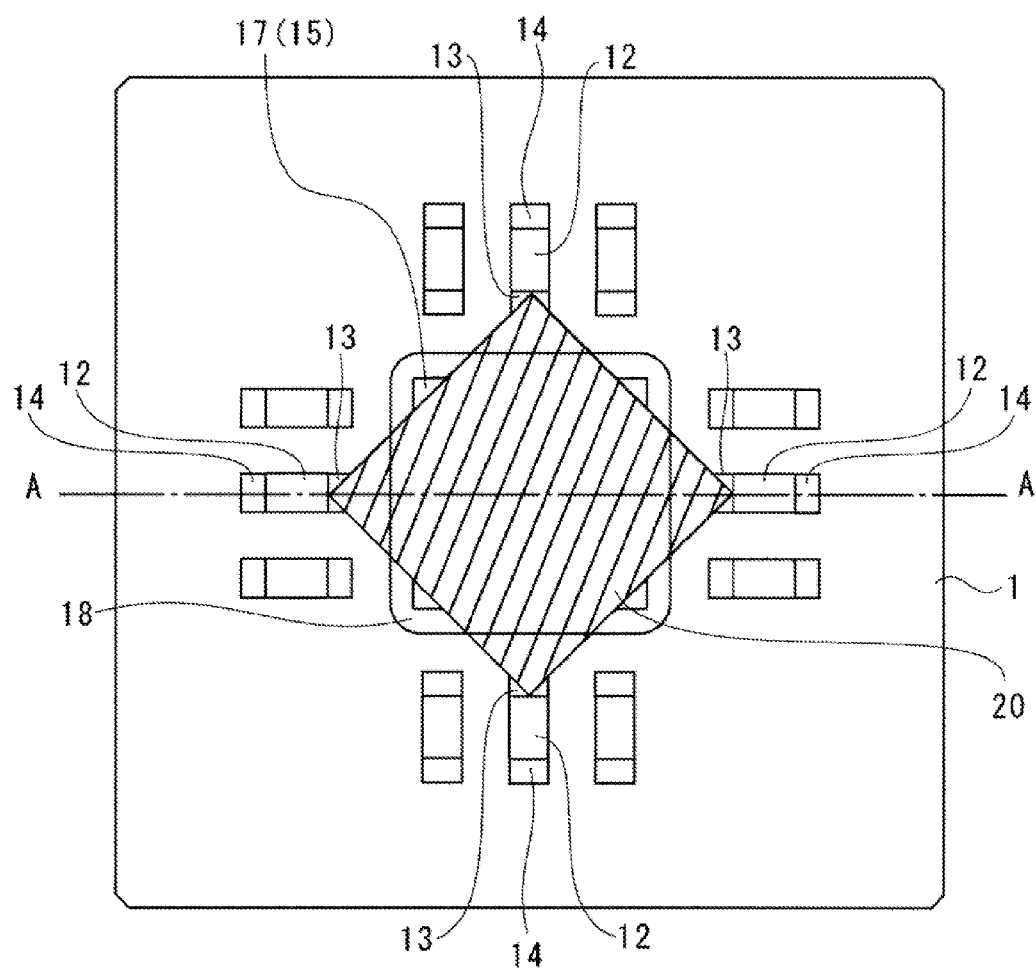
FIG. 39A is a top view of the semiconductor device in the case of disposing the conductive material 20 upwardly of the wiring substrate 1.
Figure 39B:
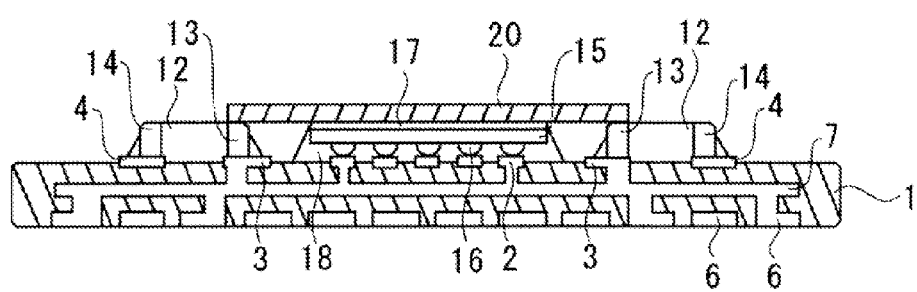
FIG. 39B is a sectional view of the semiconductor device, which is taken along the alternate long and short dash line A-A in FIG. 39A.

FIG. 39A is a top view of the semiconductor device in the case of disposing the conductive material 20 upwardly of the wiring substrate 1. FIG. 39B is a sectional view of the semiconductor device, which is taken along the alternate long and short dash line A-A in FIG. 39A. As illustrated in FIG. 39A, the conductive material 20 is disposed upwardly of the wiring substrate 1 so that each of vertexes of the quadrangle shape of the conductive material 20 abuts on the terminal electrode 13 of the chip capacitor 12. The conductive material 20 is disposed upwardly of the wiring substrate 1 so that each of vertexes of the quadrangle shape of the conductive material 20 abuts on the terminal electrode 13 of the chip capacitor 12, thereby enabling the shape of the conductive material 20 to be downsized. The quantity of the conductive material 20 is reduced by downsizing the shape of the conductive material 20, whereby inhibiting the conductive material 20 from excessively spreading. As illustrated in FIG. 39A, there is no necessity for performing any special working process for the conductive material 20 other than downsizing the shape of the conductive material 20, and hence it is feasible to inhibit the conductive material 20 from excessively spreading without increasing the number of processing steps.

Eleventh Working Example

The semiconductor device and the manufacturing method thereof according to an eleventh working example will hereinafter be described. Note that the same components as those in the first through tenth working examples are marked with the same reference numerals as those in the first through tenth working examples, and their explanations are omitted. In the semiconductor device and the manufacturing method thereof according to the eleventh working example, decreases in size and in weight of the semiconductor device are attained by downsizing the heat radiation plate 21.

FIG. 40A is a top view of the semiconductor device in the case of disposing, upwardly of the wiring substrate 1, a heat radiation plate 90 into which the heat radiation plate 21 is downsized. FIG. 40B is a sectional view of the semiconductor device, which is taken along the alternate long and short dash line A-A in FIG. 40A. The heat radiation plate 90 involves using a material exhibiting satisfactory heat conductivity (heat radiation property). Metal plates of, e.g., Cu, Al, AlSiC, AlC, etc may be used as the heat radiation plate 90. The heat radiation plate 90 is flat in shape, in which a metal film 23 is formed in a central region of the heat radiation plate 90. The metal film 23 is formed by conducting the electroless plating by use of, e.g., nickel (Ni) and gold (Au). Note that in FIG. 40A, the shape of the conductive material 20 is depicted by the dotted lines B, and the shape of the heat radiation plate 90 is depicted by the dotted lines C, while the illustration of the metal film 23 is omitted.

In the semiconductor device and the manufacturing method thereof according to the eleventh working example, in comparison with the heat radiation plate 21, the size and the weight of the heat radiation plate 90 are reduced, and it is therefore possible to attain the reductions in size and in weight of the semiconductor device. Further, in the semiconductor device and the manufacturing method thereof according to the eleventh working example, as compared the heat radiation plate 21, the heat radiation plate 90 is not provided with the bonding agent 24, and hence it is feasible to attain the reductions in size and in weight of the semiconductor device. Note that as the heating treatment is conducted, the conductive material 20 gets melted, then joined to the terminal electrode 13 of the chip capacitor 12, further to the rear surface of the semiconductor element 15 and yet further to the heat radiation plate 90.

Twelfth Working Example

The semiconductor device and the manufacturing method thereof according to a twelfth working example will hereinafter be described. Note that the same components as those in the first through eleventh working examples are marked with the same reference numerals as those in the first through eleventh working examples, and their explanations are omitted. In the semiconductor device and the manufacturing method thereof according to the twelfth working example, the decreases in size and in weight of the semiconductor device are attained by downsizing the heat radiation plate 21. Further, in the semiconductor device and the manufacturing method thereof according to the twelfth working example, a projected portion 91 is formed along the outer peripheral portion of the heat radiation plate 90 into which the heat radiation plate 21 is downsized, thereby inhibiting the electrical connection between the terminal electrode 13 and the terminal electrode 14 of the chip capacitor 12.

Figure 41A:
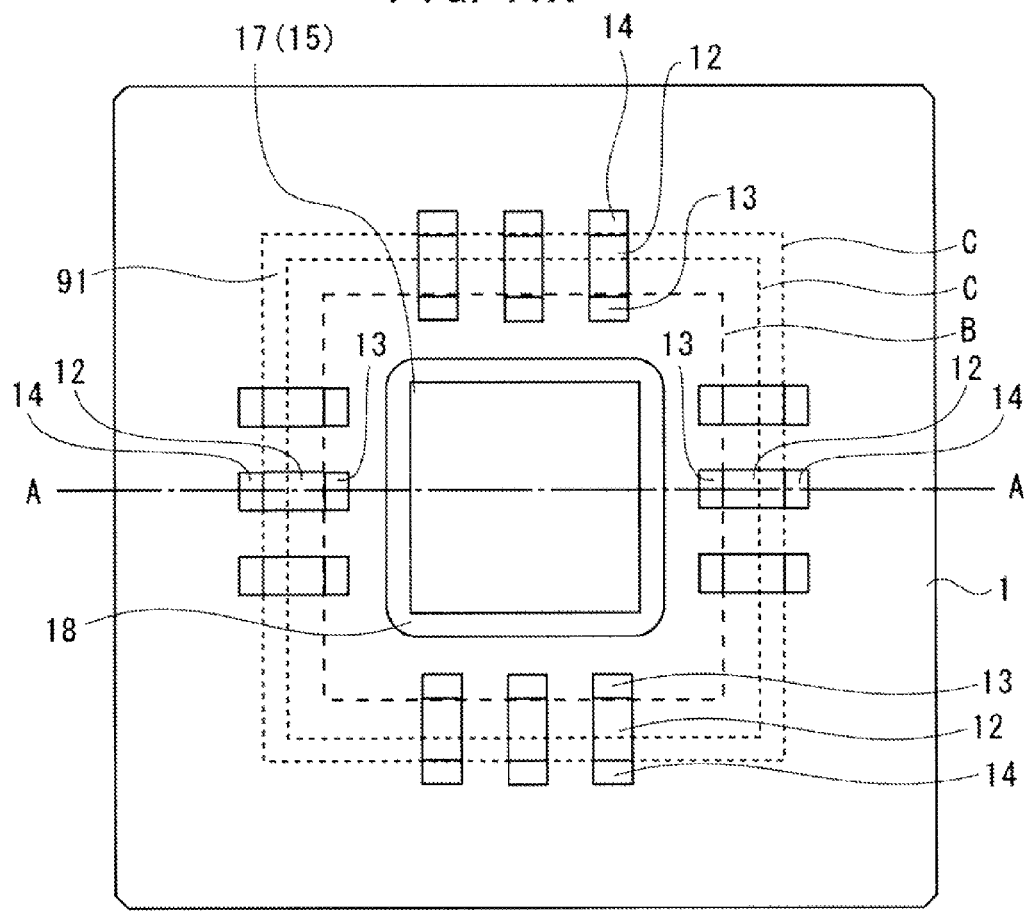
FIG. 41A is a top view of the semiconductor device in the case of disposing, upwardly of the wiring substrate 1, the heat radiation plate 90 formed with a projected portion 91.
Figure 41B:
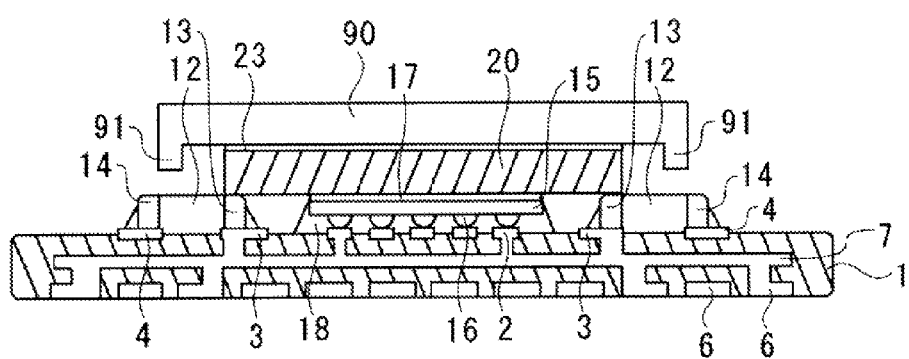
FIG. 41B is a sectional view of the semiconductor device, which is taken along the alternate long and short dash line A-A in FIG. 41A.

FIG. 41A is a top view of the semiconductor device in the case of disposing, upwardly of the wiring substrate 1, the heat radiation plate 90 formed with the projected portion 91. FIG. 41B is a sectional view of the semiconductor device, which is taken along the alternate long and short dash line A-A in FIG. 41A. Note that in FIG. 41A, the shape of the conductive material 20 is depicted by the dotted lines B, and the shape of the heat radiation plate 90 is depicted by the dotted lines C, while the illustration of the metal film 23 is omitted. As illustrated in FIGS. 41A and 41B, the projected portion 91 is formed along the outer peripheral portion of the heat radiation plate 90, and the conductive material 20 is surrounded with the projected portion 91 of the heat radiation plate 90. The projected portion 91 is composed of the same material as the material of the heat radiation plate 90. The projected portion 91 is given by way of one example of the inhibiting portion.

Figure 42A:
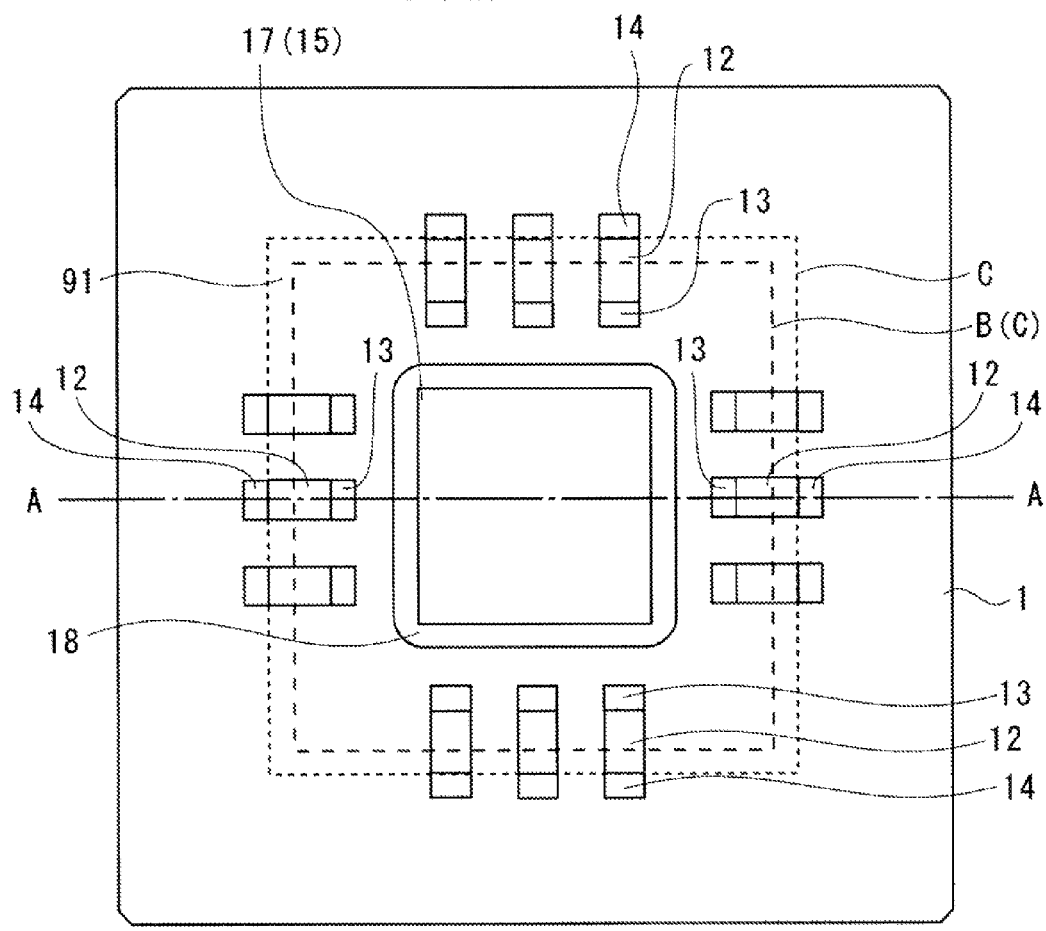
FIG. 42A is a top view of the semiconductor device in the case of bringing the upper surface of the chip capacitor 12 into contact with the projected portion 91 of the heat radiation plate 90.
Figure 42B:
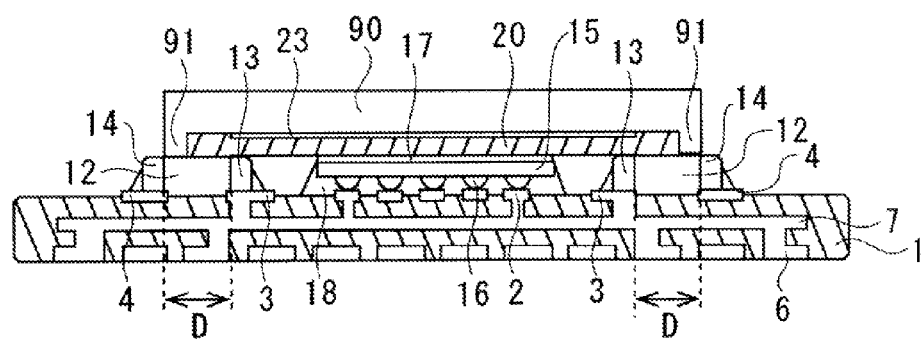
FIG. 42B is a sectional view of the semiconductor device, which is taken along the alternate long and short dash line A-A in FIG. 42A.

FIG. 42A is a top view of the semiconductor device in the case of bringing the upper surface of the chip capacitor 12 into contact with the projected portion 91 of the heat radiation plate 90. FIG. 42B is a sectional view of the semiconductor device, which is taken along the alternate long and short dash line A-A in FIG. 42A. Note that in FIG. 42A, the shape of the conductive material 20 is depicted by the dotted lines B, and the shape of the heat radiation plate 90 is depicted by the dotted lines C, while the illustration of the metal film 23 is omitted. As the heating treatment is carried out, the conductive material 20 gets melted, then joined to the terminal electrode 13 of the chip capacitor 12, further to the rear surface of the semiconductor element 15 and yet further to the heat radiation plate 90. On the occasion of the heating treatment for melting the conductive material 20, the upper surface of the chip capacitor 12 may be brought into contact with the projected portion 91 of the heat radiation plate 90 by applying the load to the heat radiation plate 90. The projected portion 91 may be formed on the heat radiation plate 90 so that the projected portion 91 of the heat radiation plate 90 is disposed between the terminal electrode 13 and the terminal electrode 14 of the chip capacitor 12 (in a position indicated by an arrowhead D in FIG. 42B).

As illustrated in FIG. 42B, the projected portion 91 is formed on the heat radiation plate 90 so as to surround the conductive material 20, thereby restraining the conductive material 20 from spreading and inhibiting the electrical connection between the terminal electrode 13 and the terminal electrode 14 of the chip capacitor 12. In the case of abutting the upper surface of the chip capacitor 12 on the projected portion 91 of the heat radiation plate 90, the thickness of the post-melting conductive material 20 is equalized to the height of the projected portion 91 of the heat radiation plate 90. Accordingly, the thickness of the post-melting conductive material 20 may be controlled by adjusting the height of the projected portion 91 of the heat radiation plate 90.

In the semiconductor device and the manufacturing method thereof according to the twelfth working example, in comparison with the heat radiation plate 21, the size and the weight of the heat radiation plate 90 are reduced, and it is therefore possible to attain the reductions in size and in weight of the semiconductor device. Further, in the semiconductor device and the manufacturing method thereof according to the twelfth working example, as compared the heat radiation plate 21, the heat radiation plate 90 is not provided with the bonding agent 24, and hence it is feasible to attain the reductions in size and in weight of the semiconductor device.

Thirteenth Working Example

The semiconductor device and the manufacturing method thereof according to a thirteenth working example will hereinafter be described. Note that the same components as those in the first through twelfth working examples are marked with the same reference numerals as those in the first through twelfth working examples, and their explanations are omitted. In the semiconductor device and the manufacturing method thereof according to the thirteenth working example, the decreases in size and in weight of the semiconductor device are attained by downsizing the heat radiation plate 21. In the semiconductor device and the manufacturing method thereof according to the thirteenth working example, an insulating portion 92 is provided along the outer peripheral portion of the heat radiation plate 90 into which the heat radiation plate 21 is downsized, thereby inhibiting the electrical connection between the terminal electrode 13 and the terminal electrode 14 of the chip capacitor 12.

Figure 43A:
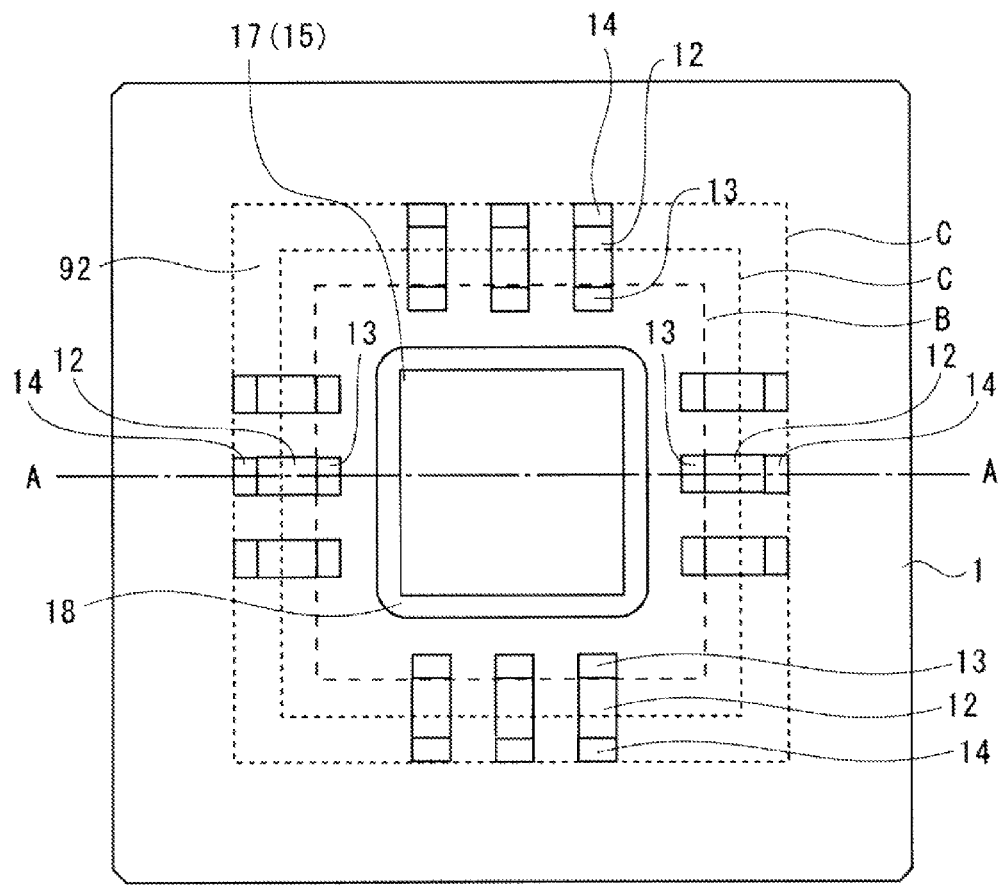
FIG. 43A is a top view of the semiconductor device in the case of disposing, upwardly of the wiring substrate 1, the heat radiation plate 90 provided with an insulating portion 92.
Figure 43B:
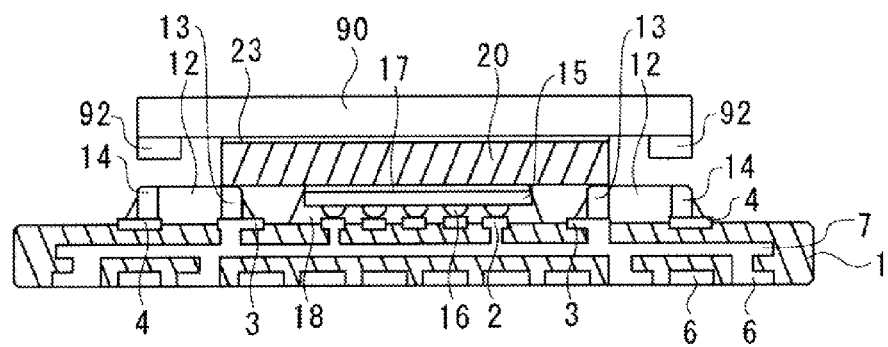
FIG. 43B is a sectional view of the semiconductor device, which is taken along the alternate long and short dash line A-A in FIG. 43A.

FIG. 43A is a top view of the semiconductor device in the case of disposing, upwardly of the wiring substrate 1, the heat radiation plate 90 provided with the insulating portion 92. FIG. 43B is a sectional view of the semiconductor device, which is taken along the alternate long and short dash line A-A in FIG. 43A. Note that in FIG. 43A, the shape of the conductive material 20 is depicted by the dotted lines B, and the shape of the heat radiation plate 90 is depicted by the dotted lines C, while the illustration of the metal film 23 is omitted. As depicted in FIGS. 43A and 43B, the insulating portion 92 is provided along the outer peripheral portion of the heat radiation plate 90, and the conductive material 20 is surrounded with the insulating portion 92 of the heat radiation plate 90. The insulating portion 92 may involve using, for instance, the polyimide adhesive tape (made by Nitto Denko Corporation). The insulating portion 92 is given by way of one example of the inhibiting portion.

Figure 44A:
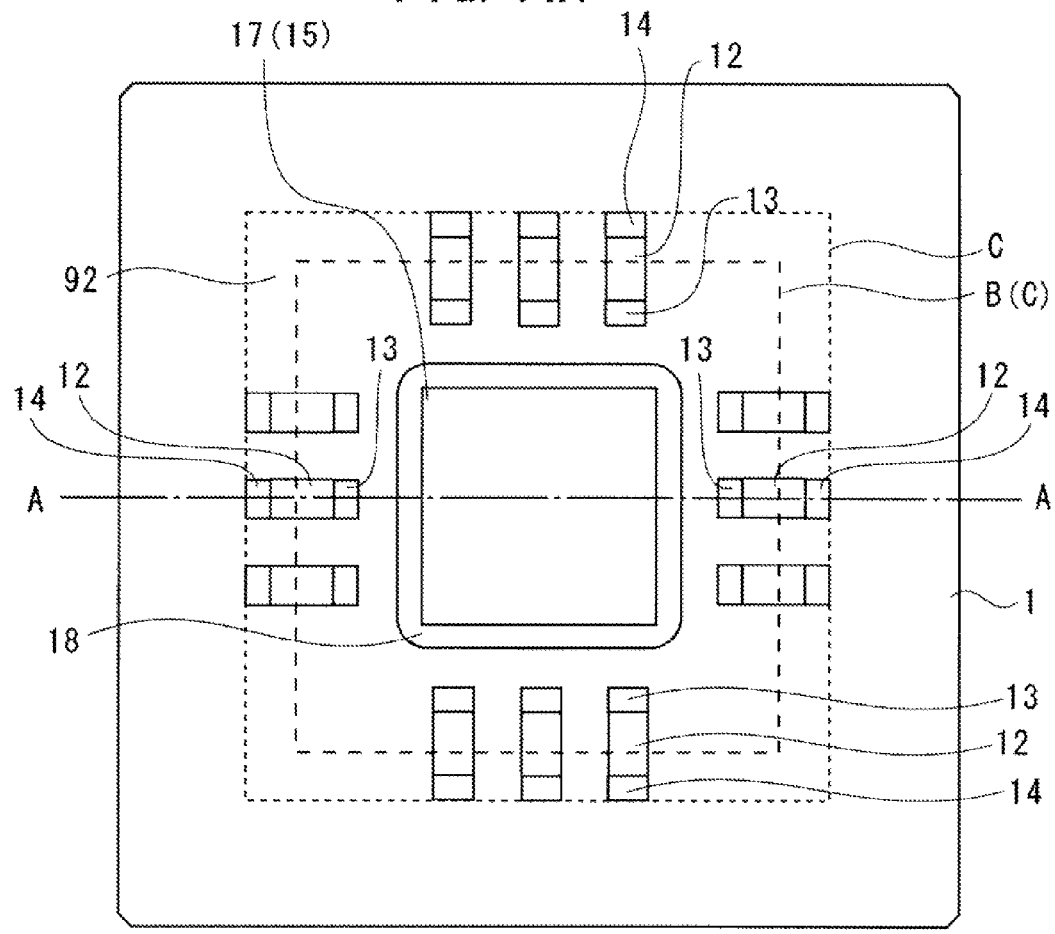
FIG. 44A is a top view of the semiconductor device in the case of bringing the upper surface of the chip capacitor 12 into contact with the insulating portion 92 of the heat radiation plate 90.
Figure 44B:
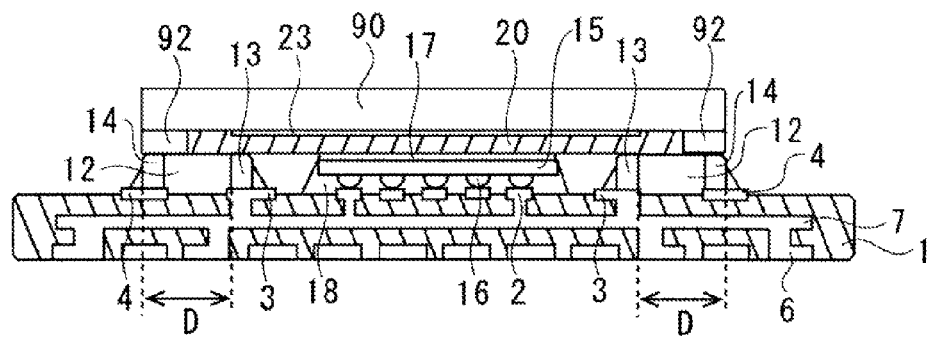
FIG. 44B is a sectional view of the semiconductor device, which is taken along the alternate long and short dash line A-A in FIG. 44A.

FIG. 44A is a top view of the semiconductor device in the case of bringing the upper surface of the chip capacitor 12 into contact with the insulating portion 92 of the heat radiation plate 90. FIG. 44B is a sectional view of the semiconductor device, which is taken along the alternate long and short dash line A-A in FIG. 44A. Note that in FIG. 44A, the shape of the conductive material 20 is depicted by the dotted lines B, and the shape of the heat radiation plate 90 is depicted by the dotted lines C, while the illustration of the metal film 23 is omitted. As the heating treatment is carried out, the conductive material 20 gets melted, then joined to the terminal electrode 13 of the chip capacitor 12, further to the rear surface of the semiconductor element 15 and yet further to the heat radiation plate 90. On the occasion of the heating treatment for melting the conductive material 20, the upper surface of the chip capacitor 12 may be brought into contact with the insulating portion 92 of the heat radiation plate 90 by applying the load to the heat radiation plate 90. The insulating portion 92 may be provided on the heat radiation plate 90 so that the insulating portion 92 of the heat radiation plate 90 is disposed between the terminal electrode 13 and the terminal electrode 14 of the chip capacitor 12 (in a position indicated by an arrowhead D in FIG. 44B).

As illustrated in FIG. 44B, the insulating portion 92 provided on the heat radiation plate 90 restrains the conductive material 20 from spreading. Further, as in FIG. 44B, the upper surface of the terminal electrode 14 of the chip capacitor 12 is covered with the insulating portion 92 provided on the heat radiation plate 90, thereby inhibiting the spread-out conductive material 20 from abutting on the terminal electrode 14 of the chip capacitor 12. Thus, the insulating portion 92 is provided on the heat radiation plate 90 so as to surround the conductive material 20, thereby inhibiting the electrical connection between the terminal electrode 13 and the terminal electrode 14 of the chip capacitor 12. In the case of abutting the upper surface of the chip capacitor 12 on the insulating portion 92 of the heat radiation plate 90, the thickness of the post-melting conductive material 20 is equalized to the height of the insulating portion 92 of the heat radiation plate 90. Accordingly, the thickness of the post-melting conductive material 20 may be controlled by adjusting the height of the insulating portion 92 of the heat radiation plate 90.

In the semiconductor device and the manufacturing method thereof according to the thirteenth working example, in comparison with the heat radiation plate 21, the size and the weight of the heat radiation plate 90 are reduced, and it is therefore possible to attain the reductions in size and in weight of the semiconductor device. Further, in the semiconductor device and the manufacturing method thereof according to the thirteenth working example, as compared the heat radiation plate 21, the heat radiation plate 90 is not provided with the bonding agent 24, and hence it is feasible to attain the reductions in size and in weight of the semiconductor device.

Fourteenth Working Example

The semiconductor device and the manufacturing method thereof according to a fourteenth working example will hereinafter be described. Note that the same components as those in the first through thirteenth working examples are marked with the same reference numerals as those in the first through thirteenth working examples, and their explanations are omitted. The fourteenth working example will discuss the semiconductor device and the method of manufacturing the semiconductor device taking a structure (multi-chip package type) in which a plurality of semiconductor elements 15 is disposed on the wiring substrate 1.

Figure 45A:
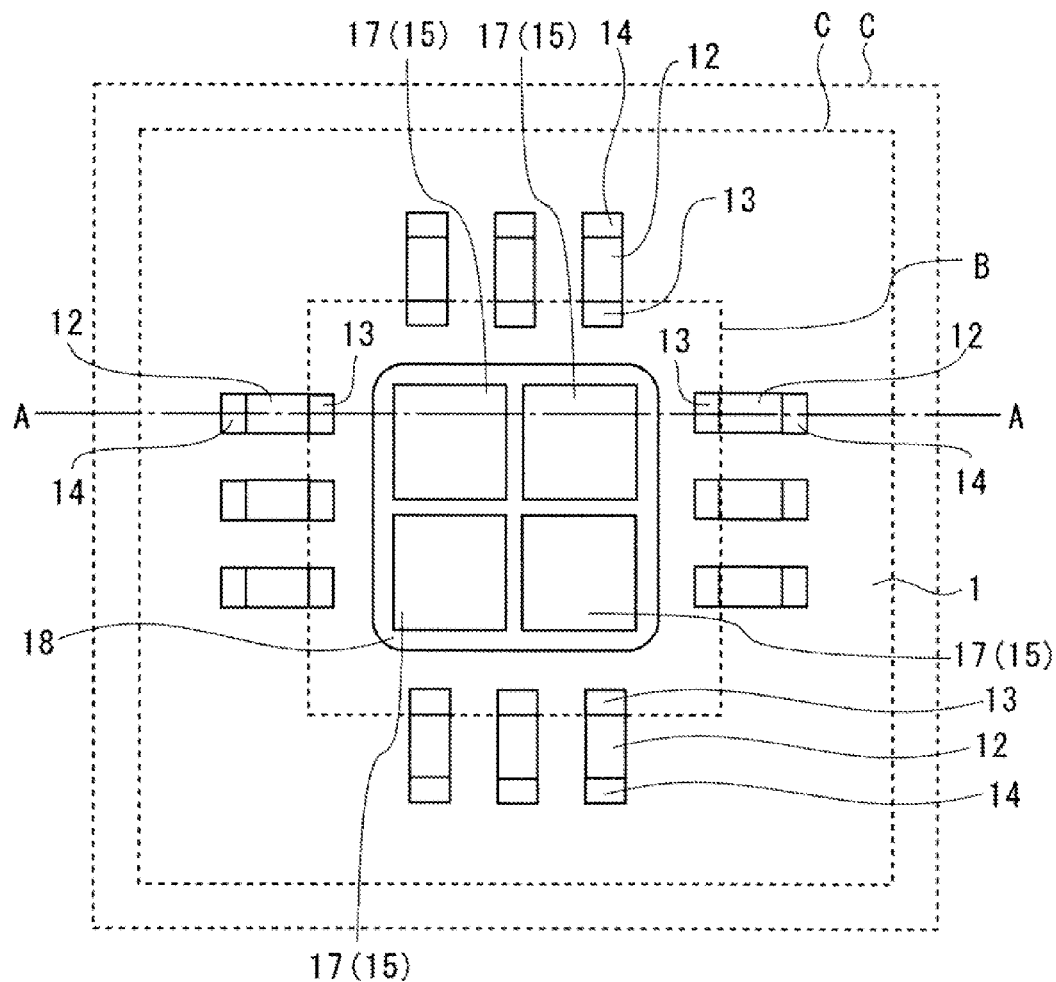
FIG. 45A is a top view of the semiconductor device in the case of disposing the plurality of semiconductor elements 15 on the wiring substrate 1.
Figure 45B:
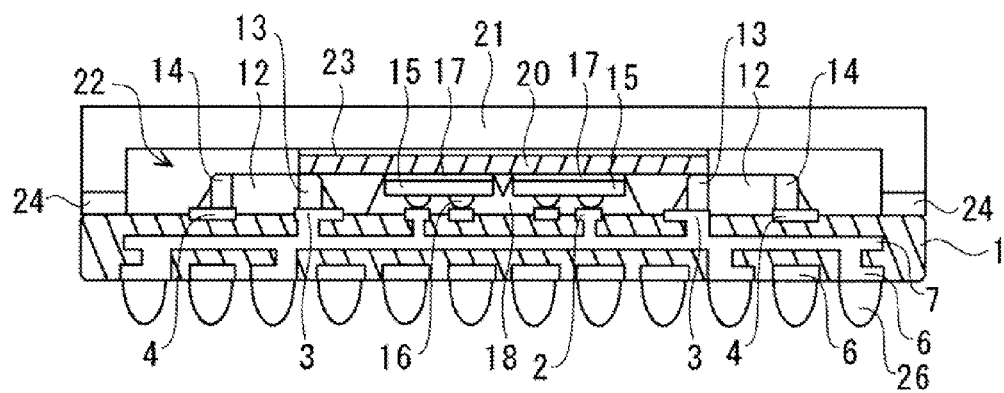
FIG. 45B is a sectional view of the semiconductor device, which is taken along the alternate long and short dash line A-A in FIG. 45A.

FIG. 45A is a top view of the semiconductor device in the case of disposing the plurality of semiconductor elements 15 on the wiring substrate 1. FIG. 45B is a sectional view of the semiconductor device, which is taken along the alternate long and short dash line A-A in FIG. 45A. Note that in FIG. 45A, the shape of the conductive material 20 is depicted by the dotted lines B, and the shape of the heat radiation plate 21 is depicted by the dotted lines C, while the illustration of the metal film 23 is omitted.

As illustrated in FIGS. 45A and 45B, the rear surfaces of the plurality of semiconductor elements 15 are covered by the conductive material 20, and the conductive material 20 is brought into contact with the terminal electrode 13 of the chip capacitor 12. The terminal electrode 13 of the chip capacitor 12 is electrically connected to the electrode pad 3 connecting with the ground wire 7, and the ground voltage is supplied to the terminal electrode 13 of the chip capacitor 12 via the ground wire 7. The terminal electrode 13 of the chip capacitor 12 is electrically connected to the conductive material 20, and therefore the terminal electrode 13 of the chip capacitor 12 and the conductive material 20 come to ground potential, and the peripheries of the plurality of semiconductor elements 15 are electromagnetically shielded.

Fifteenth Working Example

The semiconductor device and the manufacturing method thereof according to a fifteenth working example will hereinafter be described. Note that the same components as those in the first through fourteenth working examples are marked with the same reference numerals as those in the first through fourteenth working examples, and their explanations are omitted. The fifteenth working example will discuss the semiconductor device and the method of manufacturing the semiconductor device taking a structure (System in Package type) in which the electronic components such as the chip capacitors 12, the semiconductor elements 15, the memory components and passive components are disposed on the wiring substrate 1.

Figure 46A:
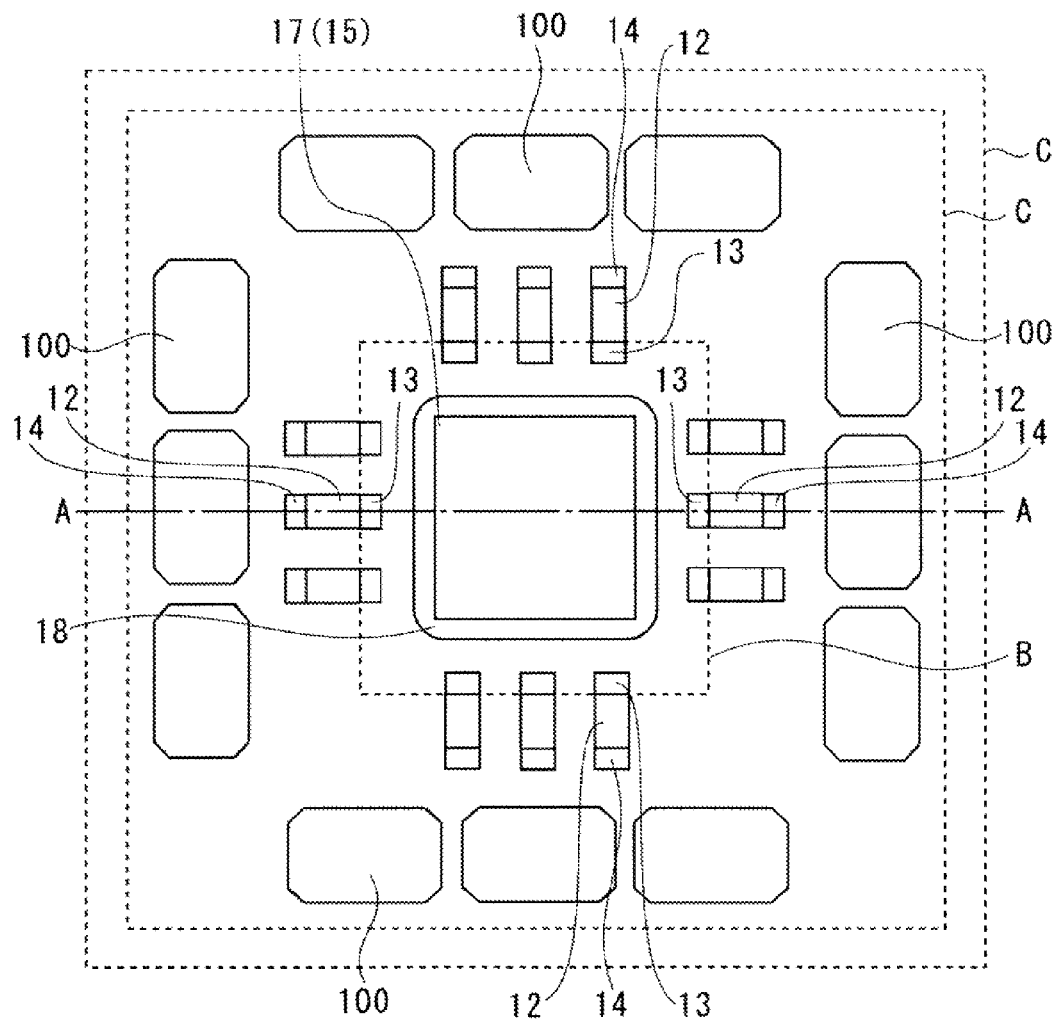
FIG. 46A is a top view of the semiconductor device in the case of disposing the chip capacitors 12, the semiconductor elements 15 and electronic components 100 on the wiring substrate 1.
Figure 46B:
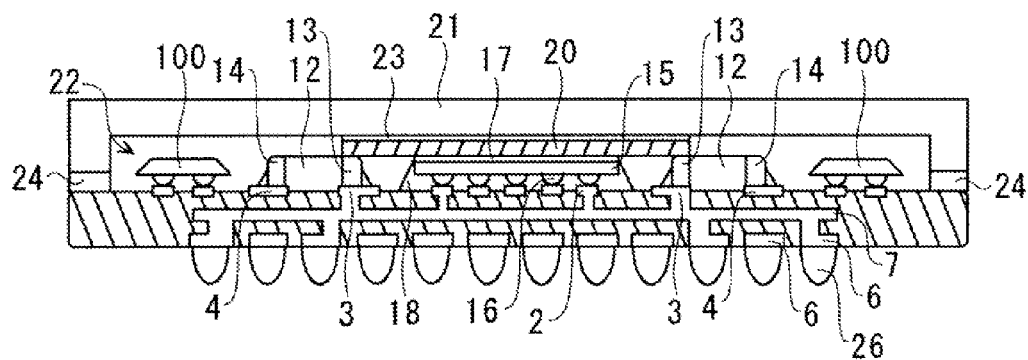
FIG. 46B is a sectional view of the semiconductor device, which is taken along the alternate long and short dash line A-A in FIG. 46A.

FIG. 46A is a top view of the semiconductor device in the case of disposing the chip capacitors 12, the semiconductor elements 15 and electronic components 100 on the wiring substrate 1. FIG. 46B is a sectional view of the semiconductor device, which is taken along the alternate long and short dash line A-A in FIG. 46A. Note that in FIG. 46A, the shape of the conductive material 20 is depicted by the dotted lines B, and the shape of the heat radiation plate 21 is depicted by the dotted lines C, while the illustration of the metal film 23 is omitted. The electronic components 100 are exemplified by passive components such as memory components, resistances and capacitors. The terminal electrode 13 of the chip capacitor 12 functions as a shield member which electromagnetically shields the portion along the side surface of the semiconductor element 15 and functions also as a connecting member which connects the wiring substrate 1 to the conductive material 20.

Sixteenth Working Example

The semiconductor device and the manufacturing method thereof according to a sixteenth working example will hereinafter be described. Note that the same components as those in the first through fifteenth working examples are marked with the same reference numerals as those in the first through fifteenth working examples, and their explanations are omitted.

Figure 47A:
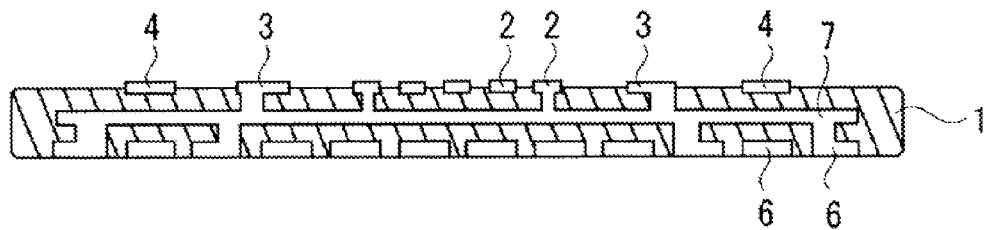
FIG. 47A is a sectional view of the wiring substrate 1.

As illustrated in FIG. 47A, the wiring substrate 1 is prepared. FIG. 47A is a sectional view of the wiring substrate 1.

Figure 47B:
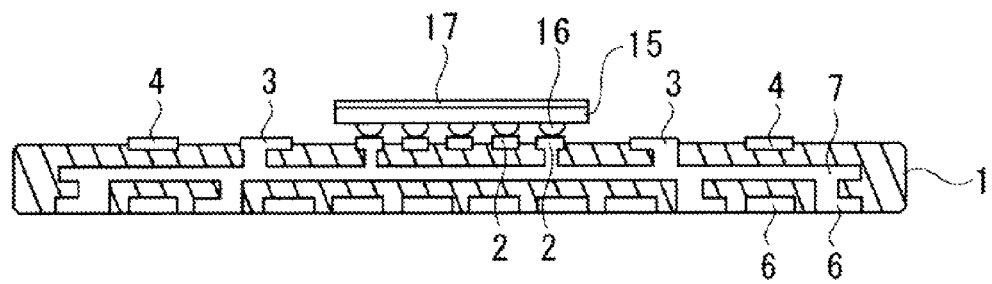
FIG. 47B is a sectional view of the semiconductor device in the case of installing the semiconductor element 15 on the wiring substrate 1.

Next, as illustrated in FIG. 47B, the semiconductor element 15 is installed on the wiring substrate 1. Namely, the semiconductor element 15 is packaged on the packaging surface of the wiring substrate 1. For instance, the semiconductor element 15 is disposed on the wiring substrate 1 in such a way that the surface of the semiconductor element 15 is directed to the wiring substrate 1. Then, the electrode pads 2 of the wiring substrate 1 are joined to the bumps 16 of the semiconductor element 15 by performing the heating treatment, thus installing the semiconductor element 15 on the wiring substrate 1. Subsequently, the metal film 17 is formed on the rear surface of the semiconductor element 15 by sputtering, which involves using, e.g., titanium (Ti) and gold (Au). FIG. 47B is a sectional view of the semiconductor device in the case of installing the semiconductor element 15 on the wiring substrate 1. As depicted in FIG. 47B, the semiconductor element 15 is installed on the wiring substrate 1 so that the packaging surface of the wiring substrate 1 faces the bumps 16 of the semiconductor element 15.

Figure 47C:
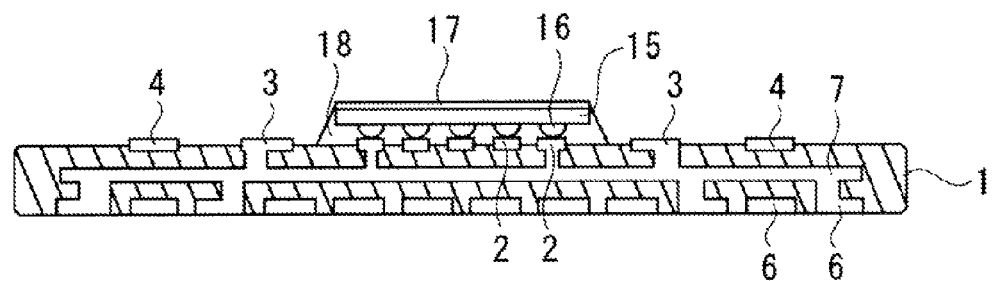
FIG. 47C is a sectional view of the semiconductor device in the case where the underfill resin 18 is filled in between the wiring substrate 1 and the semiconductor element 15.

Subsequently, as illustrated in FIG. 47C, the underfill resin 18 is filled in between the wiring substrate 1 and the semiconductor element 15. FIG. 47C is a sectional view of the semiconductor device in the case where the underfill resin 18 is filled in between the wiring substrate 1 and the semiconductor element 15. Next, the wiring substrate 1 is conveyed to the heating furnace, in which the heating treatment is executed. The execution of the heating treatment hardens the underfill resin 18 existing between the wiring substrate 1 and the semiconductor element 15.

Figure 47D:
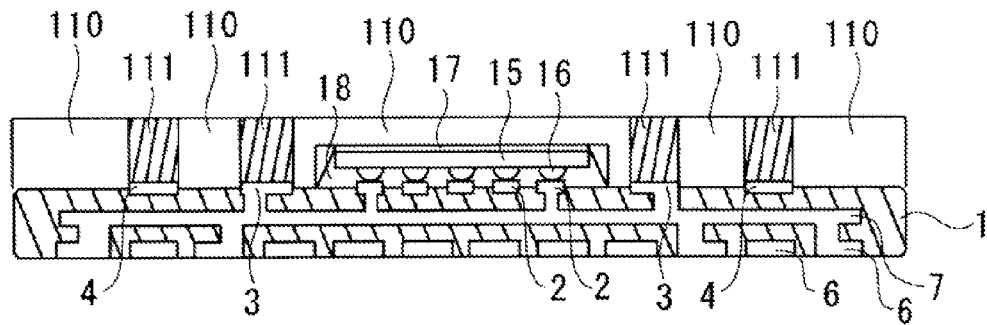
FIG. 47D is a sectional view of the semiconductor device in the case of printing a solder paste 111 on the wiring substrate 1 by employing a printing mask 110.

Then, as illustrated in FIG. 47D, a solder paste 111 is printed on the wiring substrate 1 by using a printing mask 110. FIG. 47D is a sectional view of the semiconductor device in the case of printing the solder paste 111 on the wiring substrate 1 by employing the printing mask 110.

Figure 48A:
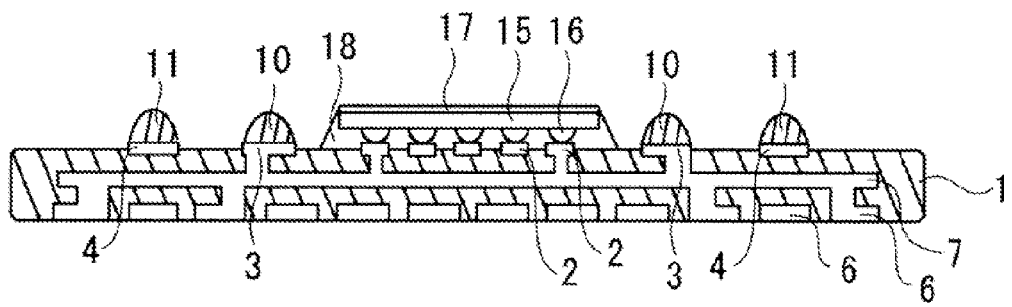
FIG. 48A is a sectional view of the semiconductor device in the case of forming the solder 10 on the electrode pad 3 and the solder 11 on the electrode pad 4.

Subsequently, the printing mask 110 is removed, then, as illustrated in FIG. 48A, the solder 10 is formed on the electrode pad 3, and the solder 11 is formed on the electrode pad 4. FIG. 48A is a sectional view of the semiconductor device in the case of forming the solder 10 on the electrode pad 3 and the solder 11 on the electrode pad 4.

Figure 48B:
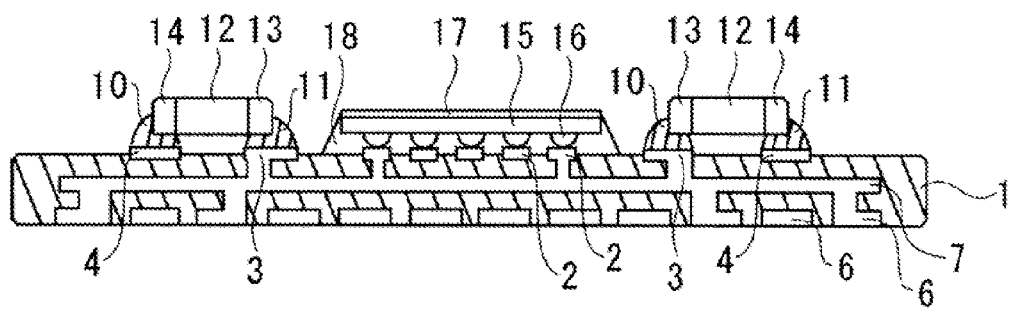
FIG. 48B is a sectional view of the wiring substrate 1 in the case of disposing the chip capacitors 12 on the wiring substrate 1.

Next, as depicted in FIG. 48B, the plurality of chip capacitors 12 is disposed on the wiring substrate 1. The plurality of chip capacitors 12 is so disposed as to be spaced away from each other at the predetermined intervals on the wiring substrate 1. FIG. 48B is a sectional view of the wiring substrate 1 in the case of disposing the chip capacitors 12 on the wiring substrate 1. As illustrated in FIG. 48B, the chip capacitors 12 are disposed laterally on the wiring substrate 1 so that the terminal electrode 13 of the chip capacitor 12 is electrically connected to the electrode pad 3, while the terminal electrode 14 of the chip capacitor 12 is electrically connected to the electrode pad 4.

Figure 48C:
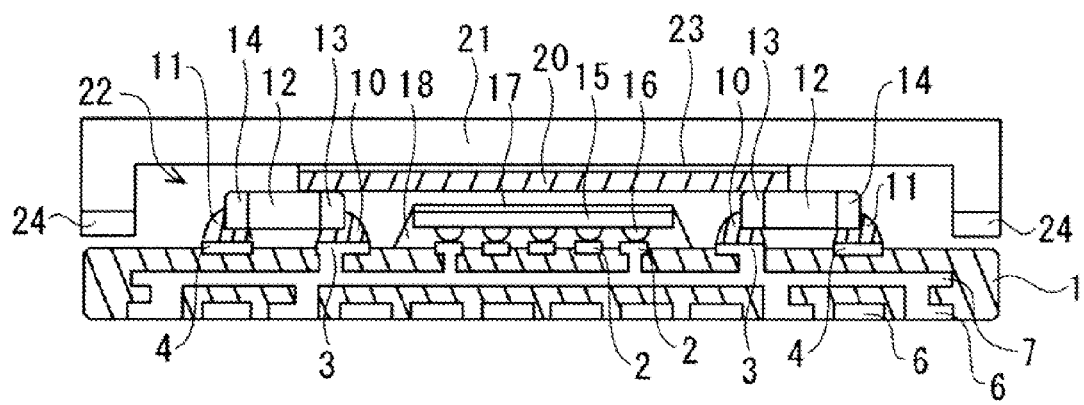
FIG. 48C is a sectional view of the wiring substrate 1 in the case of installing the heat radiation plate 21 upwardly of the wiring substrate 1.

Then, the conductive material 20 is disposed upwardly of the wiring substrate 1. Subsequently, the wiring substrate 1 and the heat radiation plate 21 are aligned with each other, and, as illustrated in FIG. 48C, the heat radiation plate 21 is disposed upwardly of the wiring substrate 1. FIG. 48C is a sectional view of the wiring substrate 1 in the case of installing the heat radiation plate 21 upwardly of the wiring substrate 1. The heat radiation plate 21 is processed into the recessed shape, and the metal film 23 is formed in the central region of the recessed portion 22 of the heat radiation plate 21. The bonding agent 24 is provided on the projected portion of the recessed portion 22 of the heat radiation plate 21. The conductive material 20 may also be a conductive bonding agent 25, and the conductive bonding agent 25 may be used by the same method as in the first working example.

Figure 48D:
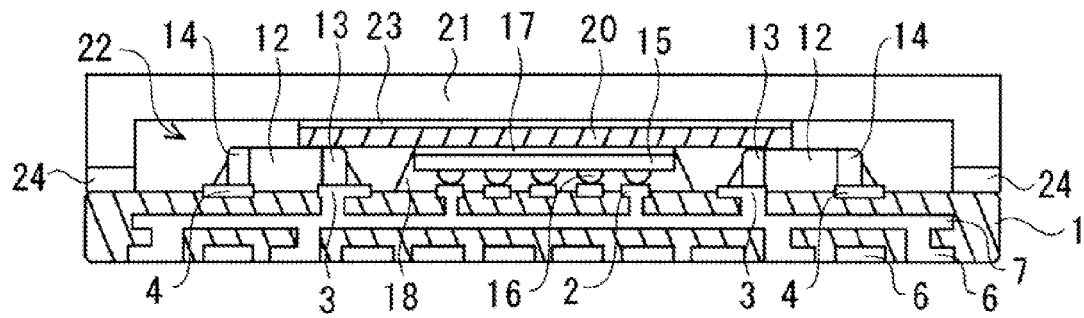
FIG. 48D is a sectional view of the semiconductor device in the case of bonding the wiring substrate 1 and the heat radiation plate 21 together.

Next, as illustrated in FIG. 48D, the wiring substrate 1 and the heat radiation plate 21 are bonded together via the bonding agent 24, and, after bringing the conductive material 20 into contact with the central region of the recessed portion 22 of the heat radiation plate 21, the semiconductor device is conveyed to the heating furnace, in which the heating treatment (reflow treatment) is conducted. FIG. 48D is a sectional view of the semiconductor device in the case of bonding the wiring substrate 1 and the heat radiation plate 21 together.

The heating treatment is carried out, whereby the solder 10 and the solder 11 get melted, the solder 10 is joined to the electrode pad 3 and the terminal electrode 13 of the chip capacitor 12, while the solder 11 is joined to the electrode pad 4 and the terminal electrode 14 of the chip capacitor 12. Through this operation, the terminal electrode 13 of the chip capacitor 12 is joined to the electrode pad 3 via the solder 10, and the terminal electrode 14 of the chip capacitor 12 is joined to the electrode pad 4 via the solder 11. The terminal electrode 13 of the chip capacitor 12 is joined to the electrode pad 3, and the terminal electrode 14 of the chip capacitor 12 is joined to the electrode pad 4, thereby installing (packaging) the chip capacitors 12 on the wiring substrate 1.

The heating treatment is executed, with the result that the conductive material 20 gets melted, the terminal electrode 13 of the chip capacitor 12 is joined to the conductive material 20, the rear surface of the semiconductor element 15 is joined to the conductive material 20, and the conductive material 20 is joined to the heat radiation plate 21. The rear surface of the semiconductor element 15 is joined to the conductive material 20, thereby installing the conductive material 20 on the semiconductor element 15. The conductive material 20 and the heat radiation plate 21 are joined together, thereby installing the heat radiation plate 21 on the conductive material 20.

After installing the heat radiation plate 21 on the conductive material 20, the flux is applied onto the electrode pad 6 of the wiring substrate 1 by use of the mask. Subsequently, the soldering balls 26 are disposed on the electrode pads 6 of the wiring substrate 1, and the semiconductor device is conveyed to the heating furnace, in which the heating treatment (reflow treatment) is conducted. The heating treatment is carried out, whereby the soldering balls 26 are joined onto the electrode pads 6 of the wiring substrate 1. In the sixteenth working example, the sectional view of the semiconductor device after joining the soldering balls 26 onto the electrode pads 6 of the wiring substrate 1, is the same as the sectional view of the semiconductor device illustrated in FIG. 10 in the first working example.

In the sixteenth working example, during one-time heating treatment, it is feasible to install the chip capacitor 12 on the wiring substrate 1, join the terminal electrode 13 and the conductive material 20 together, join the rear surface of the semiconductor element 15 to the conductive material 20 and join the conductive material 20 and the heat radiation plate 21 together. In the sixteenth working example, the chip capacitor 12 is installed on the wiring substrate 1 in a state where the conductive material 20 and the heat radiation plate 21 are disposed in stack on the chip capacitor 12, thereby inhibiting a rising phenomenon of the chip capacitor 12.

Each of the first through sixteenth working examples has demonstrated the example in which the chip capacitors 12 adjacent to each other are linearly arranged and thus disposed on the wiring substrate 1, however, the layout of the chip capacitors 12 may be varied as the necessity arises. Further, the number of the chip capacitors 12 disposed on the wiring substrate 1 may be varied corresponding to the necessity. FIG. 49A is a top view of the semiconductor device in the case of varying the layout of the chip capacitors 12. FIG. 49B is a top view of the semiconductor device in such a case that the single chip capacitor 12 is disposed for each side of the outer peripheral portion of the conductive material 20 taking the quadrangle shape, and the terminal electrode 13 of the chip capacitor 12 abuts on the conductive material 20. Note that in FIGS. 49A and 49B, the shape of the conductive material 20 is depicted by a dotted line A.

Furthermore, another available arrangement is that the single chip capacitor 12 is disposed for any one of the sides of the outer peripheral portion of the conductive material 20 taking the quadrangle shape, and the terminal electrode 13 of the chip capacitor 12 abuts on the conductive material 20. Still another available arrangement is that the single chip capacitor 12 is disposed for any two or three sides of the outer peripheral portion of the conductive material 20 taking the quadrangle shape, and the terminal electrode 13 of the chip capacitor 12 abuts on the conductive material 20.

In the second through sixteenth working examples, similarly to the first working example, the packaging height of the chip capacitor 12 may be made coincident with the packaging height of the semiconductor element 15, and the packaging height of the chip capacitor 12 may be differentiated from the packaging height of the semiconductor element 15. In the second through sixteenth working examples, similarly to the first working example, the conductive material 20 may be the conductive bonding agent 25. In the second through sixteenth working examples, similarly to the first working example, the thickness of the conductive material 20 existing between the semiconductor element 15 and the heat radiation plate 21 and the thickness of the conductive material 20 existing between the terminal electrode 13 of the chip capacitor 12 and the heat radiation plate 21, may be controlled by changing the thickness of the heat radiation plate 21 and the thickness of the bonding agent 24. In the second through sixteenth working examples, similarly to the first working example, the bonding agent 24 involves using the material having the ductility, and the thickness of the conductive material 20 may also be controlled by adjusting the thickness of the bonding agent 24 in a manner that applies the load to the heat radiation plate 21. The first through sixteenth working examples may be combined with each other, and a plurality of working examples in the first through sixteenth working examples may also be combined.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a substrate;
   a semiconductor element arranged on the substrate and including a first surface which faces the substrate;
   a chip capacitor arranged on the substrate and including a first terminal electrode; and
   a conductive material covering a second surface of the semiconductor element opposite to the first surface of the semiconductor element and connecting to the first terminal electrode.

2. The semiconductor device according to claim 1, further comprising a conductive layer formed in the periphery of the semiconductor element,
   wherein the first terminal electrode is connected to the conductive layer, and the conductive material is connected to the conductive layer.

3. The semiconductor device according to claim 1, wherein the conductive material covers a side surface of the semiconductor element.

4. The semiconductor device according to claim 1, further comprising a heat radiation plate connected to the conductive material.

5. The semiconductor device according to claim 4, wherein the chip capacitor includes a second terminal electrode; and
   the heat radiation plate includes an inhibiting portion inhibiting the conductive material from being brought into contact with the second terminal electrode.

6. The semiconductor device according to claim 4, wherein the heat radiation plate includes a protruded surface.

7. The semiconductor device according to claim 6, wherein a part of the protruded surface is overlapped with the semiconductor element in a plan view.

8. The semiconductor device according to claim 1, wherein the chip capacitor includes a second terminal electrode which is separated from the first terminal electrode.

9. The semiconductor device according to claim 8, wherein the second terminal electrode is formed on a surface of the chip capacitor which faces the substrate.

10. The semiconductor device according to claim 8, wherein the second terminal electrode is separated from the conductive material.

11. The semiconductor device according to claim 8, wherein the first terminal electrode is nearer from the semiconductor element than the second terminal electrode.

12. The semiconductor device according to claim 8, wherein the first terminal electrode is supplied with a ground voltage, and the second terminal electrode is supplied with a power voltage.

13. The semiconductor device according to claim 1, wherein the semiconductor element includes an electrode formed on the first surface.

14. The semiconductor device according to claim 1, wherein a part of the conductive material is protruded in a plan view.

15. The semiconductor device according to claim 14, wherein the part of the conductive material is connected to the first terminal electrode.

16. The semiconductor device according to claim 1, wherein a plurality of the semiconductor elements are arranged on the substrate.

* * * * *